(12) United States Patent
Verhaverbeke et al.

(10) Patent No.: US 11,521,937 B2
(45) Date of Patent: Dec. 6, 2022

(54) PACKAGE STRUCTURES WITH BUILT-IN EMI SHIELDING

(71) Applicant: Applied Materials, Inc., Santa Clara, CA (US)

(72) Inventors: Steven Verhaverbeke, San Francisco, CA (US); Han-Wen Chen, Cupertino, CA (US); Giback Park, San Jose, CA (US); Chintan Buch, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 17/098,597

(22) Filed: Nov. 16, 2020

(65) Prior Publication Data
US 2022/0157740 A1 May 19, 2022

(51) Int. Cl.
*H01L 23/552* (2006.01)
*H01L 23/538* (2006.01)
(Continued)

(52) U.S. Cl.
CPC ........ *H01L 23/552* (2013.01); *H01L 23/5384* (2013.01); *H01L 23/5386* (2013.01); *H01L 23/53228* (2013.01); *H01L 25/0657* (2013.01)

(58) Field of Classification Search
CPC ............. H01L 23/552; H01L 23/53228; H01L 23/5384
See application file for complete search history.

(56) References Cited

U.S. PATENT DOCUMENTS

| 4,073,610 A | 2/1978 | Cox |
| 5,126,016 A | 6/1992 | Glenning et al. |

(Continued)

FOREIGN PATENT DOCUMENTS

| CA | 2481616 C | 1/2013 |
| CN | 1971894 A | 5/2007 |

(Continued)

OTHER PUBLICATIONS

Tecnisco, Ltd.—"Company Profile" presentation with product introduction, date unknown, 26 pages.

(Continued)

*Primary Examiner* — Errol V Fernandes
(74) *Attorney, Agent, or Firm* — Patterson + Sheridan, LLP

(57) ABSTRACT

The present disclosure relates to thin-form-factor semiconductor packages with integrated electromagnetic interference ("EMI") shields and methods for forming the same. The packages described herein may be utilized to form high-density semiconductor devices. In certain embodiments, a silicon substrate is laser ablated to include one or more cavities and a plurality of vias surrounding the cavities. One or more semiconductor dies may be placed within the cavities and thereafter embedded in the substrate upon formation of an insulating layer thereon. A plurality of conductive interconnections are formed within the vias and may have contact points redistributed to desired surfaces of the die-embedded substrate assembly. Thereafter, an EMI shield is plated onto a surface of the die-embedded substrate assembly and connected to ground by at least one of the one or more conductive interconnections. The die-embedded substrate assembly may then be singulated and/or integrated with another semiconductor device.

20 Claims, 31 Drawing Sheets

(51) Int. Cl.
*H01L 23/532* (2006.01)
*H01L 25/065* (2006.01)

(56) References Cited

U.S. PATENT DOCUMENTS

| | | | |
|---|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,134,687 B1 * | 11/2018 | Kim ............... H01L 21/6836 |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |

(56) References Cited

U.S. PATENT DOCUMENTS

| | | |
|---|---|---|
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |

(56) References Cited

FOREIGN PATENT DOCUMENTS

| | | |
|---|---|---|
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
Allresist Gmbh—Strausberg et al: "Resist-Wiki: Adhesion promoter HMDS and diphenylsilanedio (AR 300-80)— . . . —Allresist GmbH—Strausberg, Germany", Apr. 12, 2019 (Apr. 12, 2019), XP055663206, Retrieved from the Internet: URL:https://web.archive.org/web/20190412220micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chien-Wei Chien et al "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 dated Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom, et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

(56) References Cited

OTHER PUBLICATIONS

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

L. Wang, et al. "High aspect ratio through-wafer interconnections for 3Dmicrosystems", 2003 IEEE. pp. 634-637.

Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

Liu, C.Y. et al., Time Resolved Shadowgraph Images of Silicon during Laser Ablation: Shockwaves and Particle Generation, Journal of Physics: Conference Series 59 (2007) 338-342, 6 pages.

Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.

NT Nguyen et al. "Through-Wafer Copper Electroplating for Three-Dimensional Interconnects", Journal of Micromechanics and Microengineering. 12 (2002) 395-399. 2002 IOP.

PCT International Search Report and Written Opinion dated Aug. 28, 2020, for International Application No. PCT/US2020/032245.

PCT International Search Report and Written Opinion dated Sep. 15, 2020, for International Application No. PCT/US2020/035778.

Ronald Hon et al. "Multi-Stack Flip Chip 3D Packaging with Copper Plated Through-Silicon Vertical Interconnection", 2005 IEEE. pp. 384-389.

S. W. Ricky Lee et al. "3D Stacked Flip Chip Packaging with Through Silicon Vias and Copper Plating or Conductive Adhesive Filling", 2005 IEEE, pp. 798-801.

Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.

Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.

Srinivasan, R., et al.—"Ultraviolet Laser Ablation of Organic Polymers," Chemical Reviews, 1989, vol. 89, No. 6, pp. 1303-1316.

Taiwan Office Action dated Oct. 27, 2020 for Application No. 108148588.

Trusheim, D. et al., Investigation of the Influence of Pulse Duration in Laser Processes for Solar Cells, Physics Procedia Dec. 2011, 278-285, 9 pages.

Wu et al., Microelect. Eng., vol. 87 2010, pp. 505-509.

Yu et al. "High Performance, High Density RDL for Advanced Packaging," 2018 IEEE 68th Electronic Components and Technology Conference, pp. 587-593, DOI 10.1109/ETCC.2018.0009.

Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.

\* cited by examiner

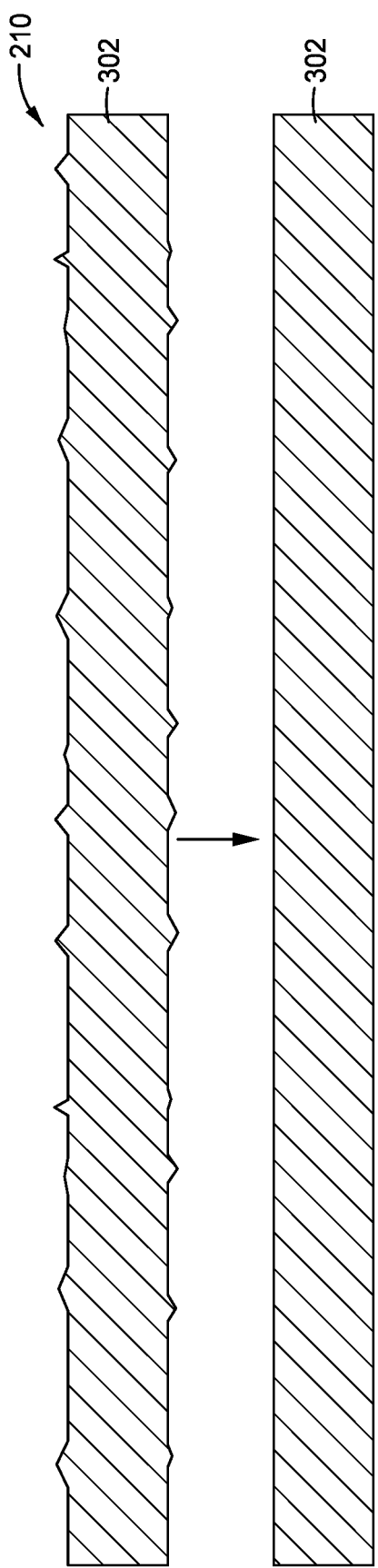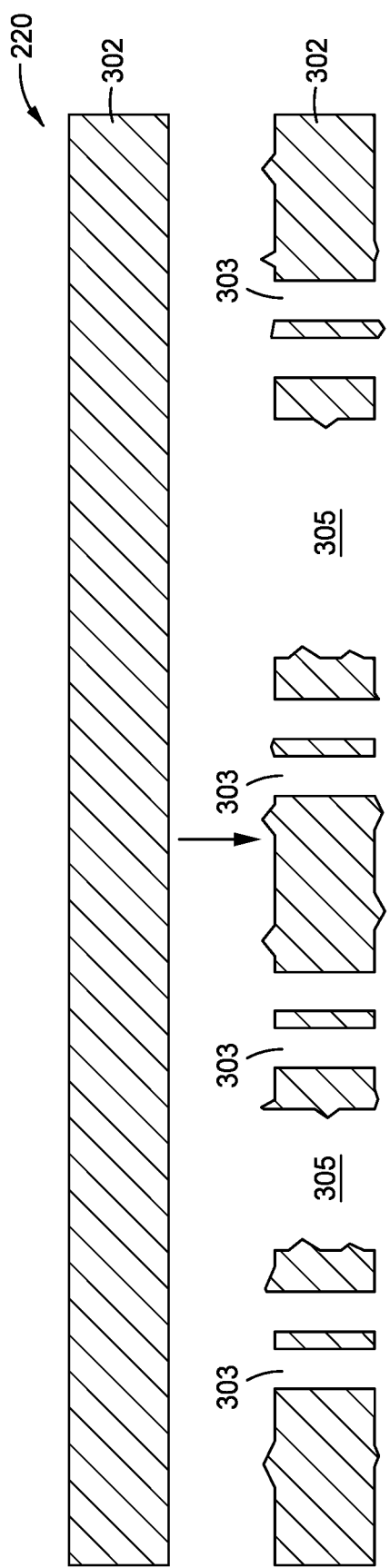

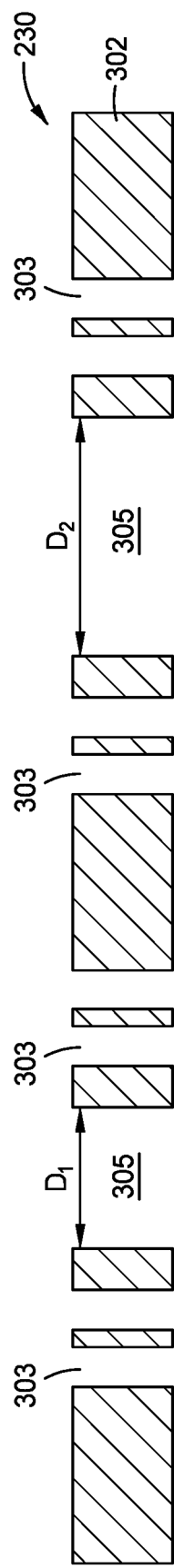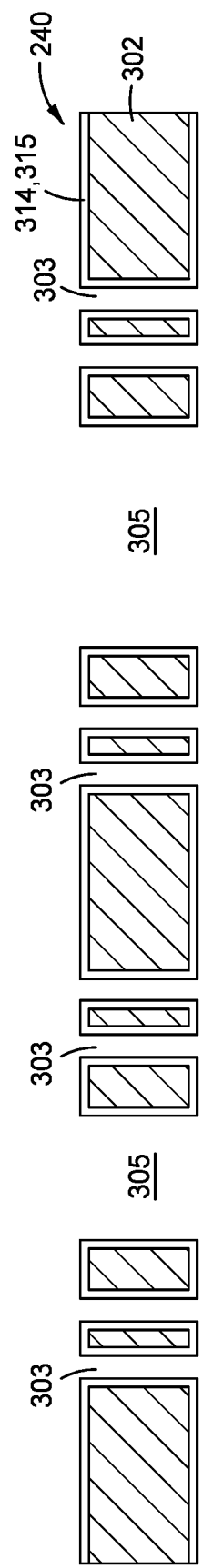

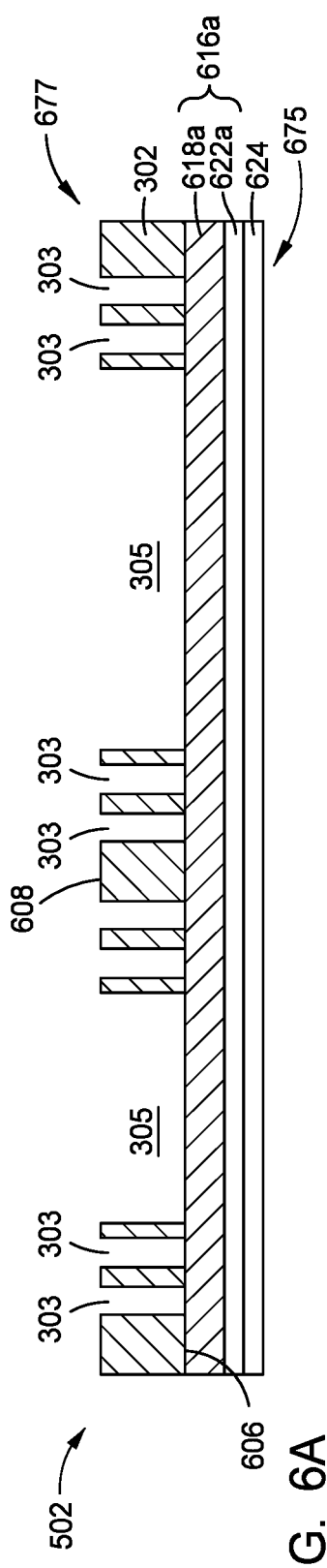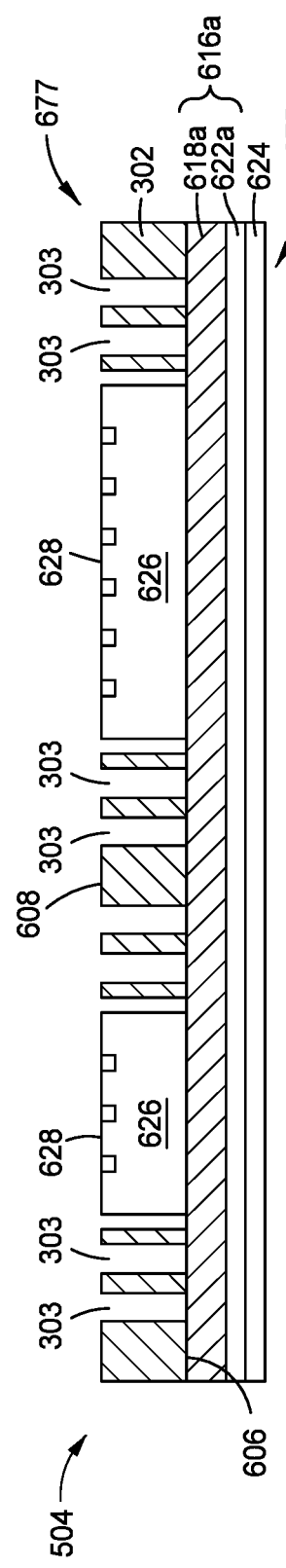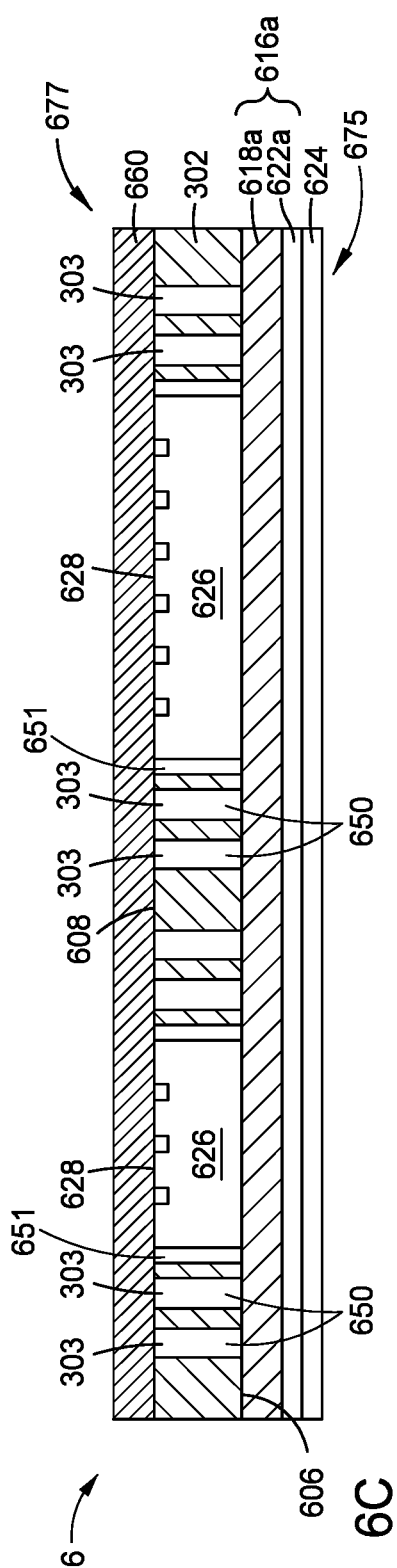

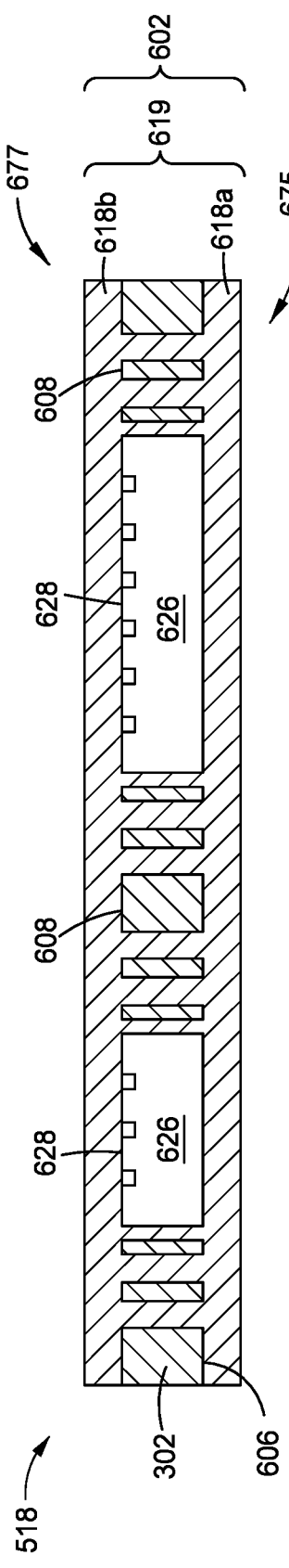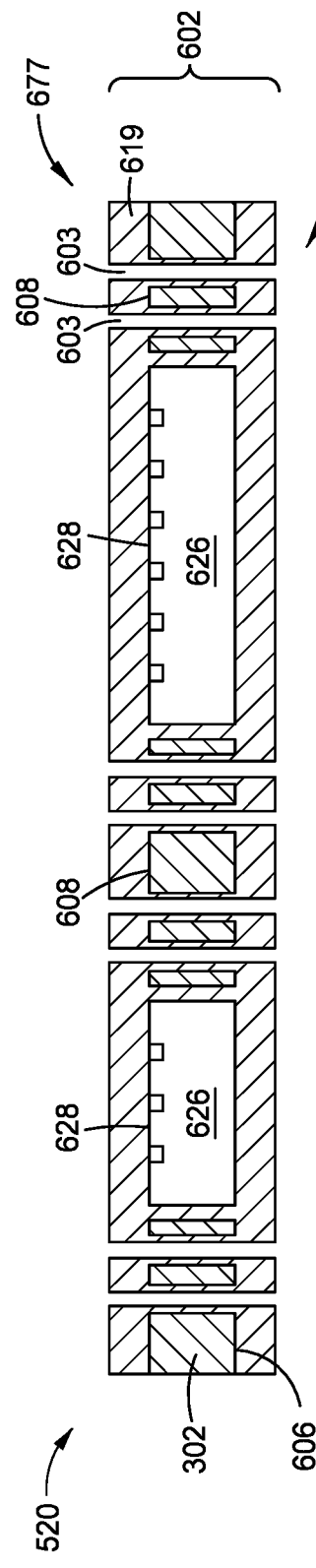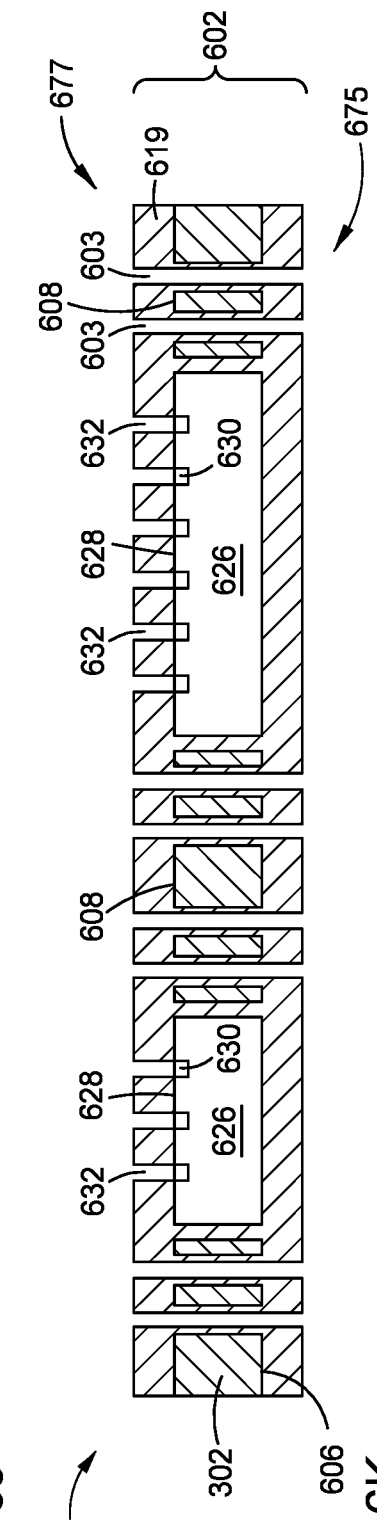

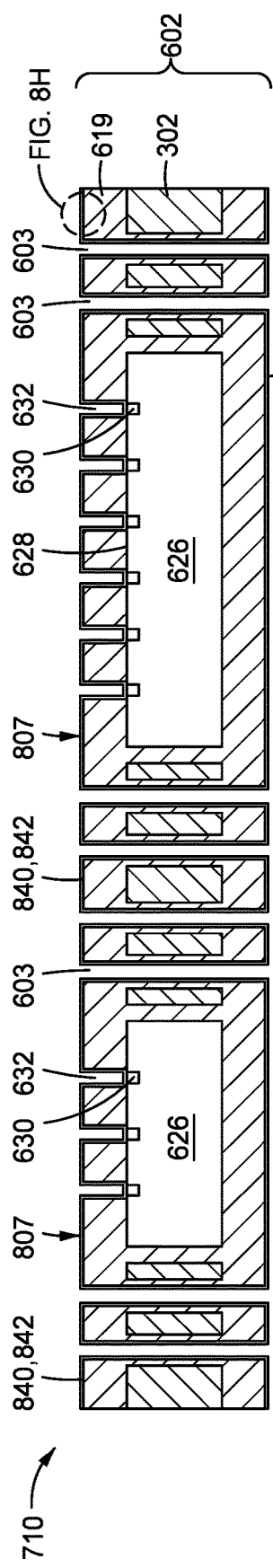
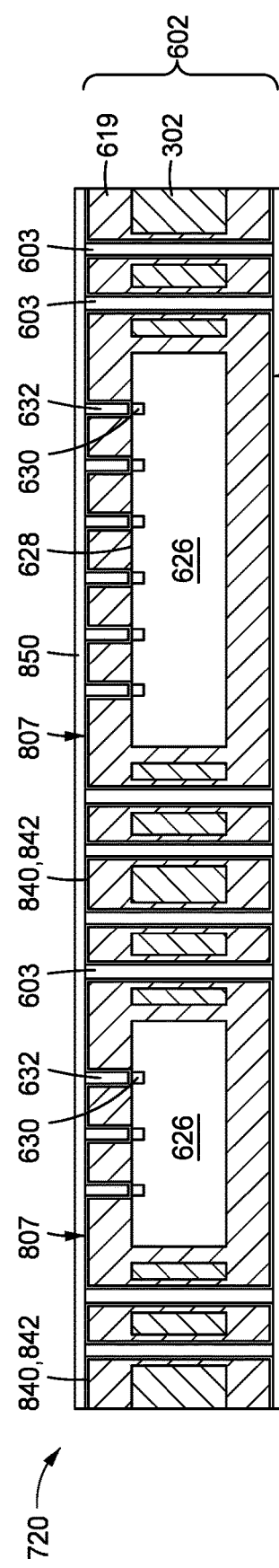
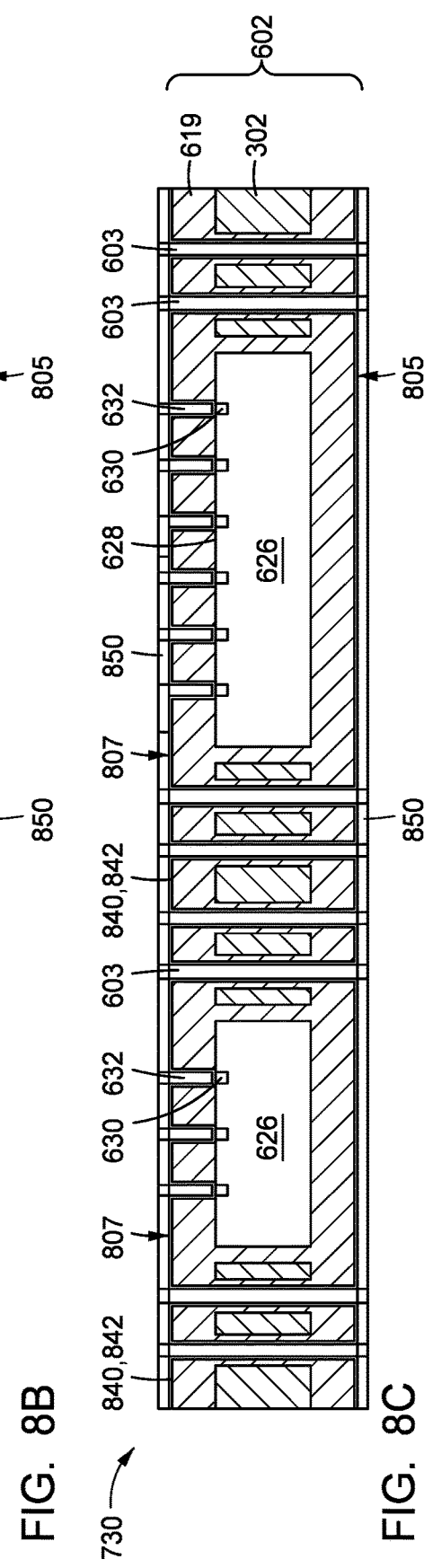
FIG. 8A
FIG. 8B
FIG. 8C

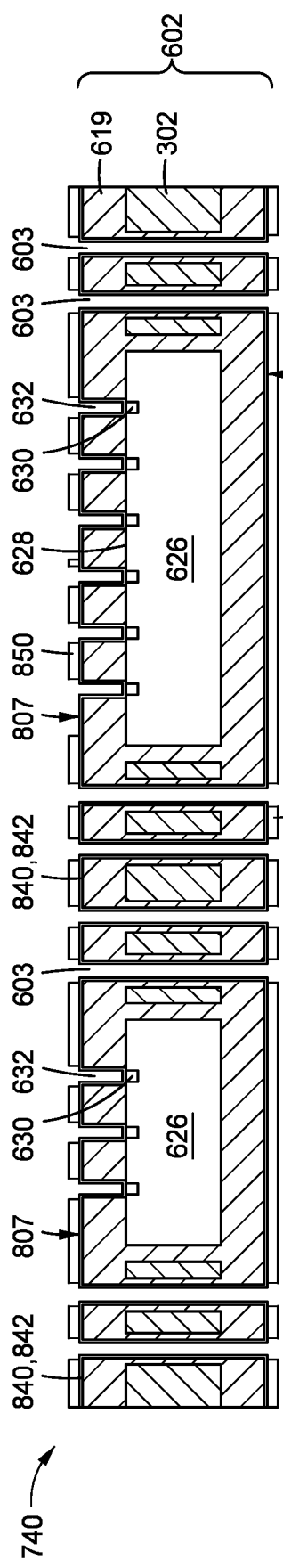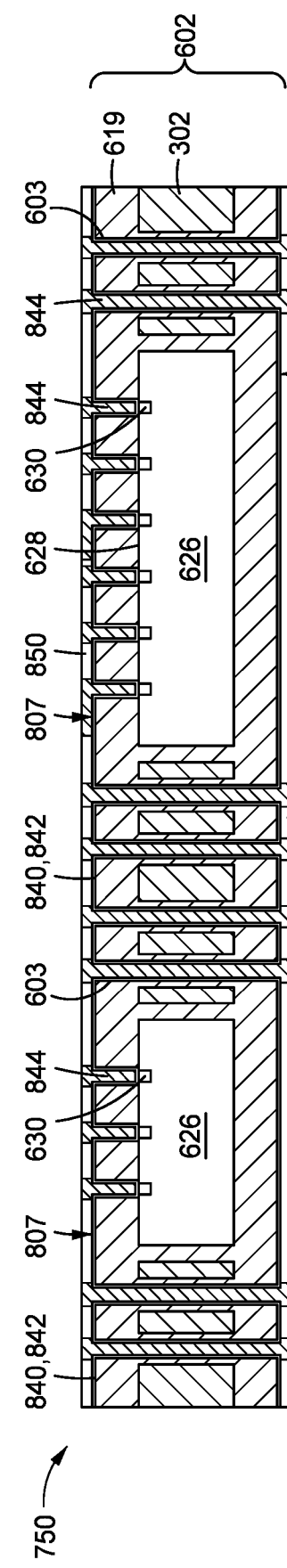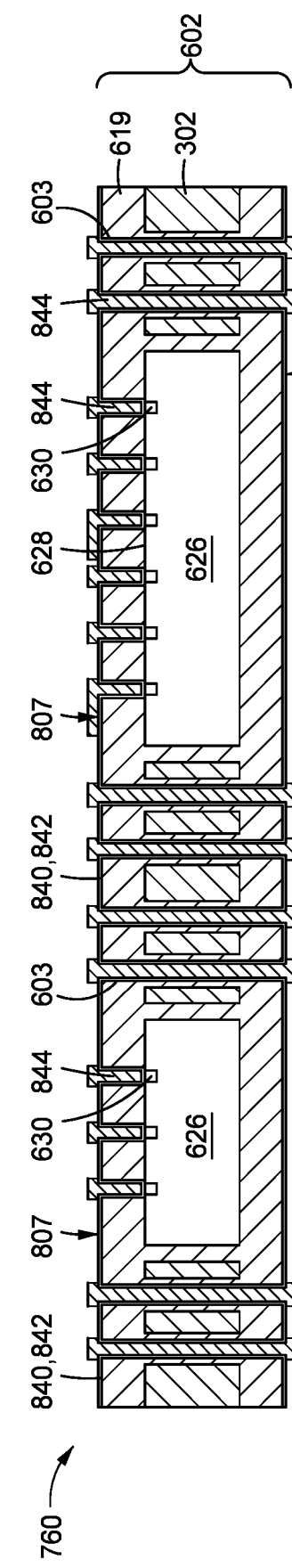

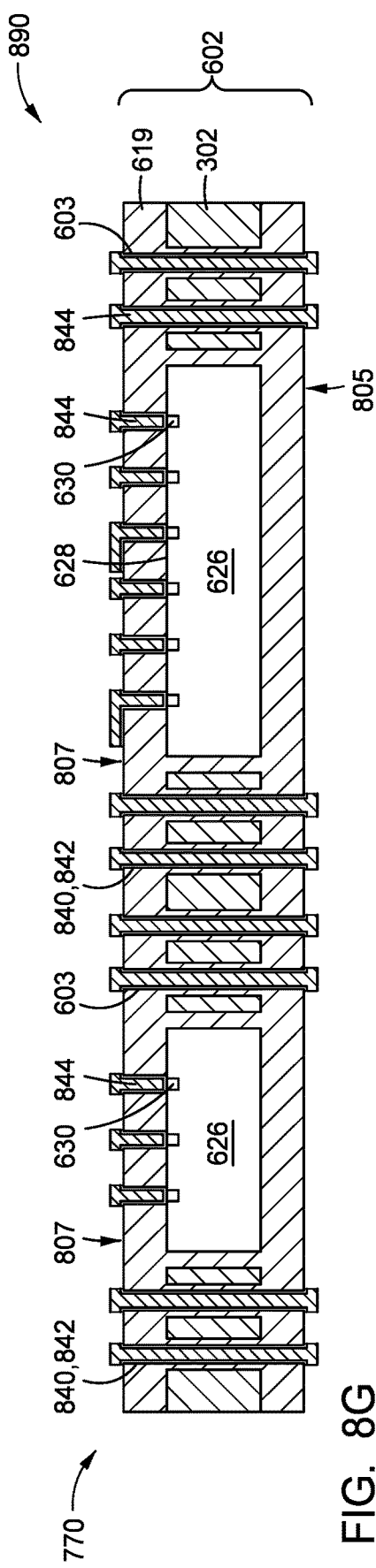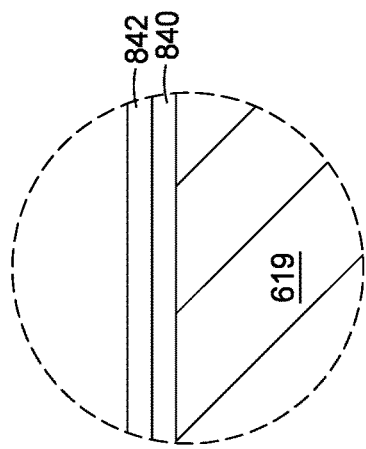
FIG. 8G
FIG. 8H

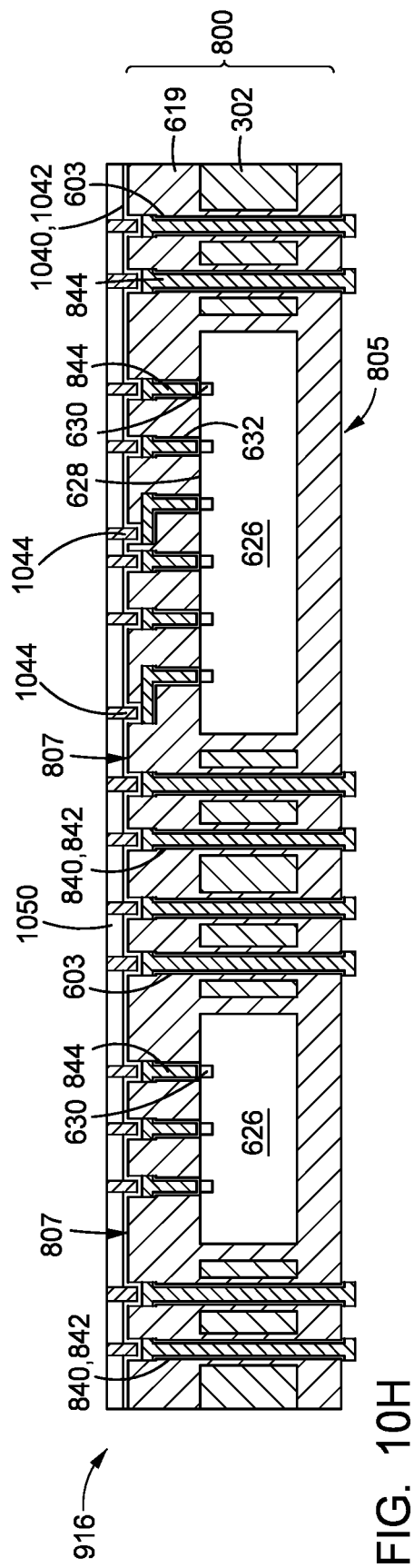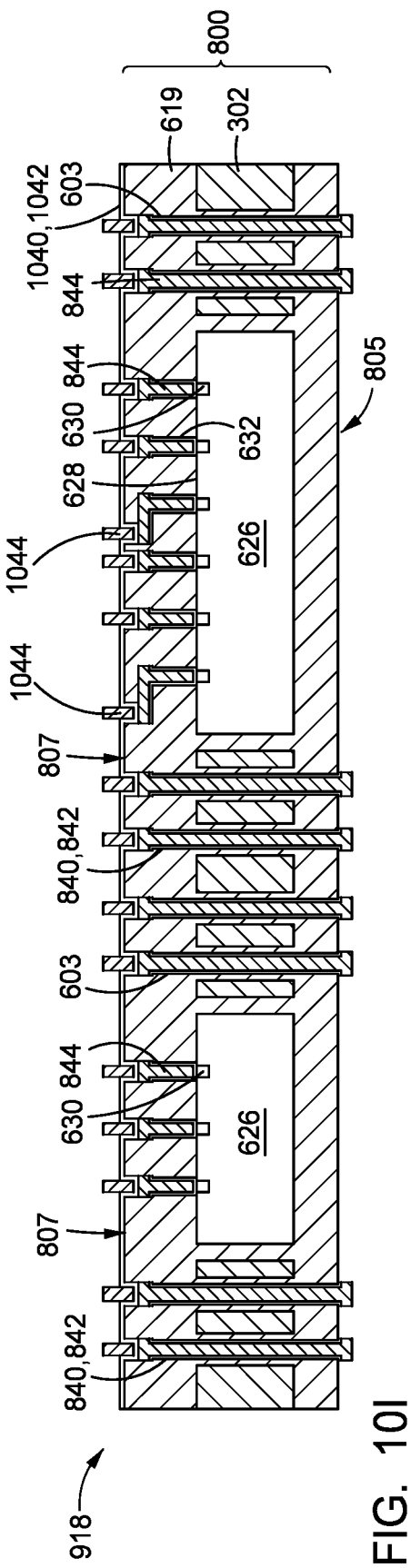
FIG. 10H
FIG. 10I

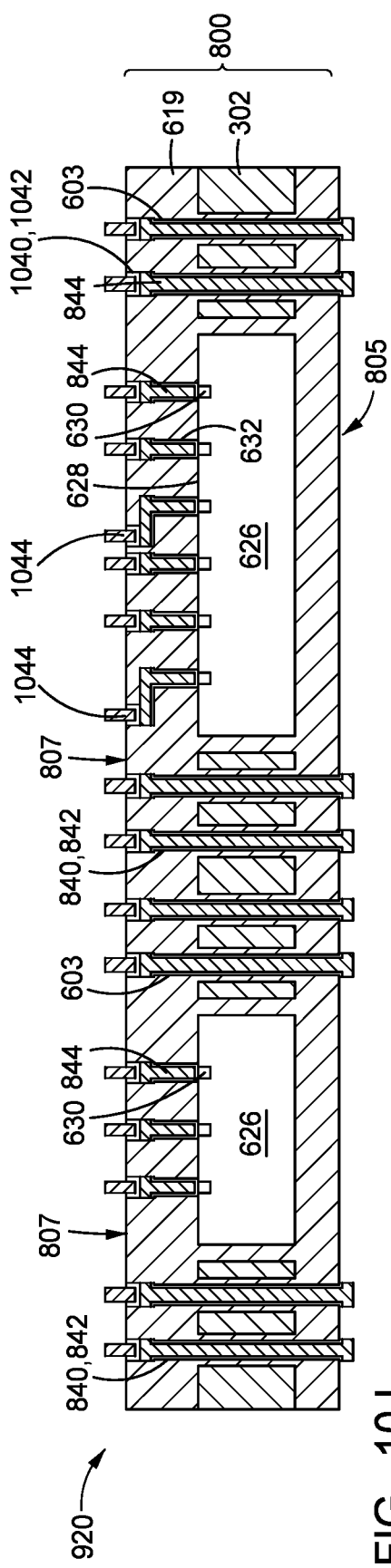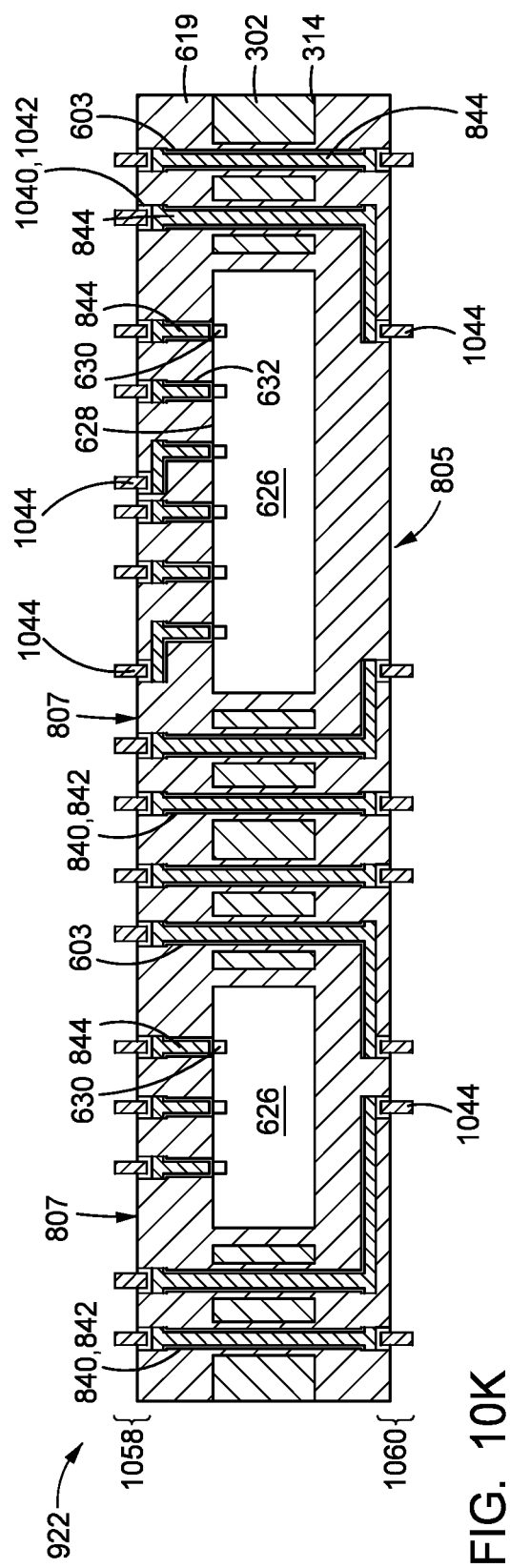
FIG. 10J
FIG. 10K

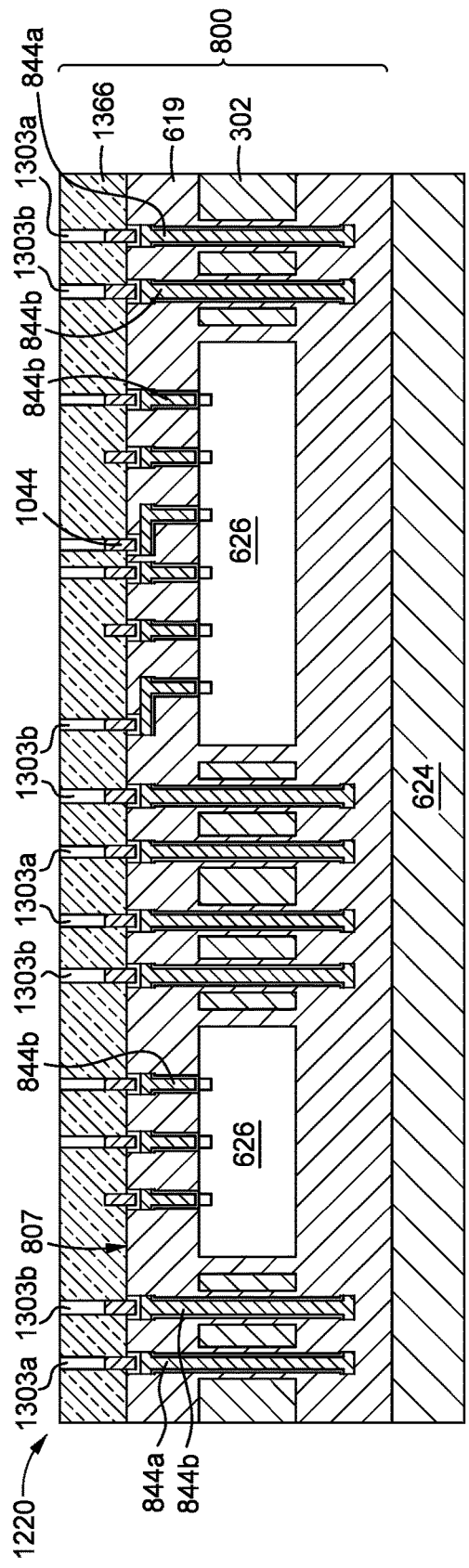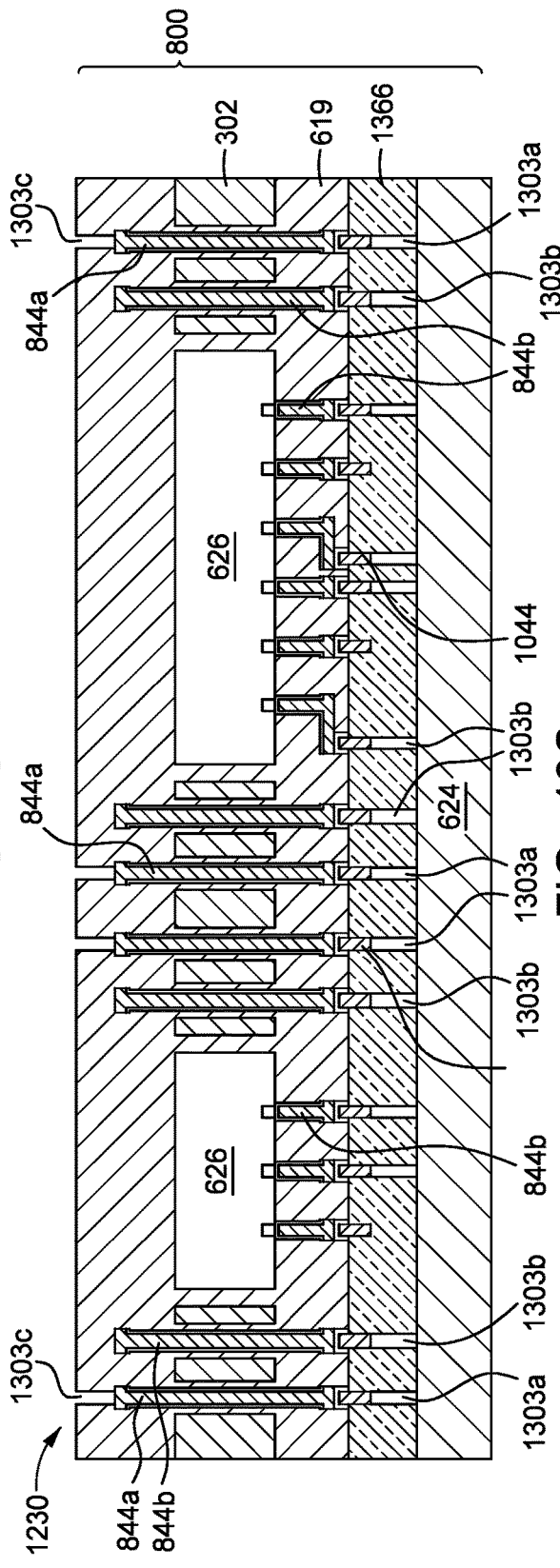
FIG. 13B
FIG. 13C

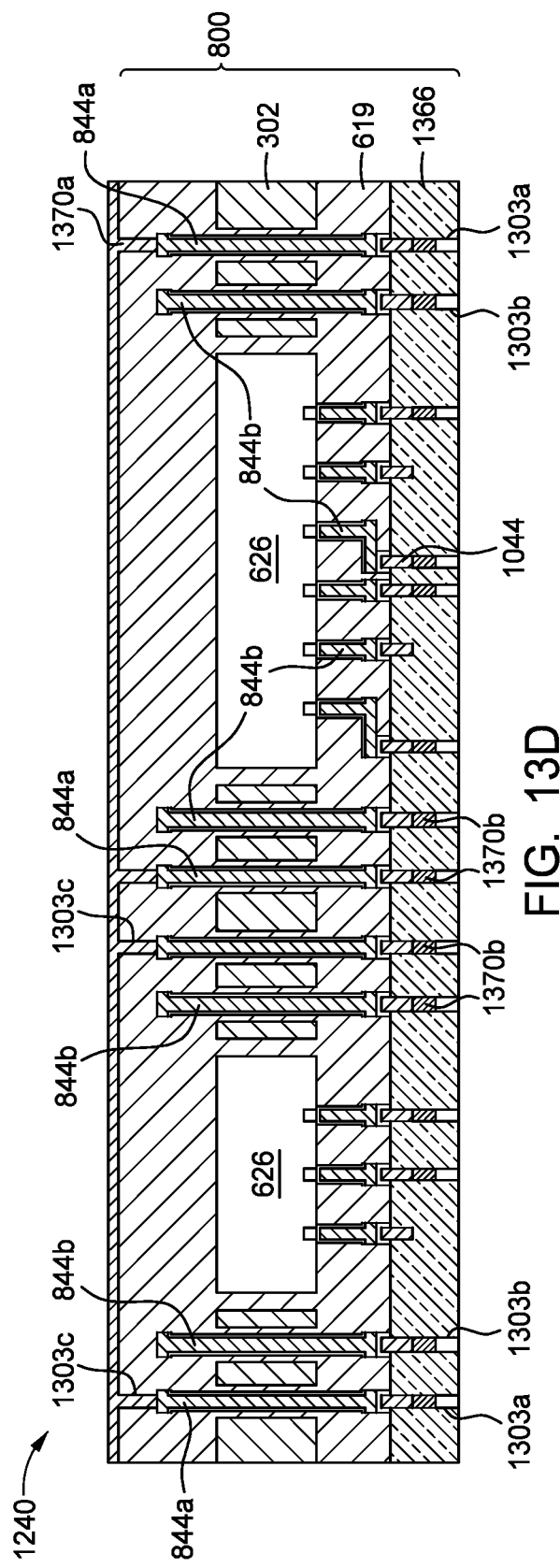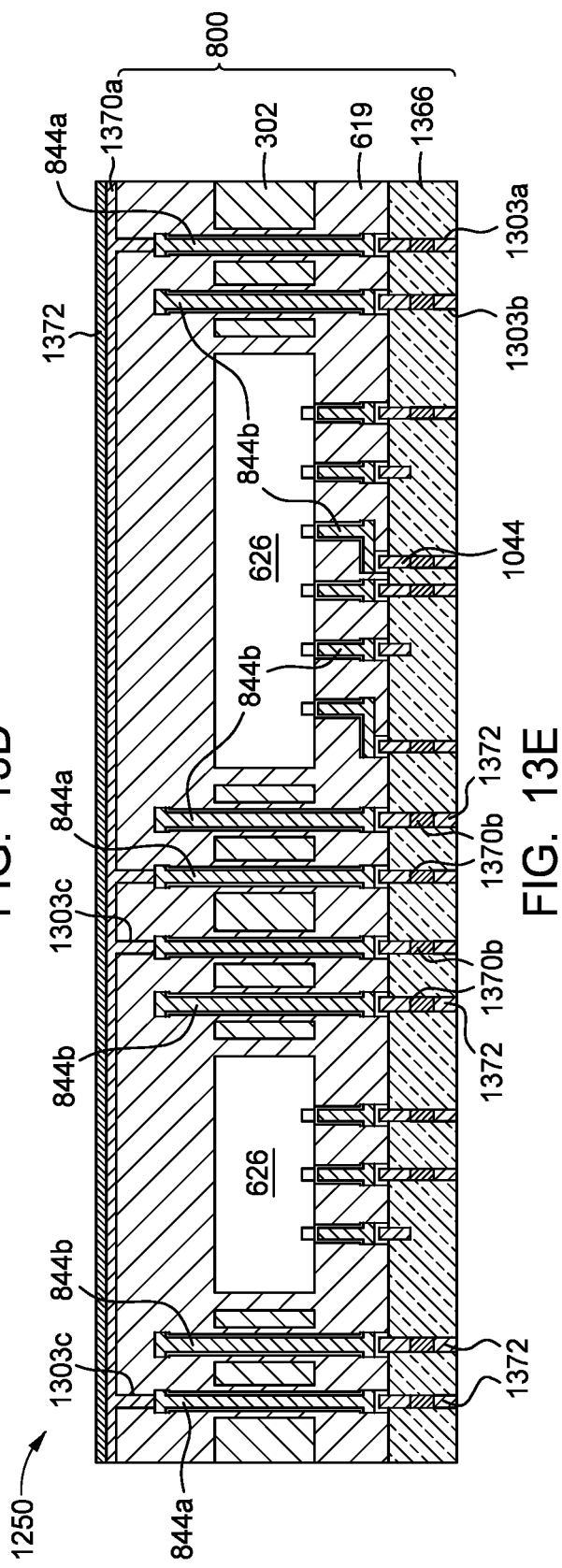

PACKAGE STRUCTURES WITH BUILT-IN EMI SHIELDING

BACKGROUND

Field

Embodiments described herein generally relate to the field of semiconductor device manufacturing, and more particularly, to structures and methods of forming semiconductor device packages.

Description of the Related Art

Ongoing trends in the development of semiconductor device technology have led to semiconductor components having reduced sizes and increased circuit densities. In accordance with demands for continued scaling of semiconductor devices while improving performance capabilities, these components and circuits are integrated into complex 3D semiconductor packages that facilitate a significant reduction in device footprint and enable shorter and faster connections between components. Such packages may integrate, for example, semiconductor chips and a plurality of other electronic components for mounting onto a circuit board of an electronic device.

In order to ensure that electronic devices such as, for example, mobile phones, operate properly at desired levels of performance, the semiconductor packages are typically shielded from electromagnetic interference ("EMI"). EMI is the unwanted effects in an electrical system due to electromagnetic radiation and electromagnetic conduction. A semiconductor package may emit EMI that can interfere with the operation of other nearby semiconductor packages (e.g., other packages integrated on a circuit board). Accordingly, semiconductor packages may comprise an EMI shield to help reduce EMI from being emitted therefrom and to block EMI received from other sources.

However, current methods for forming an EMI shield on a package are complicated and costly. Accordingly, there is a need in the art for effective EMI shielding of semiconductor package structures without significantly increasing package size and process complexity, and without increasing associated packaging manufacturing costs.

SUMMARY

The present disclosure generally relates to the field of semiconductor device manufacturing, and more particularly, to structures and methods of forming semiconductor device packages with integrated EMI shields for advanced 3D packaging applications.

In certain embodiments, a semiconductor package is provided. The semiconductor package includes a frame having a first surface opposite a second surface, at least one cavity with a semiconductor die disposed therein, a first plurality of vias disposed around the at least one cavity, and a second plurality of vias disposed around the first plurality of vias. Each of the first plurality of vias has a first via surface that defines a first opening extending through the frame from the first surface to the second surface, and each of the second plurality of vias has a second via surface that defines a second opening extending through the frame from the first surface to the second surface. The semiconductor package further includes an insulating layer contacting at least a portion of each side of the semiconductor die and disposed over the first surface and the second surface of the frame and within each of the first and second pluralities of vias, a first plurality of electrical interconnections for signal transmission disposed within the first plurality of vias, and a second plurality of electrical interconnections for electromagnetic interference (EMI) shielding disposed within the second plurality of vias. An EMI shielding layer is disposed over at least one of the first surface or the second surface of the frame and is further coupled to the second plurality of electrical interconnections.

In certain embodiments, a semiconductor package is provided. The semiconductor package includes a frame having a first surface opposite a second surface, at least one cavity with a semiconductor die disposed therein, a first via comprising a first via surface that defines a first opening extending through the frame from the first surface to the second surface, and a second via comprising a second via surface that defines a second opening extending through the frame from the first surface to the second surface. The semiconductor package further includes an insulating layer disposed over the first surface and the second surface of the frame and within each of the first and second vias, a first electrical interconnection for signal transmission disposed within the first via, and a second electrical interconnection for electromagnetic interference (EMI) shielding disposed within the second via. An EMI shielding layer is disposed over at least one of the first surface or second surface of the frame and is further coupled to the second electrical interconnection.

In certain embodiments, a semiconductor package is provided. The semiconductor package includes a frame having a first surface opposite a second surface, at least one cavity with a semiconductor die disposed therein, and a via comprising a via surface that defines an opening extending through the frame from the first surface to the second surface. The semiconductor package further includes an insulating layer disposed over the first surface and the second surface of the frame and within each of the at least one cavity and the via, and an electrical interconnection for electromagnetic interference (EMI) shielding disposed within the via and extending from the first surface to the second surface. The electrical interconnection is circumferentially surrounded by the insulating layer within the via. An EMI shielding layer is disposed over at least one of the first surface or second surface of the frame and is coupled to the electrical interconnection.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3D schematically illustrate cross-sectional views of a substrate at different stages of the substrate structuring process depicted in FIG. 2.

FIGS. 6A-6K schematically illustrate cross-sectional views of the intermediary die-embedded substrate assembly at different stages of the process depicted in FIG. 5.

FIGS. 8A-8K schematically illustrate cross-sectional views of the intermediary die-embedded substrate assembly at different stages of the interconnection formation process depicted in FIG. 7.

FIGS. 10A-10K schematically illustrate cross-sectional views of an intermediary die-embedded substrate assembly at different stages of forming a redistribution layer, as depicted in FIG. 9.

FIGS. 13A-13F schematically illustrate cross-sectional views of a package panel at different stages of forming an EMI shielding layer followed by singulation, as depicted in FIG. 12.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 1:
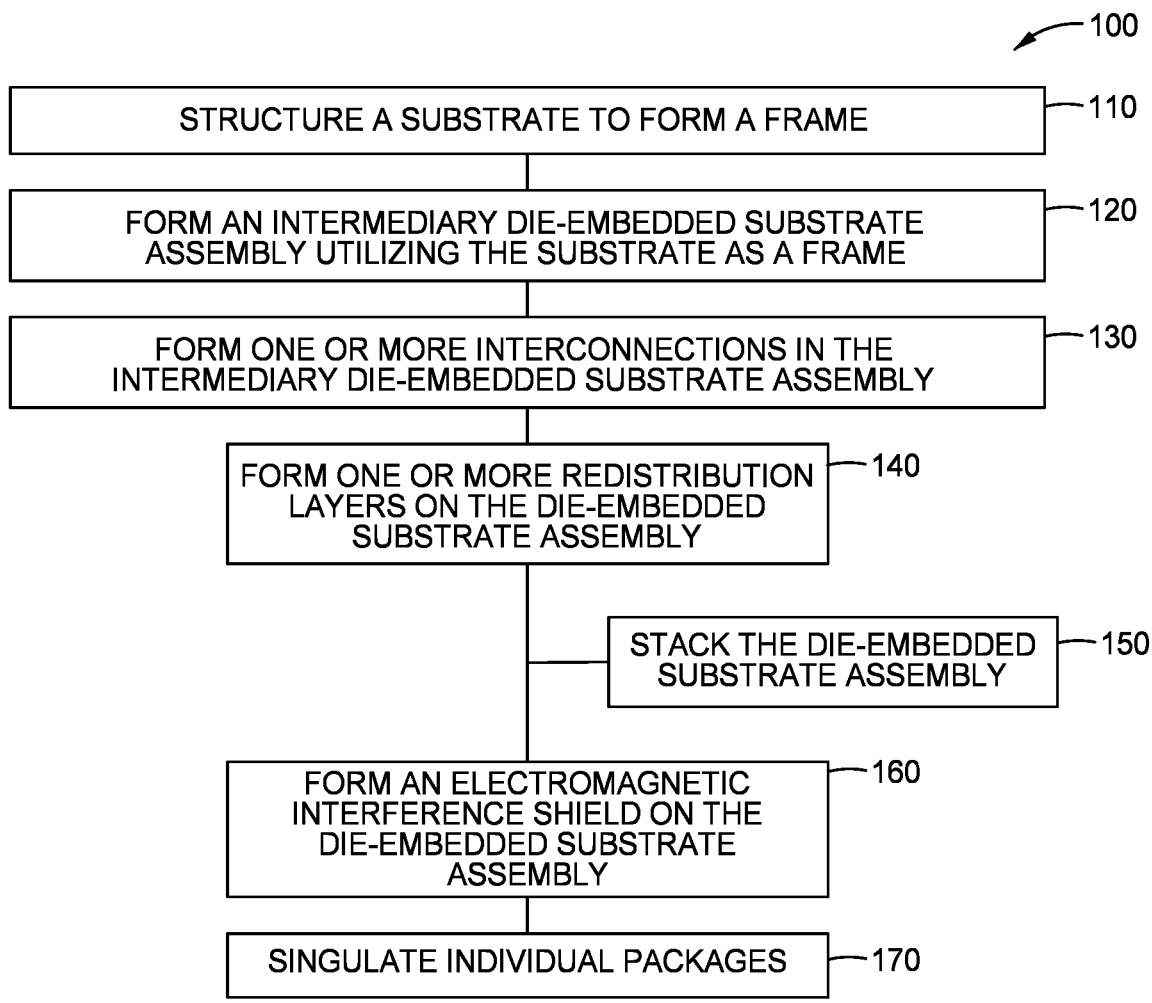
FIG. 1 illustrates a flow diagram of a process for forming a package with an integrated EMI shield, according to embodiments described herein.

The present disclosure relates to thin-form-factor semiconductor packages with integrated electromagnetic interference ("EMI") shielding and methods for forming the same. Due to the decreasing sizes and increasing densities of advanced package structures, in addition to the integration of these package structures adjacent other components on crowded circuit boards, unintended and unwanted operational disruption of packaged devices may occur due to EMI caused by other surrounding devices (e.g., external thereto). Accordingly, the formation of an EMI shield on package structures can reduce or eliminate EMI caused by other devices and improve overall electronic device functionality.

Currently, EMI shielding techniques for semiconductor packages and related devices typically include the utilization of metal caps, PVD-sputtered EMI shields (e.g., cluster PVD and inline PVD), and spray-coated EMI shields. However, these conventional methods of EMI shielding suffer from several limitations, including shield thickness variation, product masking, undesired adhesion to plastics, unwanted device backside deposition, and high manufacturing and/or material costs, to name a few. The present disclosure provides improved methods and structures of EMI shielding, wherein an EMI shielding layer is electrolytically plated onto a package or device.

Benefits of the EMI shielding methods and structures described herein include the capability of utilizing a wide variety of interference blocking materials suitable for screening electronic devices from a wide range of undesirable signal frequencies. For example, in certain embodiments, highly conductive pure metals may be utilized for blocking high-frequency signals, while in other embodiments, soft ferromagnetic metals may be utilized for blocking low-frequency signals. Electrolytic plating of the EMI shielding layers also provides a greater range of thicknesses while enabling enhanced uniformity thereof, thus facilitating improved control of EMI shield morphology. Furthermore, the methods described herein provide for increased sidewall coverage of EMI shielding materials, enabling improved side EMI shielding and grounding thereof by plating through-vias embedded within package structures with repeatable critical dimensions and densities. Additionally, the built-in EMI shielding structures may act as heat sinks and facilitate improved thermal exchange of the packages or devices the EMI shielding structures are integrated with.

In certain embodiments of the present disclosure, a silicon substrate is laser ablated to include one or more cavities and a plurality of vias surrounding the one or more cavities. One or more semiconductor dies may be placed within the cavities and thereafter embedded in the substrate upon formation of an insulating layer thereon. A plurality of conductive interconnections are formed within the vias and may have contact points redistributed to desired surfaces of the die-embedded substrate assembly. Thereafter, an EMI shield is plated onto a surface of the die-embedded substrate assembly and is connected to ground by at least one of the one or more conductive interconnections. The EMI shield, in addition to the one or more conductive interconnections coupled therewith, acts to shield the embedded semiconductor dies from any unwanted and undesired EMI signals. The die-embedded substrate assembly may then be singulated and/or integrated with another semiconductor device.

FIG. 1 illustrates a flow diagram of a representative method 100 of forming a single layer or stacked package having an integrated EMI shield, according to embodiments of the present disclosure. The method 100 has multiple operations 110, 120, 130, 140, 150, 160, and 170. Each operation is described in greater detail with reference to FIGS. 2-13F. The method may include one or more additional operations which are carried out before any of the defined operations, between two of the defined operations, or after all of the defined operations (except where the context excludes the possibility).

In general, the method 100 includes structuring a substrate to be used as a frame at operation 110, further described in greater detail with reference to FIGS. 2, 3A-3D, and 4A-4C. At operation 120, an intermediary (e.g., precursory) die-embedded substrate assembly (hereinafter "die-embedded assembly) having one or more embedded dies and insulating layers is formed, which is described in greater detail with reference to FIGS. 5 and 6A-6K. One or more interconnections are formed in and/or through the die-embedded assembly at operation 130, described in greater detail with reference to FIGS. 7 and 8A-8K, followed by the formation of one or more redistribution layers at operation 140, described with reference to FIGS. 9 and 10A-10K. At operation 150, the die-embedded assembly may be optionally stacked with other devices to form a stacked 3D structure, as described with reference to FIGS. 11A-11B. At operations 160 and 170, the single layer die-embedded assembly or stacked 3D structure has an EMI shield formed thereon, and is thereafter singulated into individual packages or integrated into other stacked devices, which is described in greater detail with reference to FIGS. 12 and 13A-13F.

Figure 2:
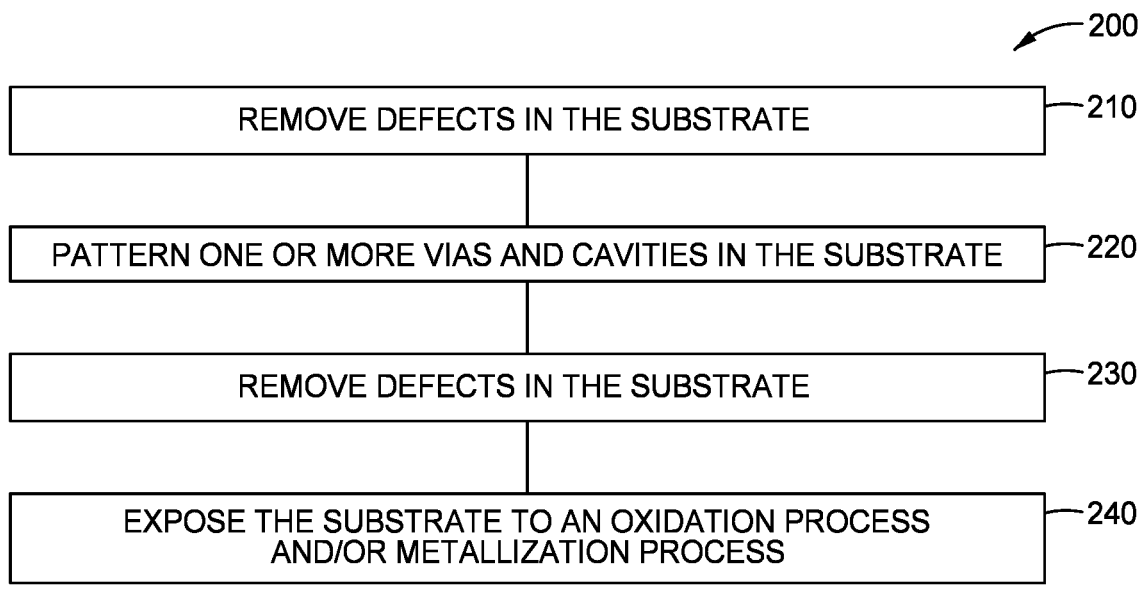
FIG. 2 illustrates a flow diagram of a substrate structuring process during formation of a package with an integrated EMI shield, according to embodiments described herein.

FIG. 2 illustrates a flow diagram of a representative method 200 for structuring a substrate to be utilized as a frame for a die-embedded assembly, according to embodiments of the present disclosure. FIGS. 3A-3D schematically illustrate cross-sectional views of a substrate 302 at different stages of the substrate structuring process 200 represented in FIG. 2. Therefore, FIG. 2 and FIGS. 3A-3D are herein described together for clarity.

The method 200 begins at operation 210 and corresponding FIG. 3A, wherein the substrate 302 is exposed to a first defect removal process. The substrate 302 is formed of any suitable substrate material including but not limited to a III-V compound semiconductor material, silicon (e.g., having a resistivity between about 1 and about 10 Ohm-com or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In certain embodiments, the substrate 302 is a monocrystalline p-type or n-type silicon substrate. In certain embodiments, the substrate 302 is a polycrystalline p-type or n-type silicon substrate. In other embodiments, the substrate 302 is a p-type or n-type silicon solar substrate. The substrate 302 may further have a polygonal or circular shape. For example, the substrate 302 may include a substantially square silicon substrate having lateral dimensions between about 120 mm and about 180 mm, such as about 150 mm or between about 156 mm and about 166 mm, with or without chamfered edges. In another example, the substrate 302 may include a circular silicon-containing substrate having a diameter between about 20 mm and about 700 mm, such as between about 100 mm and about 500 mm, for example about 200 mm or about 300 mm.

Unless otherwise noted, embodiments and examples described herein are conducted on large substrates having a thickness between about 50 µm and about 1500 µm, such as between about 90 µm and about 780 µm. For example, the substrate 302 has a thickness between about 100 µm and about 300 µm, such as a thickness between about 110 µm and about 200 µm. In another example, the substrate 302 has a thickness between about 60 µm and about 160 µm, such as a thickness between about 80 µm and about 120 µm.

Prior to operation 210, the substrate 302 may be sliced and separated into a wafer-size segment from a bulk material by wire sawing, scribing and breaking, mechanical abrasive sawing, or laser cutting. Slicing typically causes mechanical defects or deformities in substrate surfaces, such as scratches, micro-cracking, chipping, and other mechanical defects. Thus, the substrate 302 is exposed to the first defect removal process at operation 210 to smoothen and planarize surfaces thereof and remove any mechanical defects in preparation for later structuring and packaging operations. In some embodiments, the substrate 302 may further be thinned by adjusting the process parameters of the first defect removal process. For example, a thickness of the substrate 302 may be decreased with increased (e.g., additional) exposure to the first defect removal process.

In some embodiments, the first defect removal process at operation 210 includes exposing the substrate 302 to a substrate polishing process and/or an etch process followed by rinsing and drying processes. For example, the substrate 302 may be exposed to a chemical mechanical polishing (CMP) process at operation 210. In some embodiments, the etch process is a wet etch process, including a buffered etch process that is selective for the removal of desired materials (e.g., contaminants and other undesirable compounds). In other embodiments, the etch process is a wet etch process utilizing an isotropic aqueous etch process. Any suitable wet etchant or combination of wet etchants may be used for the wet etch process. In certain embodiments, the substrate 302 is immersed in an aqueous HF etching solution for etching. In other embodiments, the substrate 302 is immersed in an aqueous KOH etching solution for etching. During the etch process, the etching solution may be heated to a temperature between about 30° C. and about 100° C., such as between about 40° C. and about 90° C., in order to accelerate the etching process. For example, the etching solution is heated to a temperature of about 70° C. during the etch process. In still other embodiments, the etch process at operation 210 is a dry etch process. An example of a dry etch process includes a plasma-based dry etch process.

The thickness of the substrate 302 may be modulated by controlling the time of exposure of the substrate 302 to the polishing process and/or the etchants (e.g., the etching solution) used during the etch process. For example, a final thickness of the substrate 302 may be reduced with increased exposure to the polishing process and/or etchants. Alternatively, the substrate 302 may have a greater final thickness with decreased exposure to the polishing process and/or the etchants.

At operations 220 and 230, the now planarized and substantially defect-free substrate 302 has one or more features, such as vias 303 and cavities 305, patterned therein and smoothened (two cavities 305 and eight vias 303 are depicted in the lower cross-section of the substrate 302 in FIG. 3B for clarity). The vias 303 are utilized to form direct contact electrical interconnections or EMI shielding and grounding connections through the substrate 302 and the cavities 305 are utilized to receive and enclose (i.e., embed) one or more semiconductor dies or devices therein.

In embodiments where the substrate 302 has a relatively small thickness, such as a thickness less than 200 µm, the substrate 302 may be coupled to a carrier plate (not shown) prior to patterning. For example, where the substrate 302 has a thickness less than about 100 µm, such as a thickness of about 50 µm, the substrate 302 is placed on a carrier plate for mechanical support and stabilization during the substrate structuring processes at operations 220 and 230, thus preventing the substrate 302 from breaking. The carrier plate is formed of any suitable chemically and thermally stable rigid material including but not limited to glass, ceramic, metal, or the like, and has a thickness between about 1 mm and about 10 mm. In some embodiments, the carrier plate has a textured surface to hold the substrate 302 in place during structuring. In other embodiments, the carrier plate has a polished or smooth surface.

The substrate 302 may be coupled to the carrier plate via an adhesive such as wax, glue, or any suitable temporary bonding material which may be applied to the carrier plate by mechanical rolling, pressing, lamination, spin coating, or doctor-blading. In some embodiments, the substrate 302 is coupled to the carrier plate via a water-soluble or solvent-soluble adhesive. In other embodiments, the adhesive is a thermal release or UV release adhesive. For example, the substrate 302 may be released from the carrier plate by exposure to a bake process with temperatures between about 50° C. and about 300° C., such as temperatures between about 100° C. and about 200° C., such as temperatures between about 125° C. and about 175° C.

In certain embodiments, a desired pattern is formed in the substrate 302, such as a solar substrate or semiconductor wafer, by laser ablation. The laser ablation system utilized to laser drill features in the substrate 302 may include any suitable type of laser source. In some examples, the laser source is an infrared (IR) laser. In some examples, the laser source is a picosecond UV laser. In other examples, the laser source is a femtosecond UV laser. In yet other examples, the laser source is a femtosecond green laser. The laser source generates a continuous or pulsed laser beam for patterning of the substrate. For example, the laser source may generate a pulsed laser beam having a frequency between 5 kHz and 500 kHz, such as between 10 kHz and about 200 kHz. In some examples, the laser source is configured to deliver a pulsed laser beam at a wavelength of between about 200 nm and about 1200 nm and at a pulse duration between about 10 ns and about 5000 ns with an output power of between about 10 Watts and about 100 Watts. The laser source is configured to form any desired pattern and features in the substrate 302, including the cavities 305 and the vias 303 described above and depicted in FIG. 3B.

Similar to the process of separating the substrate 302 from the bulk material, the laser patterning of the substrate 302 may cause unwanted mechanical defects on the surfaces of the substrate 302, such as chipping and cracking. Thus, after forming desired features in the substrate 302 by direct laser patterning, the substrate 302 is exposed to a second defect removal and cleaning process at operation 230 substantially similar to the first defect removal process described above. FIGS. 3B and 3C illustrate the structured substrate 302 before and after performing the second damage removal and cleaning process at operation 230, resulting in a smoothened substrate 302 having the cavities 305 and vias 303 formed therein.

During the second damage removal process, the substrate 302 is etched, rinsed, and dried. The etch process proceeds for a predetermined duration to smoothen the surfaces of the substrate 302, and in particular, the surfaces exposed to laser patterning. In another aspect, the etch process is utilized to remove any undesired debris remaining from the laser ablation process. The etch process may be isotropic or anisotropic. In some embodiments, the etch process is a wet etch process utilizing any suitable wet etchant or combination of wet etchants in aqueous solution. For example, the substrate 302 may be immersed in an aqueous HF etching solution or an aqueous KOH etching solution. In some embodiments, the etching solution is heated to further accelerate the etching process. For example, the etching solution may be heated to a temperature between about 40° C. and about 80° C., such as between about 50° C. and about 70° C., such as a temperature of about 60° C. during etching of the substrate 302. In still other embodiments, the etch process at operation 230 is a dry etch process. An example of a dry etch process includes a plasma-based dry etch process.

FIG. 3C illustrates a longitudinal cross-section of the substrate 302 after completion of operations 210-230, according to embodiments of the present disclosure. The substrate 302 is depicted having two cavities 305 formed therethrough, each cavity 305 surrounded on either side by two vias 303. Furthermore, the two cavities 305 are shown having different lateral dimensions $D_1$ and $D_2$, thus enabling placement of different types of semiconductor devices and/or dies in each cavity during subsequent packaging operations. Accordingly, the cavities 305 may be shaped and sized to accommodate any desired devices and/or dies in any desired arrangement for 2D and/or 3D heterogeneous packaging integration. Note that, as used herein, a "heterogeneous" package or system refers to any package or system having two or more different types of dies and/or components other than electrical connections. On the other hand, a "homogeneous" package or system refers to any package or system having a single type of die or component other than electrical connections. Although only two cavities and eight vias are depicted in FIGS. 3B-3D, any number and arrangement of cavities and vias may be formed in the substrate while performing the method 200. Top views of additional exemplary arrangements are later described with reference to FIGS. 4A-4C.

At operation 240, the substrate 302 is then exposed to an optional oxidation and/or metallization process to grow an oxide layer 314 and/or a metal cladding layer 315 on desired surfaces thereof after removal of mechanical defects. For example, the oxide layer 314 and/or metal cladding layer 315 may be formed on all surfaces of the substrate 302 (e.g., including sidewalls of the cavities 305 and vias 303) such that the layers 314 and/or 315 surround the substrate 302. Note, that although only a single layer 314, 315 is shown in each FIG. 3D, in certain embodiments, the substrate 302 may have both an oxide layer 314 and a metal cladding layer 315 formed thereover, wherein the metal cladding layer 315 is formed over the oxide layer 314.

The oxide layer 314 acts as a passivating layer on the substrate 302 and provides a protective outer barrier against corrosion and other forms of damage. In certain embodiments, the substrate 302 is exposed to a thermal oxidation process to grow the oxide layer 314 thereon. The thermal oxidation process is performed at a temperature of between about 700° C. and about 1200° C., such as between about 850° C. and about 1150° C. For example, the thermal oxidation process is performed at a temperature of between about 900° C. and about 1100° C., such as a temperature of between about 950° C. and about 1050° C. In certain embodiments, the thermal oxidation process is a wet oxidation process utilizing water vapor as an oxidant. In certain embodiments, the thermal oxidation process is a dry process utilizing molecular oxygen as the oxidant. It is contemplated that the substrate 302 may be exposed to any suitable oxidation process at operation 240 to form the oxide layer 314 thereon. In some embodiments, the oxide layer 314 is a silicon dioxide film. The oxide layer 314 formed at operation 240 generally has a thickness between about 100 nm and about 3 µm, such as between about 200 nm and about 2.5 µm. For example, the oxide layer 314 has a thickness between about 300 nm and about 2 µm, such as about 1.5 µm.

In embodiments where a metal cladding layer 315 is formed on the substrate 302, the metal cladding layer 315 acts as a reference layer (e.g., grounding layer or a voltage supply layer). The metal cladding layer 315 is disposed on the substrate 302 to protect subsequently integrated semiconductor devices and connections from EMI and shields semiconductor signals from the semiconductor material (Si) that is used to form the substrate 302. In certain embodiments, the metal cladding layer 315 includes a conductive metal layer that includes nickel, aluminum, gold, cobalt, silver, palladium, tin, or the like. In certain embodiments, the metal cladding layer 315 includes a metal layer that includes an alloy or pure metal that includes nickel, aluminum, gold, cobalt, silver, palladium, tin, or the like. The metal cladding layer 315 generally has thickness between about 50 nm and about 10 µm such as between about 100 nm and about 5 µm.

The metal cladding layer 315 may be formed by any suitable deposition process, including an electroless deposition process, an electroplating process, a chemical vapor deposition process, an evaporation deposition process, and/or an atomic layer deposition process. In certain embodiments, at least a portion of the metal cladding layer 315 includes a deposited nickel (Ni) layer formed by direct displacement or displacement plating on the surfaces of the substrate 302 (e.g., n-Si substrate or p-Si substrate). For example, in certain embodiments, the substrate 302 is exposed to a nickel displacement plating bath having a composition including 0.5 M $NiSO_4$ and $NH_4OH$ at a temperature between about 60° C. and about 95° C. and a pH of about 11, for a period of between about 2 and about 4 minutes. The exposure of the silicon substrate 302 to a nickel ion-loaded aqueous electrolyte in the absence of reducing agent causes a localized oxidation/reduction reaction at the surface of the substrate 302, thus leading to plating of metallic nickel thereon. Accordingly, nickel displacement plating enables selective formation of thin and pure nickel layers on the silicon material of substrate 302 utilizing stable solutions. Furthermore, the process is self-limiting and thus, once all surfaces of the substrate 302 are plated (e.g., there is no remaining silicon upon which nickel can form), the reaction stops. In certain embodiments, the nickel metal cladding layer 315 may be utilized as a seed layer for plating of additional metal layers, such as for plating of nickel or copper by electroless and/or electrolytic plating methods. In further embodiments, the substrate 302 is exposed to an SC-1 pre-cleaning solution and a HF oxide etching solution prior to a nickel displacement plating bath to promote adhesion of the nickel metal cladding layer 315 thereto.

Figure 4A:
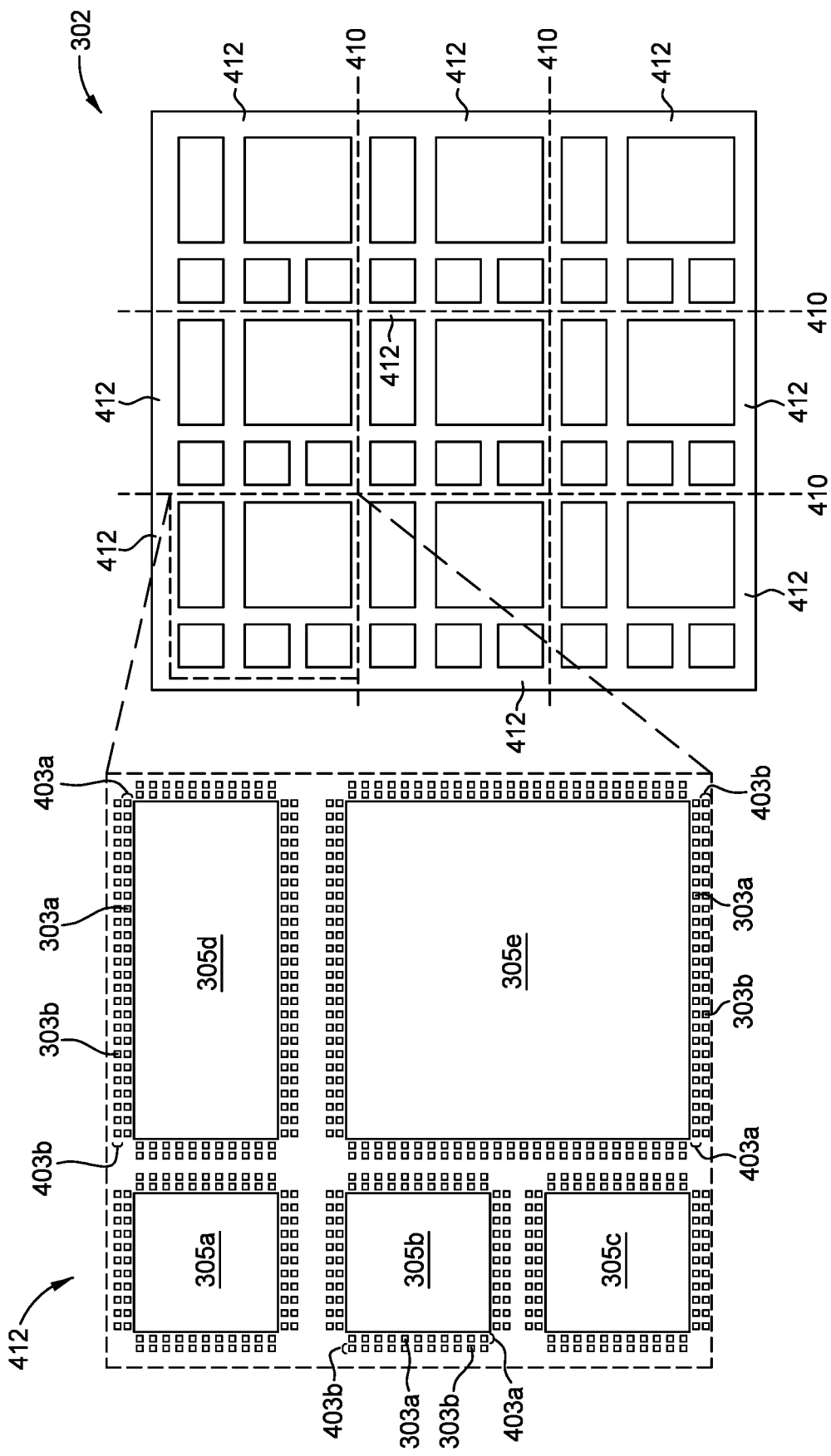
FIGS. 4A-4C illustrate schematic top views of substrates structured with the processes depicted in FIGS. 2 and 3A-3D according to embodiments described herein.

FIG. 4A illustrates a schematic top view of an exemplary pattern that may be formed in the substrate 302, thus enabling the substrate 302 to be utilized as a frame during heterogeneous 2D and 3D packaging according to embodiments of the present disclosure. The substrate 302 may be structured during operations 210-240 as described above with reference to FIGS. 2 and 3A-3D. As depicted, the substrate 302 is structured to include nine identical and quadrilateral regions 412 (separated by scribe lines 410) that may be packaged and singulated into nine individual 2D heterogeneous packages. Although nine identical regions 412 are shown in FIG. 4A, it is contemplated that any desired number of regions and arrangements of features may be structured into the substrate 302 utilizing the processes described above. In some examples, the regions 412 are not identical, and include different features and/or arrangements of features formed therein.

Each region 412 includes five quadrilateral cavities 305a-305e, each cavity 305a-305e surrounded by two rows 403a, 403b of vias 303a, 303b along major sides thereof. As depicted, cavities 305a-305c are structured to have substantially similar morphologies and thus, may each accommodate the placement (e.g., integration) of the same type of semiconductor device or die. Cavities 305d and 305e, however, have substantially differing morphologies from each other in addition to that of the cavities 305a-305c and thus, may accommodate the placement of two additional types of semiconductor devices or dies. Accordingly, the structured substrate 302 may be utilized to form a die-embedded assembly for singulation of heterogeneous 2D packages or systems-in-packages ("SIPs," i.e., systems having multiple integrated circuits enclosed in a package) having three types of semiconductor devices or dies integrated therein. Although depicted as having three types of quadrilateral cavities 305, each region 412 may have more or less than three types of cavities 305 with morphologies other than quadrilateral. For example, each region 412 may have one type of cavity 305 formed therein, thus enabling the formation of heterogeneous 2D packages or SIPs.

In certain embodiments, the cavities 305 and vias 303 have a depth equal to the thickness of the substrate 302, thus forming holes on opposing surfaces of the substrate 302 (e.g., through the thickness of the substrate 302). For example, the cavities 305 and the vias 303 formed in the substrate 302 may have a depth of between about 50 µm and about 1 mm, such as between about 100 µm and about 200 µm, such as between about 110 µm and about 190 µm, depending on the thickness of the substrate 302. In other embodiments, the cavities 305 and/or the vias 303 may have a depth equal to or less than the thickness of the substrate 302, thus forming a hole in only one surface (e.g., side) of the substrate 302.

In certain embodiments, each cavity 305 has lateral dimensions ranging between about 0.5 mm and about 50 mm, such as between about 3 mm and about 12 mm, such as between about 8 mm and about 11 mm, depending on the size and number of semiconductor devices or dies to be embedded therein during subsequent package fabrication. Semiconductor dies generally include a plurality of integrated electronic circuits that are formed on and/or within a substrate material, such as a piece of semiconductor material. In certain embodiments, the cavities 305 are sized to have lateral dimensions substantially similar to that of the semiconductor devices or dies to be embedded (e.g., integrated) therein. For example, each cavity 305 is formed having lateral dimensions (i.e., X-direction or Y-direction in FIG. 4A) exceeding those of the semiconductor devices or dies by less than about 150 µm, such as less than about 120 µm, such as less than 100 µm. Having a reduced variance in the size of the cavities 305 and the semiconductor devices or dies to be embedded therein reduces the amount of gap-fill material necessitated thereafter.

Although each cavity 305 is depicted as being surrounded by two rows 403a, 403b of vias 303a, 303b along major sides thereof, each region 412 may have different arrangements of vias 303. For example, the cavities 305 may be surrounded by more than two rows 403 of vias 303 wherein the vias 303 in each row 403 are staggered and unaligned with vias 303 of an adjacent row 403. In some embodiments, the vias 303 are formed as singular and isolated vias through the substrate 302.

Furthermore, as previously described, interconnections formed through the vias 303 in subsequent operations may be utilized for either device (e.g., semiconductor die) signal transmission or EMI shielding and EMI shield grounding. For example, the interconnections may be utilized to form a Faraday cage-like structure around embedded dies to providing EMI shielding thereof, as well as a grounding pathway for a subsequently formed EMI shielding layer through the finished package structure. Thus, the vias 303 may be arranged depending on the desired arrangement of signal transmission interconnections and EMI shielding interconnections. In certain embodiments, the vias 303a for signal transmission-dedicated interconnections may be formed adjacent to and surrounding the cavities 305, while vias 303b for EMI shielding-dedicated interconnections may be formed surrounding (e.g., outward of) the vias 303a for signal transmission-dedicated interconnections. For example, in FIG. 4A, the row 403a may be utilized for signal transmission-dedicated interconnections, while the row 403b may be utilized for shielding-dedicated interconnections.

The vias 303 are generally substantially cylindrical in shape. However, other morphologies for the vias 303 are also contemplated. For example, the vias 303 may have a tapered or conical morphology, wherein a diameter at a first end thereof (e.g., at one surface of the substrate 302) is larger than a diameter at a second end thereof. Formation of tapered or conical morphologies may be accomplished by moving the laser beam of the laser source utilized during structuring in a spiraling (e.g., circular, corkscrew) motion relative to the central axis of each of the vias 303. The laser beam may also be angled using a motion system to form tapered vias 303. The same methods may also be utilized to form cylindrical vias 303 having uniform diameters therethrough. Furthermore, in certain embodiments, the vias 303 may have square or rectangular cross-sections. Additionally, the vias 303 may all have similar morphologies, or different morphologies. For example, in certain embodiments, the vias 303a for signal transmission-dedicated interconnections may have a first morphology, while vias 303b for EMI shielding-dedicated interconnections may have a second morphology.

In certain embodiments, vias 303a for signal transmission-dedicated interconnections may have a diameter ranging between about 20 μm and about 200 μm, such as between about 50 μm and about 150 μm, such as between about 60 and about 130 μm, such as between about 80 μm and 110 μm. A minimum pitch between centers of the vias 303a for signal transmission-dedicated interconnections may be between about 70 μm and about 200 μm, such as between about 85 μm and about 160 μm, such as between about 100 μm and 140 μm.

In certain embodiments, vias 303b for EMI shielding-dedicated interconnections may have a diameter ranging between about 5 μm and about 100 μm, such as between about 20 μm and about 80 μm, such as between about 30 μm and about 70 μm, such as between about 40 μm and 60 μm. A minimum pitch between centers of the vias 303b for EMI shielding-dedicated interconnections may be between about 10 μm and about 120 μm, such as between about 10 μm and about 15 μm, or between about 100 μm and 120 μm.

Figure 4B:
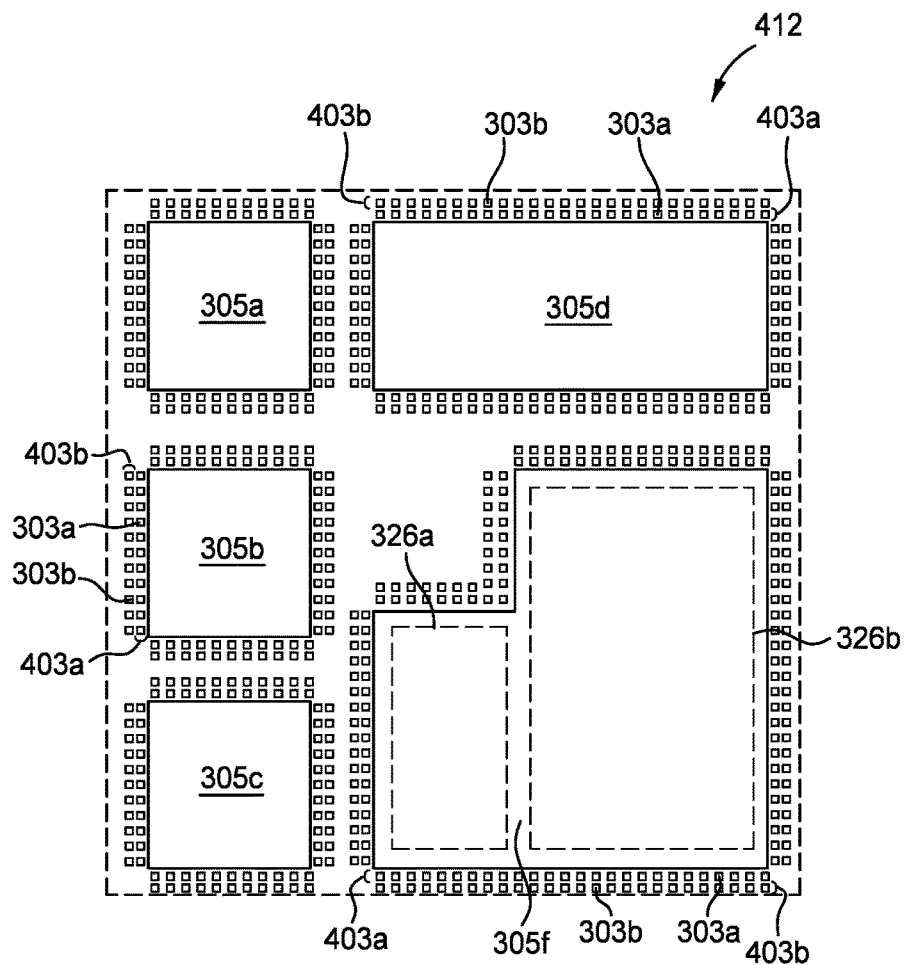

FIG. 4B illustrates another schematic top view of the region 412 with an exemplary pattern that may be formed in the substrate 302, according to embodiments of the present disclosure. In certain embodiments, it may be desirable to place two or more semiconductor dies of the same or different types in a single cavity 305 during packaging, with each semiconductor die having the same or different dimensions and/or shapes. Accordingly, in some examples, a cavity 305 may have an irregular or asymmetrical shape to accommodate semiconductor dies having different dimensions and/or shapes. As depicted in FIG. 4B, the region 412 includes four quadrilateral and symmetrical cavities 305a-d and a single asymmetrical cavity 305f. The cavity 305f is shaped to accommodate two semiconductor dies 326a and 326b (shown in phantom) having different dimensions. Although only one asymmetrical cavity 305f is depicted for accommodating two semiconductor dies 326a and 326b in FIG. 4B, it is contemplated that each region 412 may include more or less than one asymmetrical cavity 305 for accommodating any desired number of side-by-side dies having any suitable dimensions and shapes.

Figure 4C:
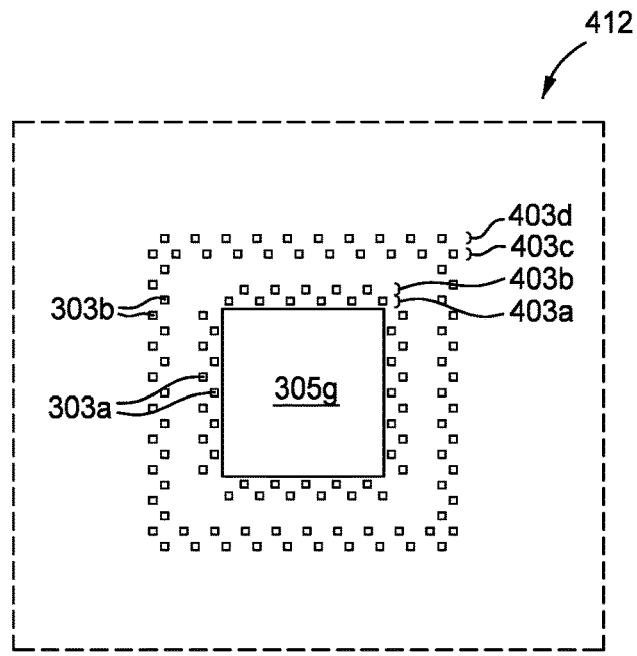

FIG. 4C illustrates yet another schematic top view of the region 412 with an exemplary pattern that may be formed in the substrate 302, according to embodiments of the present disclosure. In certain embodiments, it may be beneficial to form a plurality of rows of vias 303b for EMI shielding-dedicated interconnections around each cavity 305, in addition to vias 303a for signal transmission-dedicated interconnections. As depicted in FIG. 4C, the cavity 305g is surrounded by two staggered rows 403a, 403b of vias 303a for signal transmission-dedicated interconnections, which are in turn surrounded by two staggered rows 403c, 403d, of vias 303b for EMI shielding-dedicated interconnections. In this arrangement, subsequently formed EMI shielding-dedicated interconnections formed within the vias 303b will create a Faraday cage-like structure around signal transmission-dedicated interconnections formed within the vias 303a, as well as the one or more dies embedded within the cavity 305g. Accordingly, the interconnections within vias 303a and the dies embedded in cavity 305g will be shielded from EMI by the interconnections within vias 303b.

After structuring, the substrate 302 may be utilized as a frame to form a die-embedded assembly in subsequent packaging operations.

Figure 5:
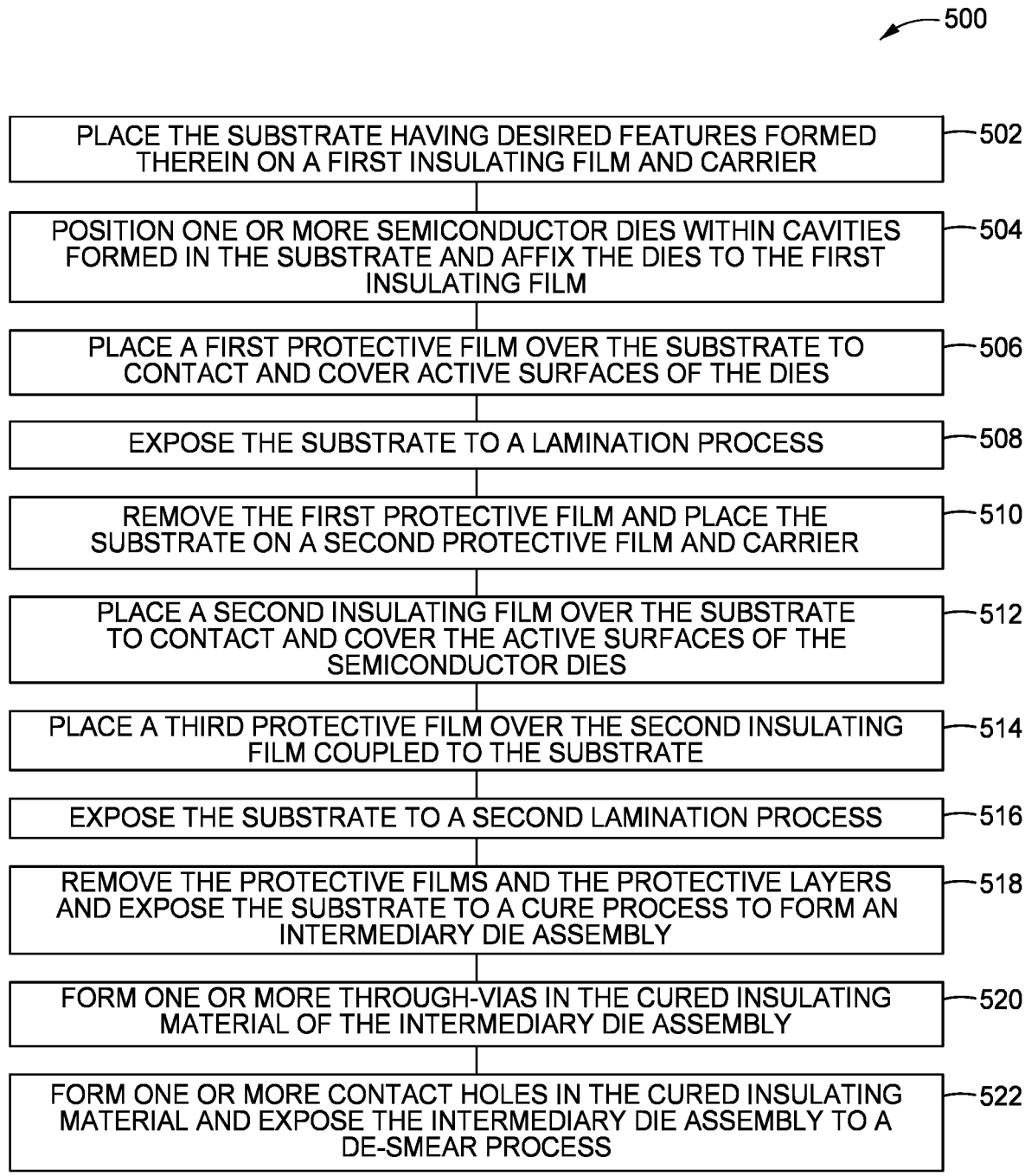
FIG. 5 illustrates a flow diagram of a process for forming an intermediary die-embedded substrate assembly having through-assembly vias and contact holes, according to embodiments described herein.

FIG. 5 illustrates a flow diagram of a representative method 500 for fabricating a die-embedded assembly 602 utilizing the substrate 302 prior to package completion, according to embodiments of the present disclosure. FIGS. 6A-6K schematically illustrate cross-sectional views of the substrate 302 at different stages of the method 500 depicted in FIG. 5, and are herein described together with FIG. 5 for clarity.

Generally, the method 500 begins at operation 502 and FIG. 6A, wherein a first side 675 (e.g., a first major surface 606) of the substrate 302, now having desired features formed therein, is placed on a first insulating film 616a. In certain embodiments, the first insulating film 616a includes one or more layers 618a formed of flowable and polymer-based dielectric materials, such as an insulating build-up material. In the embodiment depicted in FIG. 6A, the first insulating film 616a includes a flowable layer 618a formed of an epoxy resin. For example, the flowable layer 618a may be formed of a ceramic-filler-containing epoxy resin, such as an epoxy resin filled with (e.g., containing) substantially spherical silica ($SiO_2$) particles. As used herein, the term "spherical" refers to any round, ellipsoid, or spheroid shape. For example, in some embodiments, the ceramic fillers may have an elliptic shape, an oblong oval shape, or other similar round shape. However, other morphologies are also contemplated. Other examples of ceramic fillers that may be utilized to form the flowable layer 618a and other layers of the insulating film 616a include aluminum nitride (AlN), aluminum oxide ($Al_2O_3$), silicon carbide (SiC), silicon nitride ($Si_3N_4$), $Sr_2Ce_2Ti_5O_{16}$ ceramics, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

In some examples, the ceramic fillers utilized to form the flowable layer 618a have particles ranging in size between about 40 nm and about 1.5 μm, such as between about 80 nm and about 1 μm. For example, the ceramic fillers utilized to form the flowable layer 618a have particles ranging in size between about 200 nm and about 800 nm, such as between about 300 nm and about 600 nm. In some embodiments, the ceramic fillers include particles having a size less than about 25% of a width or diameter of the features (e.g., via, cavity, or through-assembly via) formed in the substrate, such as less than about 15% of a desired feature's width or diameter.

The flowable layer 618a typically has a thickness less than about 60 μm, such as between about 5 μm and about 50

μm. For example, the flowable layer 618a has a thickness between about 10 μm and about 25 μm. In certain embodiments, the insulating film 616a may further include one or more protective layers. For example, the insulating film 616a includes a polyethylene terephthalate (PET) protective layer 622a. However, any suitable combination of layers and insulating materials is contemplated for the insulating film 616a. In some embodiments, the entire insulating film 616a has a thickness less than about 120 μm, such as a thickness less than about 90 μm.

The substrate 302, which is coupled to the insulating film 616a on the first side 675 thereof, and specifically to the flowable layer 618a of the insulating film 616a, may further be optionally placed on a carrier 624 for mechanical support during later processing operations. The carrier 624 is formed of any suitable mechanically and thermally stable material. For example, the carrier 624 is formed of polytetrafluoroethylene (PTFE). In another example, the carrier 624 is formed of PET.

At operation 504 and depicted in FIG. 6B, one or more semiconductor dies 626 are placed within the cavities 305 formed in the substrate 302 so that the semiconductor dies 626 are now bound by the insulating film 616a on one side (two semiconductor dies 626 are depicted in FIG. 6B). In certain embodiments, the semiconductor dies 626 are multipurpose dies having integrated circuits formed on active surfaces 628 thereof. In certain embodiments, the semiconductor dies 626 are the same type of semiconductor devices or dies. In other embodiments, the semiconductor dies 626 are different types of semiconductor devices or dies. The semiconductor dies 626 are placed within the cavities 305 (e.g., cavities 350a-305e of FIG. 4) and positioned onto a surface of the insulating film 616a exposed through the cavities 305. In certain embodiments, the semiconductor dies 626 are placed on an optional adhesive layer (not shown) disposed or formed on the insulating film 616a.

After placement of the dies 626 within the cavities 305, a first protective film 660 is placed over a second side 677 (e.g., surface 608) of the substrate 302 at operation 506 and FIG. 6C. The protective film 660 is coupled to the second side 677 of the substrate 302 and opposite of the first insulating film 616a such that it contacts and covers the active surfaces 628 of the dies 626 disposed within the cavities 305. In certain embodiments, the protective film 660 is formed of a similar material to that of the protective layer 622a. For example, the protective film 660 is formed of PET, such as biaxial PET. However, the protective film 660 may be formed of any suitable protective materials. In some embodiments, the protective film 660 has a thickness between about 50 μm and about 150 μm.

Figure 6D:
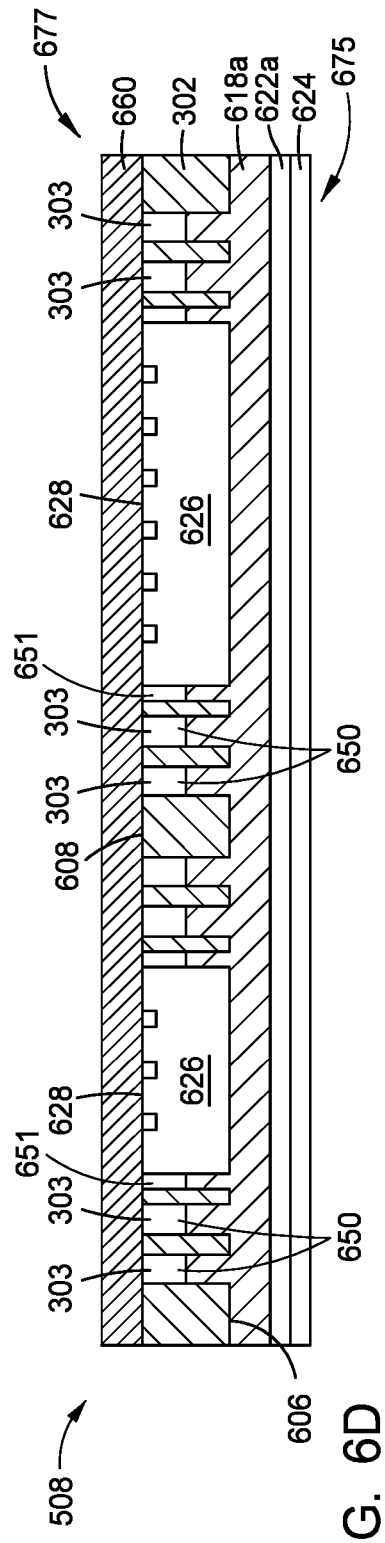

The substrate 302, now affixed to the insulating film 616a on the first side 675 and the protective film 660 on the second side 677 and further having dies 626 disposed therein, is exposed to a first lamination process at operation 508. During the lamination process, the substrate 302 is exposed to elevated temperatures, causing the flowable layer 618a of the insulating film 616a to soften and flow into open voids or volumes between the insulating film 616a and the protective film 660, such as into voids 650 within the vias 303 and gaps 651 between the interior walls of the cavities 305 and the dies 626. Accordingly, the semiconductor dies 626 become at least partially embedded within the material of the insulating film 616a and the substrate 302, as depicted in FIG. 6D.

In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to substrate 302 and insulating film 616a for a period between about 5 seconds and about 1.5 minutes. For example, the lamination process is performed at a pressure of between about 5 psig and about 40 psig and a temperature of between about 100° C. and about 120° C. for a period between about 10 seconds and about 1 minute. For example, the lamination process is performed at a temperature of about 110° C. for a period of about 20 seconds.

Figure 6E:
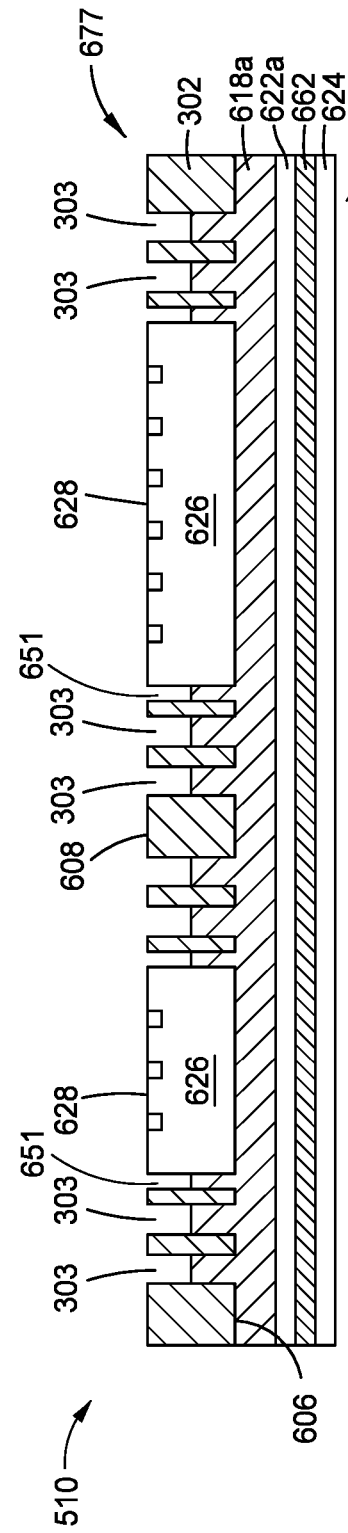

At operation 510, the protective film 660 is removed and the substrate 302, now having the laminated insulating material of the flowable layer 618a at least partially surrounding the substrate 302 and the one or more dies 626, is coupled to a second protective film 662. As depicted in FIG. 6E, the second protective film 662 is coupled to the first side 675 of the substrate 302 such that the second protective film 662 is disposed against (e.g., adjacent) the protective layer 622a of the insulating film 616a. In some embodiments, the substrate 302 now coupled to the protective film 662, may be optionally placed on the carrier 624 for additional mechanical support on the first side 675. In some embodiments, the protective film 662 is placed on the carrier 624 prior to coupling the protective film 662 with the substrate 302, now laminated with the insulating film 616a. Generally, the protective film 662 is substantially similar in composition to the protective film 660. For example, the protective film 662 may be formed of PET, such as biaxial PET. However, the protective film 662 may be formed of any suitable protective materials. In some embodiments, the protective film 662 has a thickness between about 50 μm and about 150 μm.

Figure 6F:
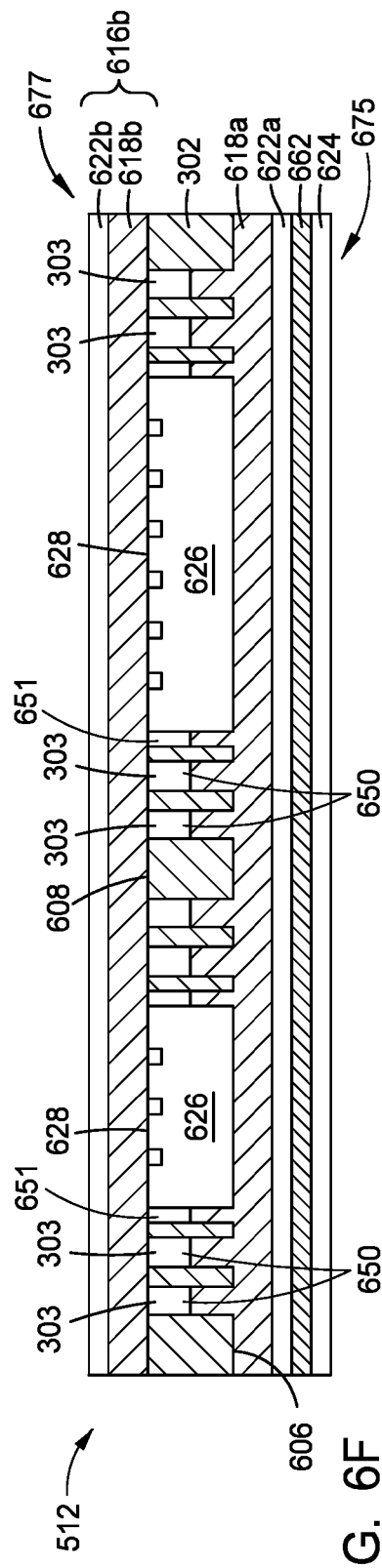

Upon coupling the substrate 302 to the second protective film 662, a second insulating film 616b substantially similar to the first insulating film 616a is placed on the second side 677 of the substrate 302 at operation 512 and FIG. 6F, thus replacing the protective film 660. In certain embodiments, the second insulating film 616b is positioned on the second side 677 of the substrate 302 such that a flowable layer 618b of the second insulating film 616b contacts and covers the active surface 628 of the dies 626 within the cavities 305. In certain embodiments, the placement of the second insulating film 616b on the substrate 302 may form one or more voids 650 and gaps 651 between the insulating film 616b and the already-laminated insulating material of the flowable layer 618a partially surrounding the one or more dies 626. The second insulating film 616b may include one or more layers formed of polymer-based dielectric materials. As depicted in FIG. 6F, the second insulating film 616b includes a flowable layer 618b, which is similar to the flowable layer 618a described above. The second insulating film 616b may further include a protective layer 622b formed of similar materials to the protective layer 622a, such as PET.

Figure 6G:
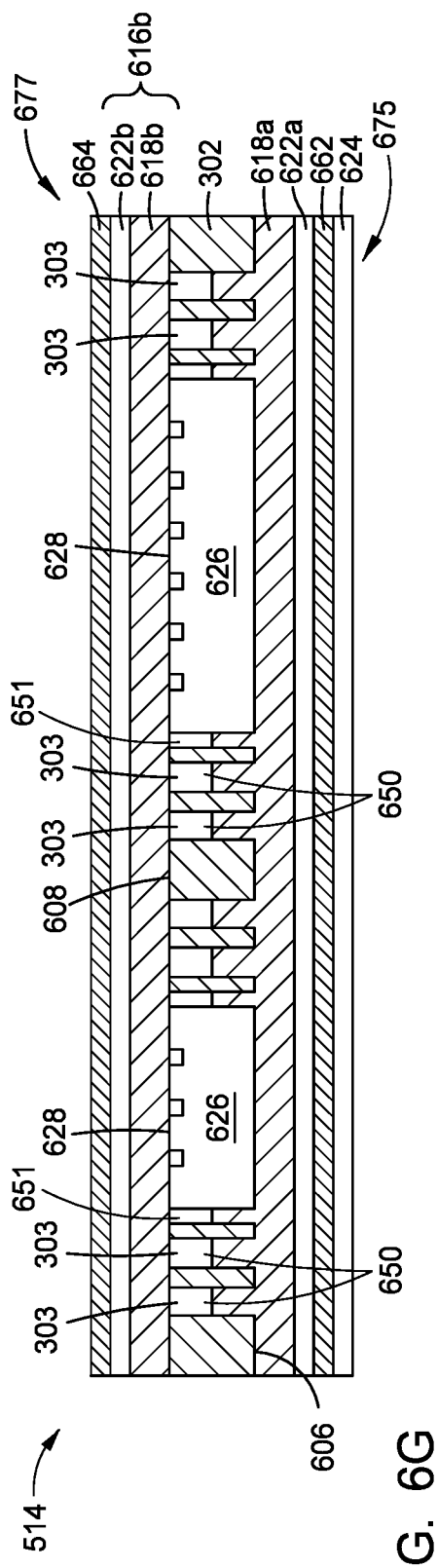

At operation 514, a third protective film 664 is placed over the second insulating film 616b, as depicted in FIG. 6G. Generally, the protective film 664 is substantially similar in composition to the protective films 660, 662. For example, the protective film 664 is formed of PET, such as biaxial PET. However, the protective film 664 may be formed of any suitable protective materials. In some embodiments, the protective film 664 has a thickness between about 50 μm and about 150 μm.

Figure 6H:
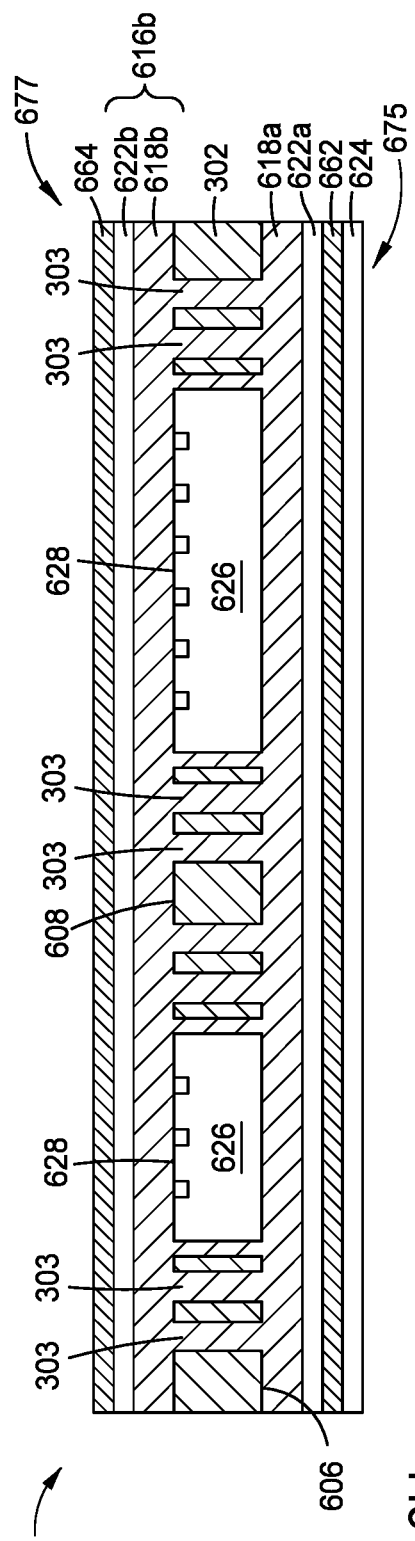

The substrate 302, now affixed to the insulating film 616b and protective layer 664 on the second side 677 and the protective film 662 and optional carrier 624 on the first side 675, is exposed to a second lamination process at operation 516 and FIG. 6H. Similar to the lamination process at operation 508, the substrate 302 is exposed to elevated temperatures, causing the flowable layer 618b of the insulating film 616b to soften and flow into the voids 650 and gaps 651 between the insulating film 616b and the already-laminated insulating material of the flowable layer 618a, thus integrating itself with the insulating material of the flowable layer 618a. Accordingly, the cavities 305 and the vias 303 become filled (e.g., packed, sealed) with an insulating material, and the semiconductor dies 626 previously placed within the cavities 305 become entirely embedded within the insulating material of the flowable layers 618a, 618b.

In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 1 minute and about 30 minutes. In some embodiments, the lamination process includes the application of a pressure of between about 10 psig and about 150 psig while a temperature of between about 80° C. and about 140° C. is applied to substrate 302 and insulting film 616b for a period between about 1 minute and about 30 minutes. For example, the lamination process is performed at a pressure of between about 20 psig and about 100 psig, a temperature of between about 100° C. and about 120° C. for a period between about 2 minutes and 10 minutes. For example, the lamination process is performed at a temperature of about 110° C. for a period of about 5 minutes. Please note, the lamination process at operations 508 and 516 may be performed on a single substrate or a batch thereof as desired.

After lamination, the substrate 302 is disengaged from the carrier 624 and the protective films 662, 664 are removed at operation 518, resulting in a laminated die-embedded assembly 602. As depicted in FIG. 6I, the die-embedded assembly 602 includes the substrate 302 having one or more cavities 305 and/or vias 303 formed therein and filled with the insulating dielectric material of the flowable layers 618a, 618b, in addition to the dies 626 embedded within the cavities 305. The insulating dielectric material of the flowable layers 618a, 618b encases the substrate 302 such that the insulating material covers at least two surfaces or sides of the substrate 302, such as major surfaces 606, 608, and covers all sides of the embedded semiconductor dies 626. In some examples, the protective layers 622a, 622b are also removed from the die-embedded assembly 602 at operation 518. Generally, the protective layers 622a and 622b, the carrier 624, and the protective films 662 and 664 are removed from the die-embedded assembly 602 by any suitable mechanical processes, such as peeling therefrom.

Upon removal of the protective layers 622a, 622b and the protective films 662, 664, the die-embedded assembly 602 is exposed to a cure process to fully cure (i.e., harden through chemical reactions and cross-linking) the insulating dielectric material of the flowable layers 618a, 618b, thus forming a cured insulating layer 619. The insulating layer 619 substantially surrounds the substrate 302 and the semiconductor dies 626 embedded therein. For example, the insulating layer 619 contacts or encapsulates at least the sides 675, 677 of the substrate 302 (including surfaces 606, 608), and at least six sides or surfaces of each semiconductor die 626, which have rectangular prism shapes as illustrated in FIG. 6I.

In certain embodiments, the cure process is performed at high temperatures to fully cure the insulating layer 619. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180 QC for a period of about 30 minutes. In further embodiments, the cure process at operation 518 is performed at or near ambient (e.g., atmospheric) pressure conditions.

After curing, one or more through-assembly vias 603 are drilled through the die-embedded assembly 602 at operation 520, forming channels through the entire thickness of the die-embedded assembly 602 for subsequent interconnection formation. In some embodiments, the die-embedded assembly 602 may be placed on a carrier, such as the carrier 624, for mechanical support during the formation of the through-assembly vias 603 and subsequent contact holes 632. The through-assembly vias 603 are drilled through the vias 303 that were formed in the substrate 302 and subsequently filled with the insulating layer 619. Thus, the through-assembly vias 603 may be surrounded (e.g., circumferentially) by the insulating layer 619 filled within the vias 303. By having the polymer-based dielectric material of the insulating layer 619 (e.g., a ceramic-filler-containing epoxy resin material) line the walls of the vias 303, capacitive coupling between the conductive silicon-based substrate 302 and interconnections 844 (described with reference to FIG. 7 and FIGS. 8E-8K), and thus capacitive coupling between adjacently positioned vias 303 and/or redistribution connections 844 (described with reference to FIG. 9 and FIGS. 10H-10K), in a completed package is significantly reduced as compared to other conventional interconnecting structures that utilize conventional via insulating liners or films. Furthermore, the flowable nature of the epoxy resin material enables more consistent and reliable encapsulation and insulation, thus enhancing electrical performance by minimizing leakage current of the package.

In certain embodiments, the through-assembly vias 603 have a diameter of less than about 100 μm, such as less than about 75 μm. For example, the through-assembly vias 603 have a diameter of less than about 60 μm, such as less than about 50 μm. In certain embodiments, the through-assembly vias 603 have a diameter of between about 25 μm and about 50 μm, such as a diameter of between about 35 μm and about 40 μm. In certain embodiments, the through assembly vias 603 are formed using any suitable mechanical process. For example, the through-assembly vias 603 are formed using a mechanical drilling process. In certain embodiments, through-assembly vias 603 are formed through the die-embedded assembly 602 by laser ablation. For example, the through-assembly vias 603 are formed using an ultraviolet laser. In certain embodiments, the laser source utilized for laser ablation has a frequency between about 5 kHz and about 500 kHz. In certain embodiments, the laser source is configured to deliver a pulsed laser beam at a pulse duration between about 10 ns and about 100 ns with a pulse energy of between about 50 microjoules (μJ) and about 500 μJ. Utilizing an epoxy resin material having small ceramic filler particles for the insulating layer 619 promotes more precise and accurate laser patterning of small-diameter vias, such as the vias 603, as the small ceramic filler particles therein exhibit reduced laser light reflection, scattering, diffraction, and transmission of the laser light away from the area in which the via is to be formed during the laser ablation process.

At operation 522 and FIG. 6K, one or more contact holes 632 are drilled through the insulating layer 619 to expose one or more contacts 630 formed on the active surface 628 of each embedded semiconductor die 626. The contact holes 632 are drilled through the insulating layer 619 by laser ablation, leaving all external surfaces of the semiconductor dies 626 covered and surrounded by the insulating layer 619 and the contacts 630 exposed. Thus, the contacts 630 are exposed by the formation of the contact holes 632. In certain embodiments, the laser source may generate a pulsed laser beam having a frequency between about 100 kHz and about 1000 kHz. In certain embodiments, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ. In certain embodiments, the contact holes 632 are drilled using a $CO_2$, green, or UV laser. In certain embodiments, the contact holes 632 have a diameter of between about 5 µm and about 60 µm, such as a diameter of between about 20 µm and about 50 µm.

After the formation of the contact holes 632, the die-embedded assembly 602 is exposed to a de-smear process at operation 522 to remove any unwanted residues and/or debris caused by laser ablation during the formation of the through-assembly vias 603 and the contact holes 632. The de-smear process thus cleans the through-assembly vias 603 and contact holes 632 and fully exposes the contacts 630 on the active surfaces 628 of the embedded semiconductor die 626 for subsequent metallization. In certain embodiments, the de-smear process is a wet de-smear process. Any suitable aqueous etchants, solvents, and/or combinations thereof may be utilized for the wet de-smear process. In some examples, a potassium permanganate ($KMnO_4$) solution may be utilized as an etchant. Depending on the residue thickness, exposure of the die-embedded assembly 602 to the wet de-smear process at operation 522 may be varied. In other embodiments, the de-smear process is a dry de-smear process. For example, the de-smear process may be a plasma de-smear process with an $O_2$:$CF_4$ mixture gas. The plasma de-smear process may include generating a plasma by applying a power of about 700 W and flowing $O_2$:$CF_4$ at a ratio of about 10:1 (e.g., 100:10 sccm) for a time period between about 60 seconds and about 120 seconds. In further embodiments, the de-smear process is a combination of wet and dry processes.

Figure 7:
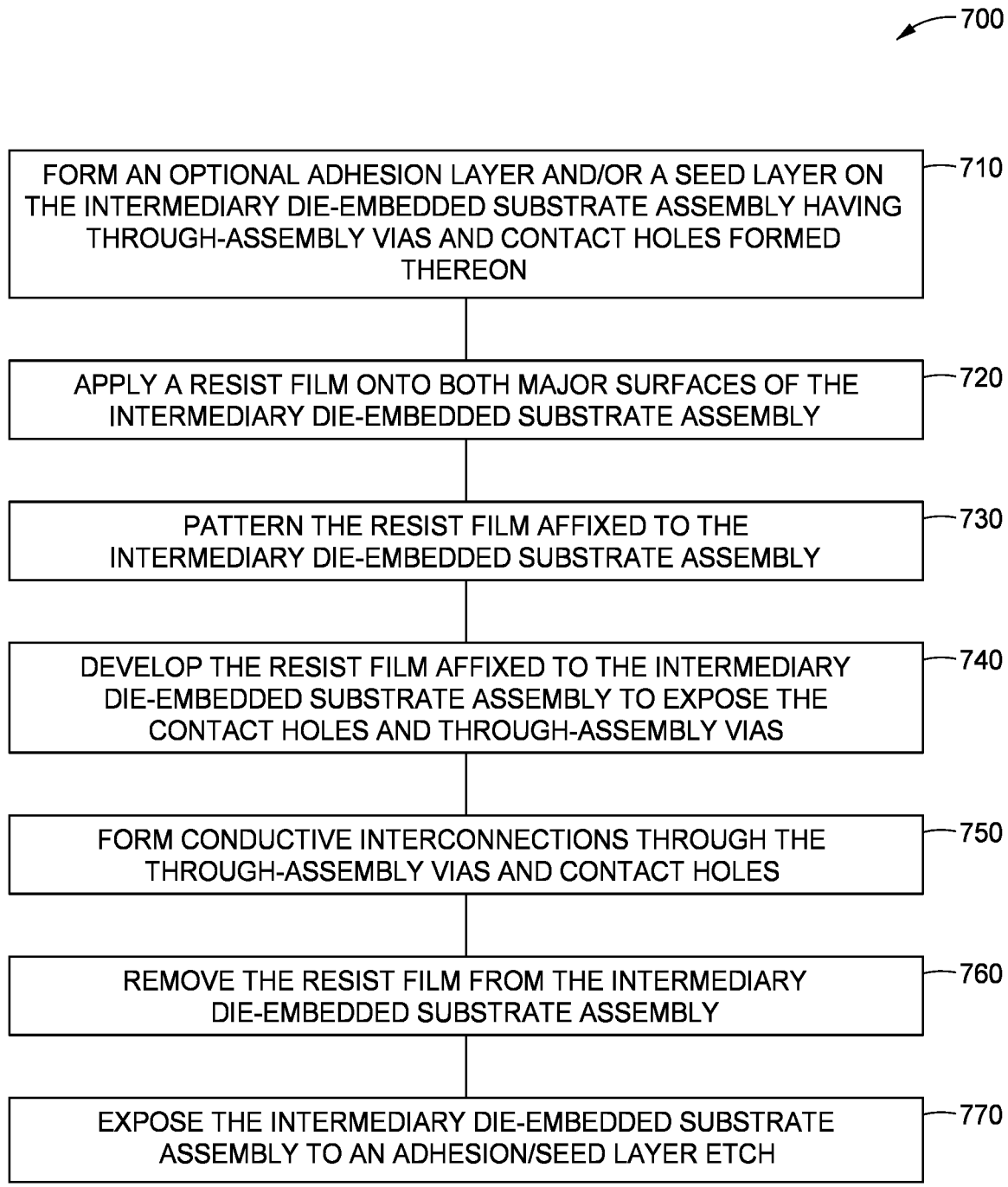
FIG. 7 illustrates a flow diagram of a process for forming interconnections in an intermediary die-embedded substrate assembly, according to embodiments described herein.

FIG. 7 illustrates a flow diagram of a representative method 700 of forming electrical interconnections through the die-embedded assembly 602, according to embodiments of the present disclosure. FIGS. 8A-8K schematically illustrate cross-sectional views of the die-embedded assembly 602 at different stages of the process of the method 700 depicted in FIG. 7. Thus, FIG. 7 and FIGS. 8A-8K are herein described together for clarity.

In certain embodiments, the electrical interconnections formed through the die-embedded assembly 602, whether for signal transmission or for EMI shielding, are formed of copper. Thus, the method 700 may optionally begin at operation 710 and FIG. 8A wherein the die-embedded assembly 602, having through-assembly vias 603 and contact holes 632 formed therein, has an adhesion layer 840 and/or a seed layer 842 formed thereon. An enlarged partial view of the adhesion layer 840 and the seed layer 842 formed on the die-embedded assembly 602 is depicted in FIG. 8H for reference. The adhesion layer 840 may be formed on desired surfaces of the insulating layer 619, such as major surfaces 805, 807 of the die-embedded assembly 602, as well as on the active surfaces 628 within the contact holes 632 on each semiconductor die 626 and interior walls of the through-assembly vias 603, to assist in promoting adhesion and blocking diffusion of the subsequently formed seed layer 842 and copper interconnections 844. Thus, in certain embodiments, the adhesion layer 840 acts as an adhesion layer; in other embodiments, the adhesion layer 840 acts as a barrier layer. In both embodiments, however, the adhesion layer 840 will be hereinafter described as an "adhesion layer."

In certain embodiments, the optional adhesion layer 840 is formed of titanium, titanium nitride, tantalum, tantalum nitride, manganese, manganese oxide, molybdenum, cobalt oxide, cobalt nitride, or any other suitable materials or combinations thereof. In certain embodiments, the adhesion layer 840 has a thickness of between about 10 nm and about 300 nm, such as between about 50 nm and about 150 nm. For example, the adhesion layer 840 has a thickness between about 75 nm and about 125 nm, such as about 100 nm. The adhesion layer 840 is formed by any suitable deposition process, including but not limited to chemical vapor deposition (CVD), physical vapor deposition (PVD), plasma enhanced CVD (PECVD), atomic layer deposition (ALD), or the like.

The optional seed layer 842 may be formed on the adhesion layer 840 or directly on the insulating layer 619 (e.g., without the formation of the adhesion layer 840). The seed layer 842 is formed of a conductive material such as copper, tungsten, aluminum, silver, gold, or any other suitable materials or combinations thereof. Where the seed layer 842 and subsequently plated interconnections 844 are formed of the same conductive material, the seed layer 842 and the interconnections 844 may have different grain sizes. For example, the seed layer 842, when deposited electrolessly and when composed of copper, typically has a grain size between 20 nm and 100 nm. The electrodeposited copper interconnection 844 typically has a larger grain size of the order of 100 nm-5 um. When the seed layer 842 is deposited by sputtering (PVD), then the grain size is also smaller than the electroplated copper interconnection 844 formed thereon. In the case of PVD (sputtering), the grain size in the seed layer 842 is also of the order of 20 nm to 100 nm.

In certain embodiments, the seed layer 842 has a thickness between about 50 nm and about 500 nm, such as between about 100 nm and about 300 nm. For example, the seed layer 842 has a thickness between about 150 nm and about 250 nm, such as about 200 nm. In certain embodiments, the seed layer 842 has a thickness of between about 0.1 µm and about 1.5 µm. Similar to the adhesion layer 840, the seed layer 842 is formed by any suitable deposition process, such as CVD, PVD, PECVD, ALD dry processes, wet electroless plating processes, or the like. In certain embodiments, a molybdenum adhesion layer 840 is formed on the die-embedded assembly in combination with a seed layer 842 formed of copper. The Mo—Cu adhesion and seed layer combination enables improved adhesion with the surfaces of the insulating layer 619 and reduces undercut of conductive interconnect lines during a subsequent seed layer etch process at operation 770.

At operations 720 and 730, corresponding to FIGS. 8B and 8C, respectively, a spin-on/spray-on or dry resist film 850, such as a photoresist, is applied on both major surfaces 805, 807 of the die-embedded assembly 602 and is subsequently patterned. In certain embodiments, the resist film 850 is patterned via selective exposure to UV radiation. In certain embodiments, an adhesion promoter (not shown) is applied to the die-embedded assembly 602 prior to formation of the resist film 850. The adhesion promoter improves adhesion of the resist film 850 to the die-embedded assembly 602 by producing an interfacial bonding layer for the resist film 850 and by removing any moisture from the surface of the die-embedded assembly 602. In some embodiments, the adhesion promoter is formed of bis(trimethylsilyl)amine or hexamethyldisilazane (HMDS) and propylene glycol monomethyl ether acetate (PGMEA).

At operation 740 and FIG. 8D, the die-embedded assembly 602 is exposed to resist film development, ashing, and descum processes. In certain embodiments, the descum process is an oxygen plasma treatment for removal of any residual organic resist residues. As depicted in FIG. 8D, the development of the resist film 850 results in exposure of the through-assembly vias 603 and contact holes 632, now having an adhesion layer 840 and a seed layer 842 formed thereon. In certain embodiments, the film development process is a wet process, such as a wet process that includes exposing the resist to a solvent. In certain embodiments, the film development process is a wet etch process utilizing an aqueous etch process. In other embodiments, the film development process is a wet etch process utilizing a buffered etch process selective for a desired material. Any suitable wet solvents or combination of wet etchants may be used for the resist film development process.

At operations 750 and 760, corresponding to FIGS. 8E and 8F respectively, interconnections 844 are formed on exposed surfaces of the die-embedded assembly 602, such as through the exposed through-assembly vias 603 and contact holes 632, and the resist film 850 is thereafter removed. The interconnections 844 are formed by any suitable methods including electroplating and electroless deposition. In certain embodiments, the resist film 850 is removed via a wet process. As depicted in FIGS. 8E and 8F, the formed interconnections 844 completely fill the through-assembly vias 603 and contact holes 632 or only cover inner walls thereof and protrude from the surfaces 805, 807 of the die-embedded assembly 602 upon removal of the resist film 850. For example, in embodiments where the vias 303 and/or through-assembly vias 603 are cylindrical, the interconnections 844 may line the inner circumferential walls of the through-assembly vias 603 and have hollow cores. In certain embodiments, the interconnections 844 are formed of copper. In other embodiments, the interconnections 844 may be formed of any suitable conductive material including but not limited to aluminum, gold, nickel, silver, palladium, tin, or the like.

In some embodiments, the interconnections 844 include lateral trace (e.g., line or pad) regions for electrical connection of the interconnections 844 with other electrical contacts or devices, such as redistribution connections 844 described below. The lateral trace regions can include a portion of the conductive layer formed in operation 750 and will typically extend across a portion of the major surfaces 807 or 805 of the die-embedded assembly 602.

At operation 770 and FIG. 8G, the die-embedded assembly 602 having interconnections 844 formed therein is exposed to an adhesion and/or seed layer etch process to remove the adhesion layer 840 and the seed layer 842, thus resulting in the formation of a single layer 2D wafer-size package panel 800 (hereinafter "package panel 800"). In certain embodiments, the seed layer etch is a wet etch process including a rinse and drying of the die-embedded assembly 602. In certain embodiments, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Figure 8I:
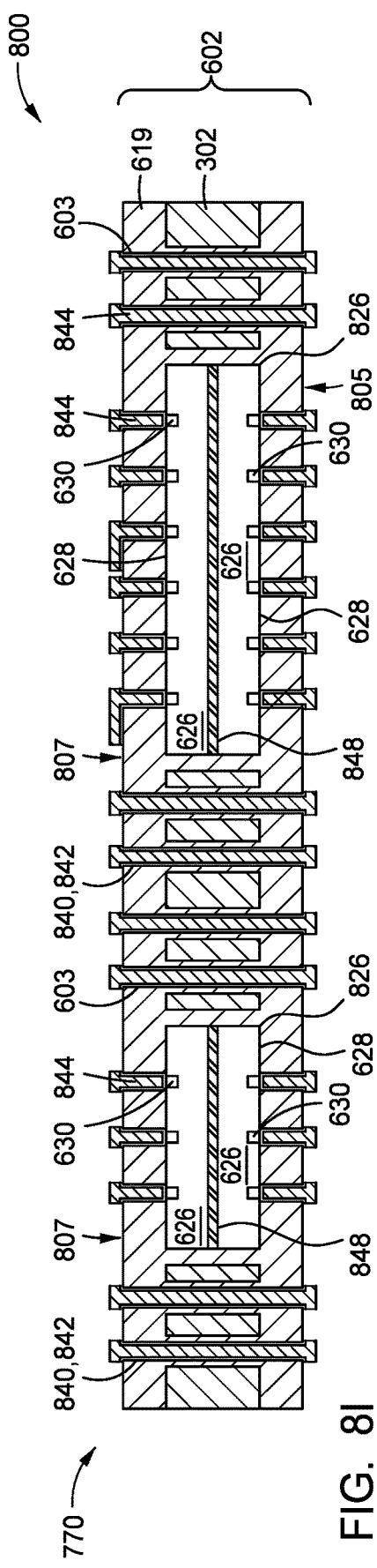
Figure 8J:
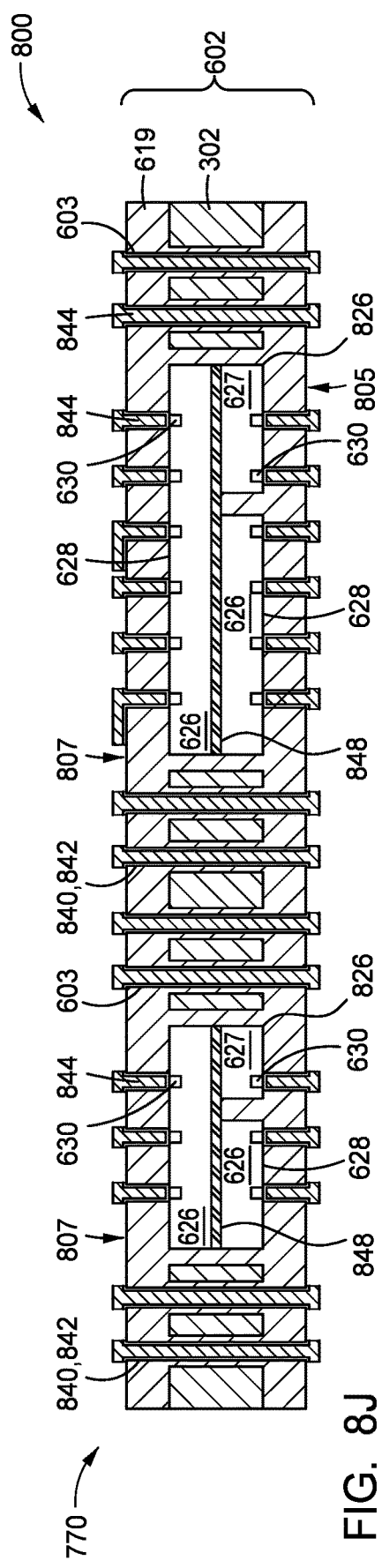

FIGS. 8I and 8J depict additional exemplary arrangements of dies within the package panel 800 (e.g., and thus, subsequently completed individual packages) that can be formed utilizing the methods described with reference to FIGS. 1-8H above, according to certain embodiments. The packaging schemes depicted in FIGS. 8I and 8J are particularly beneficial for memory die stacking, as they reduce the amount of operations for stacking a desired number of memory dies (e.g., stacking eight memory dies to form a "byte" can now be done by stacking of four packages or reconstituted substrates).

As shown, the package panel 800 includes two semiconductor dies 626 stacked backside-to-backside in a die stack 826 within each cavity 305, wherein the backsides of the semiconductor dies 626 are coupled to one another by an adhesive layer 848. Accordingly, active sides 628 of the stacked semiconductor dies 626 face opposite sides of the package panel 800 and have interconnections 844 extending in opposite directions therefrom. In certain embodiments, the stacked semiconductor dies 626 are of the same type and/or have substantially the same lateral dimensions, as shown in FIG. 8I. In certain other embodiments, the stacked semiconductor dies 626 are of different types and/or have different lateral dimensions, shown in FIG. 8J. In such embodiments, a dummy die 627 may be placed alongside the semiconductor die 626 having the smaller lateral dimension to ensure substantially similar overall dimensions of each layer of the die stack 826. The adhesive layer 848 utilized to couple the backsides of the semiconductor dies 626 may be any suitable type of adhesive, such as a laminated adhesive material, die attach film, glue, or the like. It should be noted, however, that although the adhesive layer 848 is depicted in 8I-8K, the dies 626, 627 can be stacked without the use of an adhesive. For example, the dies 626, 627 can be stacked such that the backsides or any other surfaces of the dies are in contact with each other.

Figure 8K:
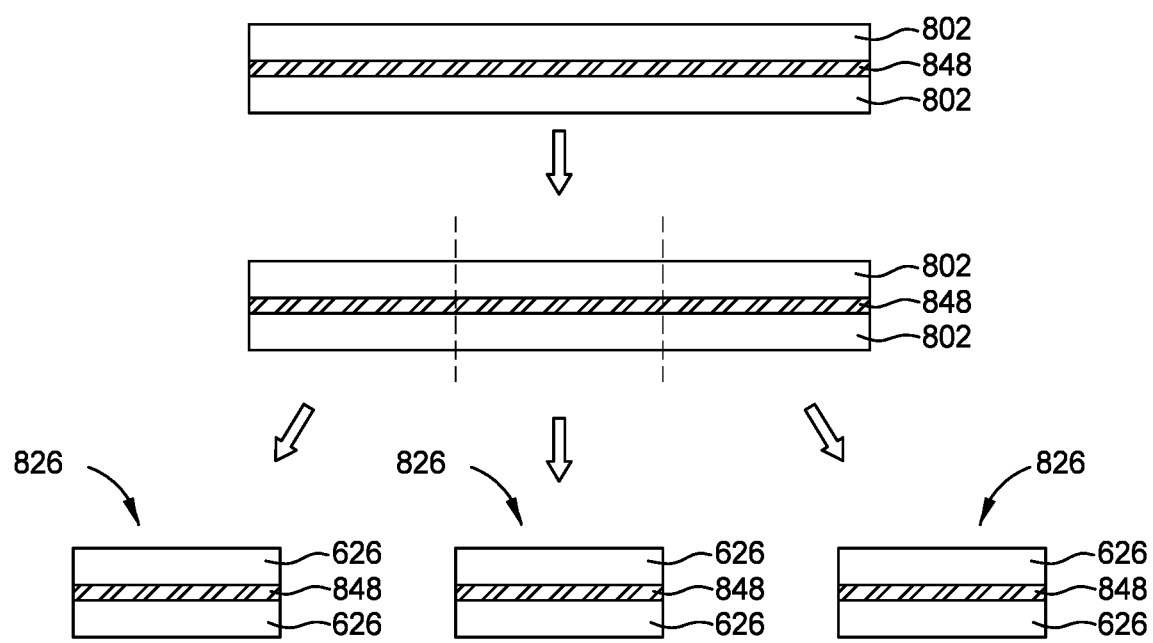

To form the arrangements depicted in FIGS. 8I and 8J, the semiconductor dies 626 can be attached to each other prior to placement of the die stack 826 within cavities 305 of the substrate 302. An exemplary process flow for forming the die stack 826 is shown in FIG. 8K. As depicted, backsides of two die substrates 802 (e.g., DRAM substrates) are aligned and bonded to each other using the adhesive layer 848. In certain embodiments, the die substrates 802 may be thinned before or after bonding, depending on the desired thickness of the die stack 826. The die substrates 802 are then singulated into individual die stacks 826, which may be placed within cavities 305 of the substrate 302 and encapsulated within the insulating layer 619, as described with reference to method 500. Thereafter, interconnections and/or redistribution layers may be formed according to any of the operations described herein (e.g., methods 700 and 1000), substantially similar to examples wherein a single semiconductor die 626 or side-by-side semiconductor dies 626 are embedded within a cavity 305 of the substrate 302.

In certain embodiments, the package panel 800 may further have one or more redistribution layers 1058, 1060

Figure 9:
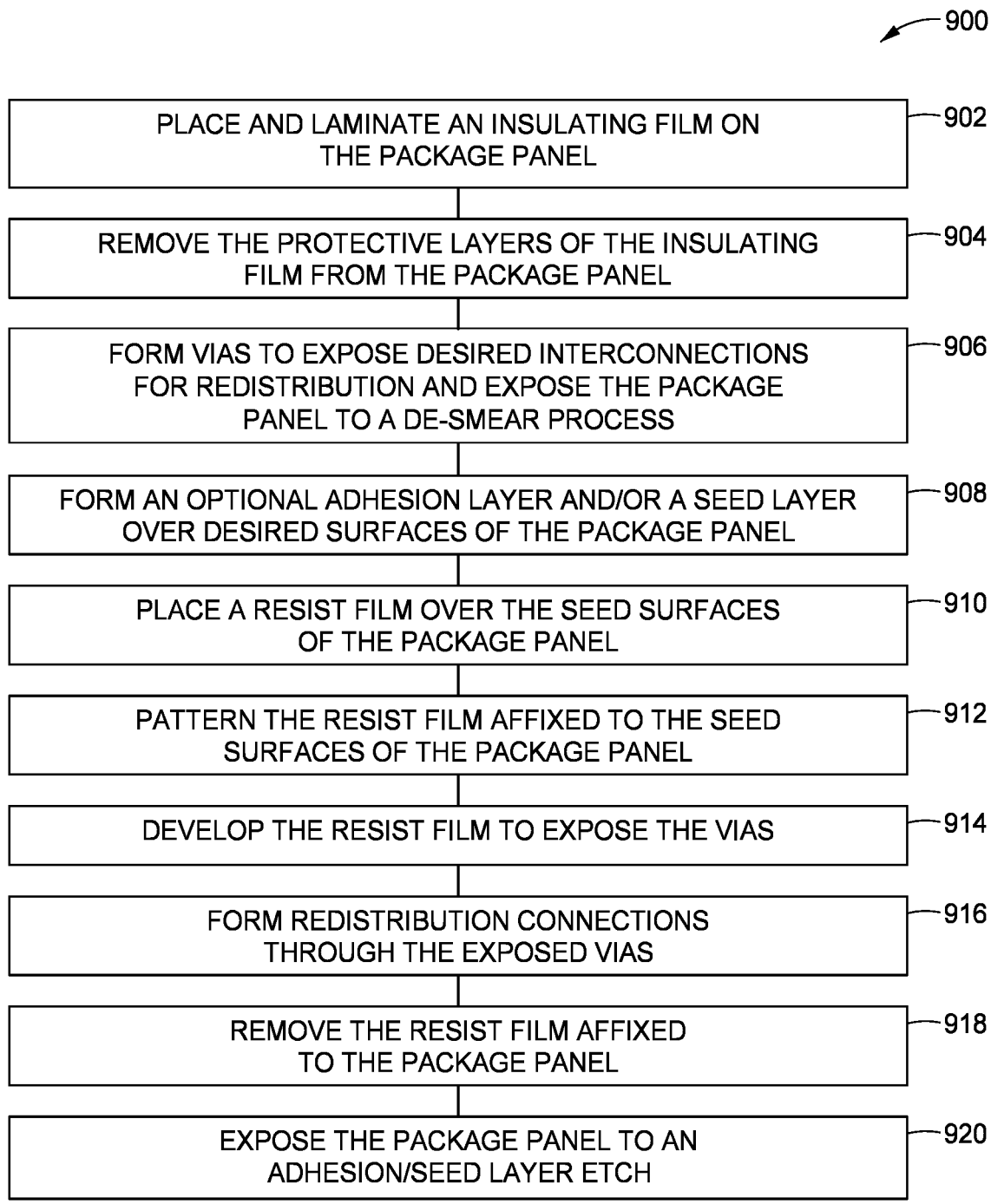
FIG. 9 illustrates a flow diagram of a process for forming a redistribution layer on an intermediary die-embedded substrate assembly, according to embodiments described herein.

(shown in FIG. 10K) formed thereon as needed to enable rerouting and/or extension of contact points of the interconnections 844 to desired locations on the surfaces of the package panel 800. FIG. 9 illustrates a flow diagram of a representative method 900 of forming a redistribution layer 1058 on the package panel 800, according to embodiments of the present disclosure. FIGS. 10A-10K schematically illustrate cross-sectional views of the package panel 800 at different stages of the method 900, depicted in FIG. 9. Thus, FIG. 9 and FIGS. 10A-10K are herein described together for clarity.

The method 900 is substantially similar to the methods 500 and 700 described above. Generally, the method 900 begins at operation 902 and FIG. 10A, wherein an insulating film 1016 is placed on the package panel 800, already having the insulating layer 619 formed thereon, and thereafter laminated. The insulating film 1016 may be substantially similar to the insulating films 616 and may include one or more flowable layers 1018 formed of polymer-based dielectric materials and one or more protective layers 1022 formed of PET.

In certain embodiments, the flowable layer 1018 includes an epoxy resin material, such as a ceramic-filler-containing epoxy resin material. In other embodiments, the flowable layer 1018 includes a photodefinable polyimide material. The material properties of photodefinable polyimide enable the formation of smaller (e.g., narrower) vias through the resulting interconnect redistribution layer formed from the insulating film 1016. However, any suitable combination of flowable layers 1018 and insulating materials is contemplated for the insulating film 1016. For example, the insulating film 1016 may include one or more flowable layers 1018 including a non-photosensitive polyimide material, a polybenzoxazole (PBO) material, a silicon dioxide material, and/or a silicon nitride material.

In certain embodiments, material of the flowable layer 1018 is different from the flowable layers 618 of the insulating films 616. In certain embodiments, the flowable layer 1018 includes a different inorganic dielectric material from the flowable layers 618. In some examples, the flowable layers 618 includes a ceramic-filler-containing epoxy resin material and the flowable layer 1018 includes a photodefinable polyimide material. In other examples, the flowable layers 618 may include a ceramic-filler-containing epoxy resin material and the flowable layer 1018 may include a silicon dioxide material.

The insulating film 1016 has a total thickness of less than about 120 μm, such as between about 40 μm and about 100 μm. For example, the insulating film 1016 including the flowable layer 1018 and the protective layer 1022 has a total thickness of between about 50 μm and about 90 μm. In certain embodiments, the flowable layer 1018 has a thickness of less than about 60 μm, such as a thickness between about 5 μm and about 50 μm, such as a thickness of about 20 μm. The insulating film 1016 is placed on a surface of the package panel 800 having exposed interconnections 844 that are coupled to the contacts 630 on the active surface 628 of semiconductor dies 626 and/or coupled to the metallized through-assembly vias 603, such as the major surface 807.

After placement of the insulating film 1016, the package panel 800 is exposed to a lamination process substantially similar to the lamination process described with reference to operations 508 and 516. The package panel 800 is exposed to elevated temperatures to soften the flowable layer 1018, which subsequently bonds to the insulating layer 619 already formed on the package panel 800. Thus, the flowable layer 1018 becomes integrated with the insulating layer 619 and forms an extension thereof, resulting in an expanded insulating layer 619 that covers the previously exposed interconnections 844. Accordingly, the bonded flowable layer 1018 and the insulating layer 619 will herein be jointly described as the insulating layer 619. In other embodiments, however, the lamination and subsequent curing of the flowable layer 1018 forms a second insulating layer (not shown) on the insulating layer 619. In such examples, the second insulating layer is formed of a different material layer than the insulating layer 619.

In certain embodiments, the lamination process at operation 902 is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 1 minute and about 30 minutes. In some embodiments, the lamination process includes the application of a pressure of between 10 psig and about 100 psig while a temperature of between about 80° C. and about 140° C. is applied to the substrate 302 and insulating film 1016 for a period between about 1 minute and about 30 minutes. For example, the lamination process is performed at a pressure of between about 30 psig and about 80 psig and a temperature of between about 100° C. and about 120 QC for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig. Please note, the lamination process at operation 902 may be performed on a single package panel or a batch thereof as desired.

Figure 10A:
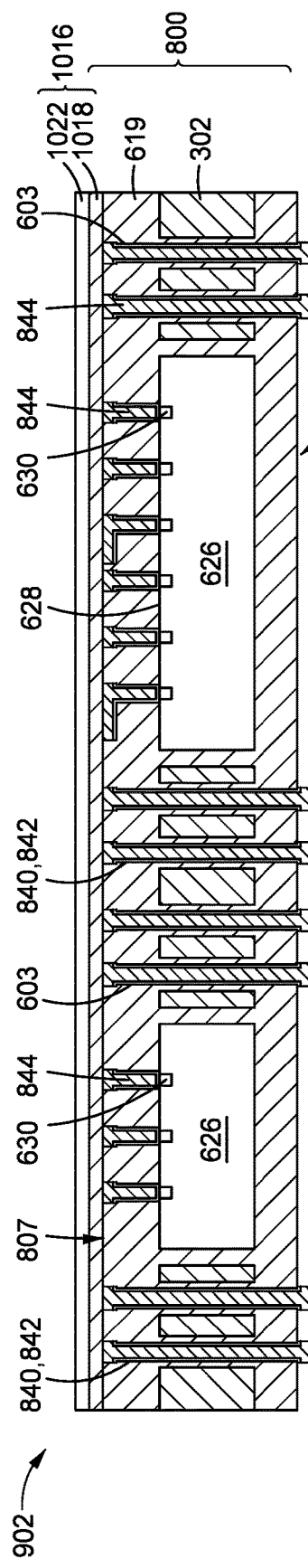
Figure 10B:
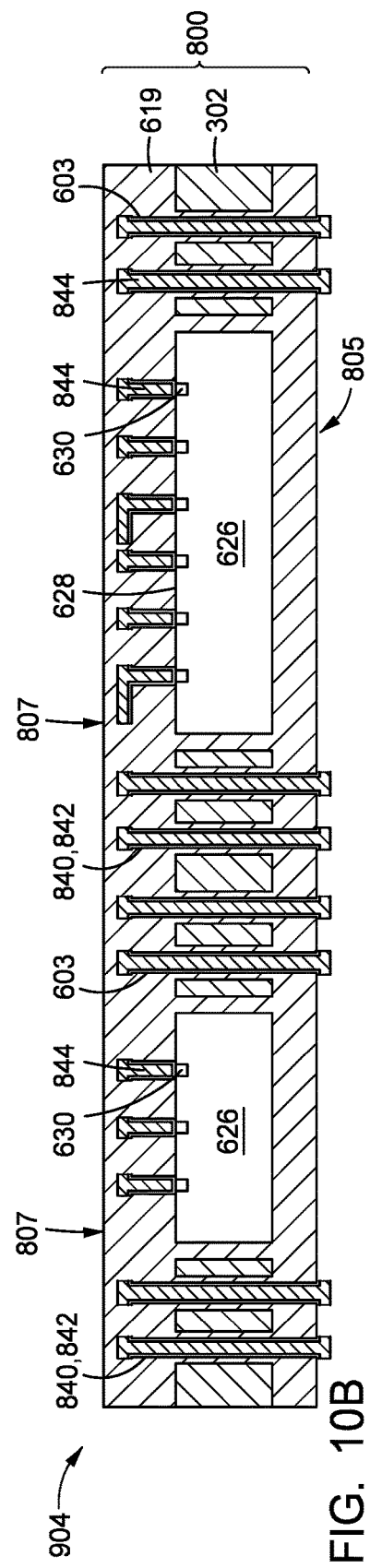

At operation 904 and FIG. 10B, the protective layer 1022 is removed from the package panel 800 by mechanical processes, upon which the package panel 800 is exposed to a cure process to fully cure the newly expanded insulating layer 619. In certain embodiments, the cure process is substantially similar to the cure process described with reference to operation 518. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 904 is performed at or near ambient pressure conditions.

Figure 10C:
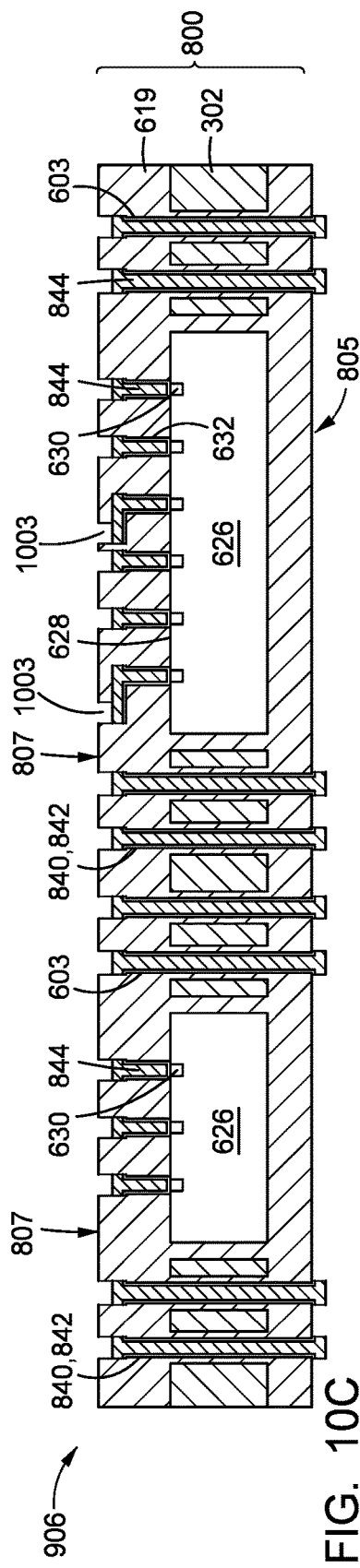

The package panel 800 is then selectively patterned by laser ablation at operation 906 and FIG. 10C. The laser ablation at operation 906 forms redistribution vias 1003 through the newly expanded insulating layer 619 and exposes desired interconnections 844 for redistribution of surface contact points thereof. In certain embodiments, the redistribution vias 1003 have a diameter of between about 5 μm and about 60 μm, such as a diameter of between about 10 μm and about 50 μm, such as between about 20 μm and about 45 μm. In certain embodiments, the laser ablation process at operation 906 is performed utilizing a $CO_2$ laser. In certain embodiments, the laser ablation process at operation 906 is performed utilizing a UV laser. In certain embodiments, the laser ablation process at operation 906 is performed utilizing a green laser. For example, the laser source may generate a pulsed laser beam having a frequency between about 100 kHz and about 1000 kHz. In some examples, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ.

Upon patterning of the package panel 800, the package panel 800 is exposed to a de-smear process at operation 906 substantially similar to the de-smear process at operation 522. During the de-smear process, any unwanted residues and debris formed by laser ablation during the formation of the redistribution vias 1003 are removed to clear (e.g., clean) the surfaces of the vias for subsequent metallization. In certain embodiments, the de-smear process is a wet process. Any suitable aqueous etchants, solvents, and/or combinations thereof may be utilized for the wet de-smear process. In some examples, $KMnO_4$ solution may be utilized as an etchant. In other embodiments, the de-smear process is a dry de-smear process. For example, the de-smear process may be a plasma de-smear process with an $O_2/CF_4$ mixture gas. In further embodiments, the de-smear process is a combination of wet and dry processes.

Figure 10D:
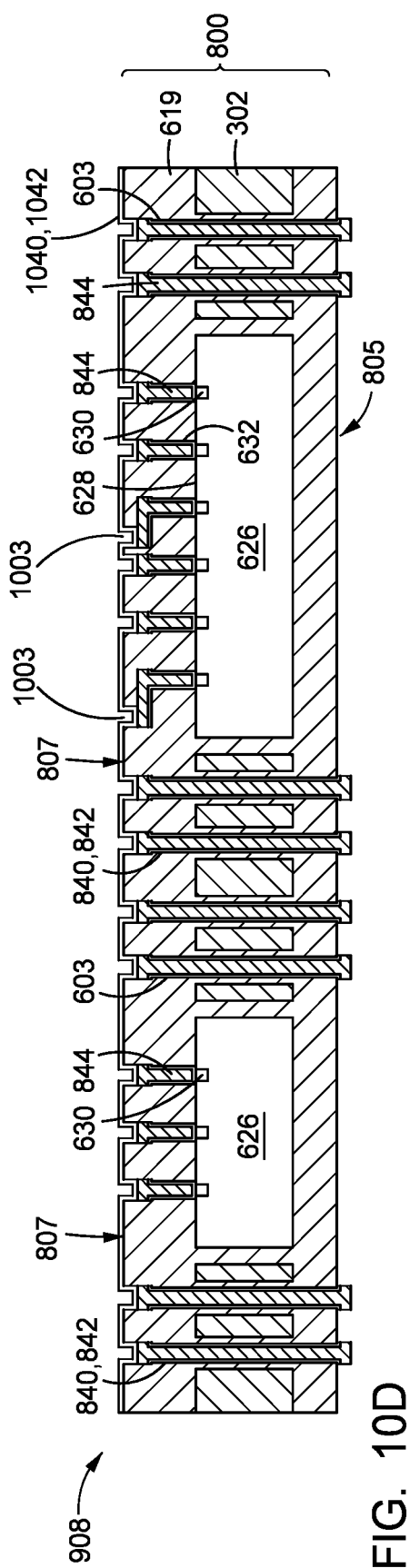

At operation 908 and FIG. 10D, an optional adhesion layer 1040 and/or seed layer 1042 are formed on the insulating layer 619. In certain embodiments, the adhesion layer 1040 is formed from titanium, titanium nitride, tantalum, tantalum nitride, manganese, manganese oxide, molybdenum, cobalt oxide, cobalt nitride, or any other suitable materials or combinations thereof. In certain embodiments, the adhesion layer 1040 has a thickness of between about 10 nm and about 300 nm, such as between about 50 nm and about 150 nm. For example, the adhesion layer 1040 has a thickness between about 75 nm and about 125 nm, such as about 100 nm. The adhesion layer 1040 may be formed by any suitable deposition process, including but not limited to CVD, PVD, PECVD, ALD, or the like.

The optional seed layer 1042 is formed from a conductive material such as copper, tungsten, aluminum, silver, gold, or any other suitable materials or combinations thereof. In certain embodiments, the seed layer 1042 has a thickness between about 50 nm and about 500 nm, such as between about 100 nm and about 300 nm. For example, the seed layer 1042 has a thickness between about 150 nm and about 250 nm, such as about 200 nm. In certain embodiments, the seed layer 1042 has a thickness of between about 0.1 µm and about 1.5 µm. Similar to the adhesion layer 1040, the seed layer 1042 may be formed by any suitable deposition process, such as CVD, PVD, PECVD, ALD dry processes, wet electroless plating processes, or the like. In certain embodiments, a molybdenum adhesion layer 1040 and a copper seed layer 1042 are formed on the package panel 800 to reduce undercut of conductive interconnect lines during a subsequent seed layer etch process at operation 920.

Figure 10E:
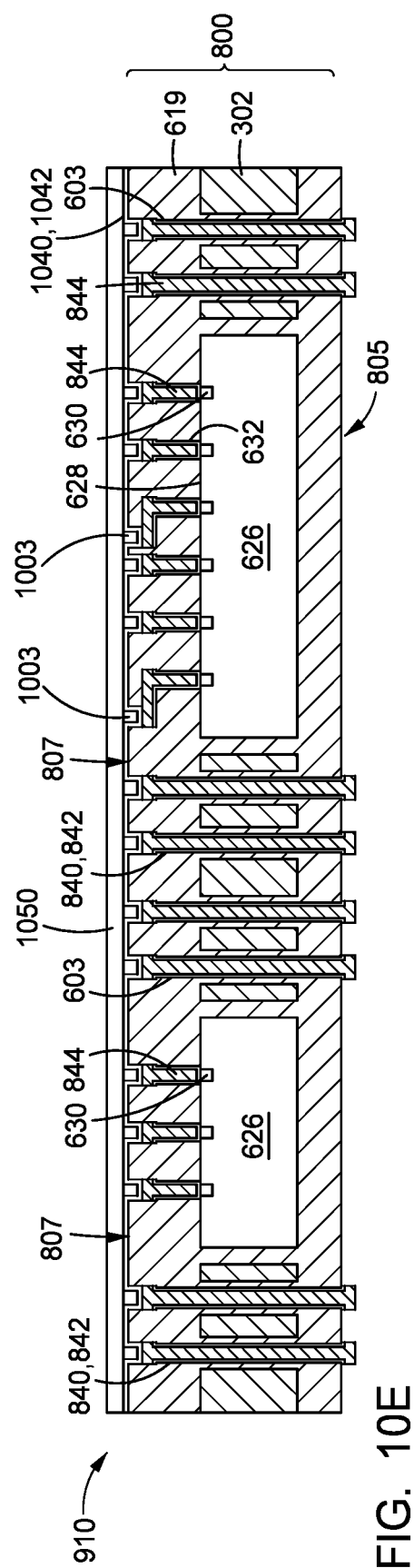
Figure 10F:
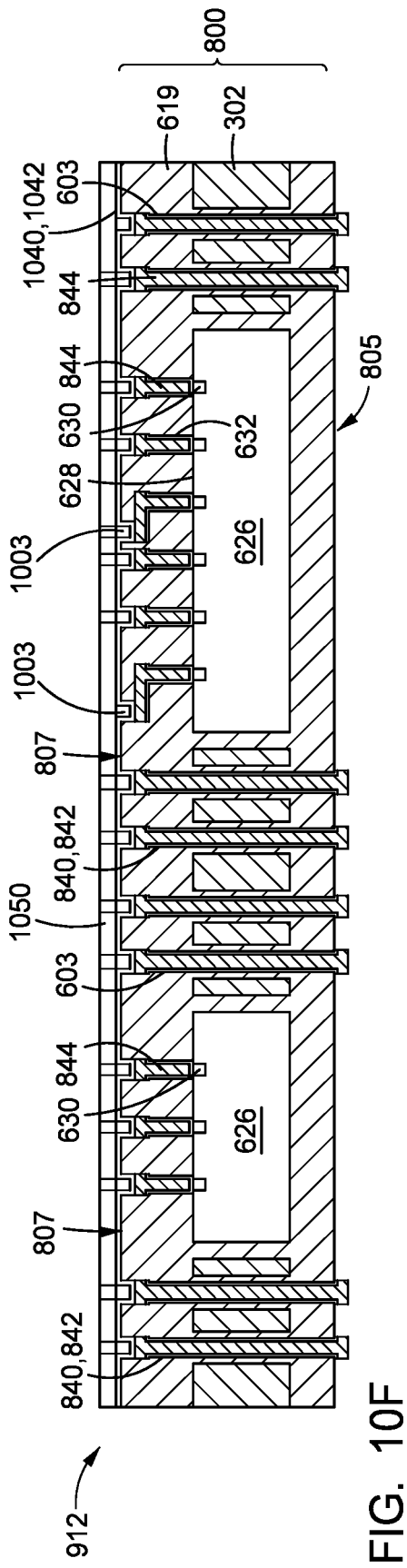
Figure 10G:
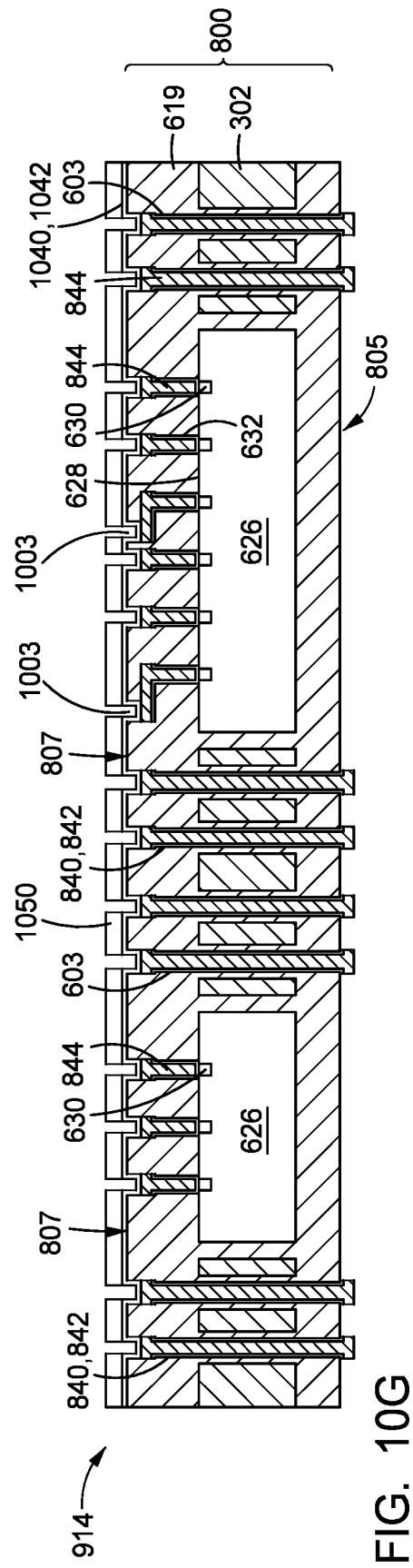

At operations 910, 912, and 914, corresponding to FIGS. 10E, 10F, and 10G respectively, a spin-on/spray-on or dry resist film 1050, such as a photoresist, is applied over the adhesion and/or seed surfaces of the package panel 800 and subsequently patterned and developed. In certain embodiments, an adhesion promoter (not shown) is applied to the package panel 800 prior to placement of the resist film 1050. The exposure and development of the resist film 1050 results in the opening of the redistribution vias 1003 and exposure of the insulating layer 619, adhesion layer 1040, or copper seed layer 1042 for formation of redistribution connections 1044 thereon. Thus, patterning of the resist film 1050 may be performed by selectively exposing portions of the resist film 1050 to UV radiation and subsequent development of the resist film 1050 by a wet process, such as a wet etch process. In certain embodiments, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

At operations 916 and 918, corresponding to FIGS. 10H and 10I respectively, redistribution connections 1044 are formed on exposed surfaces of the package panel 800, such as through the exposed redistribution vias 1003, and the resist film 1050 is thereafter removed. The redistribution connections 1044 are formed by any suitable methods, including electroplating and electroless deposition. In certain embodiments, the resist film 1050 is removed via a wet process. As depicted in FIGS. 10H and 10I, the redistribution connections 1044 fill the redistribution vias 1003 and protrude from the surfaces of the package panel 800 upon removal of the resist film 1050. In certain embodiments, the redistribution connections 1044 are formed of copper. In other embodiments, the redistribution connections 1044 may be formed of any suitable conductive material including but not limited to aluminum, gold, nickel, silver, palladium, tin, or the like.

As described with reference to the interconnections 844, the redistribution connections 1044 may also include lateral trace regions for electrical connection of redistribution connections 1044 with other electrical contacts or devices. The lateral trace regions can include a portion of the conductive layer formed in operation 916 and will typically extend across a portion of the major surfaces of the package panel 800.

At operation 920 and FIG. 10J, the package panel 800 having the redistribution connections 1044 formed thereon is exposed to an adhesion and/or seed layer etch process substantially similar to that of operation 770. In certain embodiments, the adhesion and/or seed layer etch is a wet etch process including a rinse and drying of the package panel 800. In certain embodiments, the adhesion and/or seed layer etch process is a wet etch process utilizing a buffered etch process selective for a desired material of the seed layer 1042. In other embodiments, the etch process is a wet etch process utilizing an aqueous etch process. Any suitable wet etchant or combination of wet etchants may be used for the seed layer etch process.

As shown in FIG. 10K, following the seed layer etch process at operation 920, the package panel 800 may have additional layers formed thereon as desired. For example, one or more additional redistribution layers 1060 may be formed on a side or surface of the package panel 800 opposite of the first redistribution layer 1058, such as the major surface 807, as depicted in FIG. 10K. Alternatively or in addition thereto, one or more redistribution layers may be formed on the same side or surface of the first redistribution layer 1058, such as major surface 807. Upon formation of a desired number of redistribution layers and desired redistribution patterns, the package panel 800 is ready for integration with other semiconductor devices or package panels in desired 2.5D and 3D arrangements and/or for formation of an EMI shielding layer thereon.

Figure 11A:
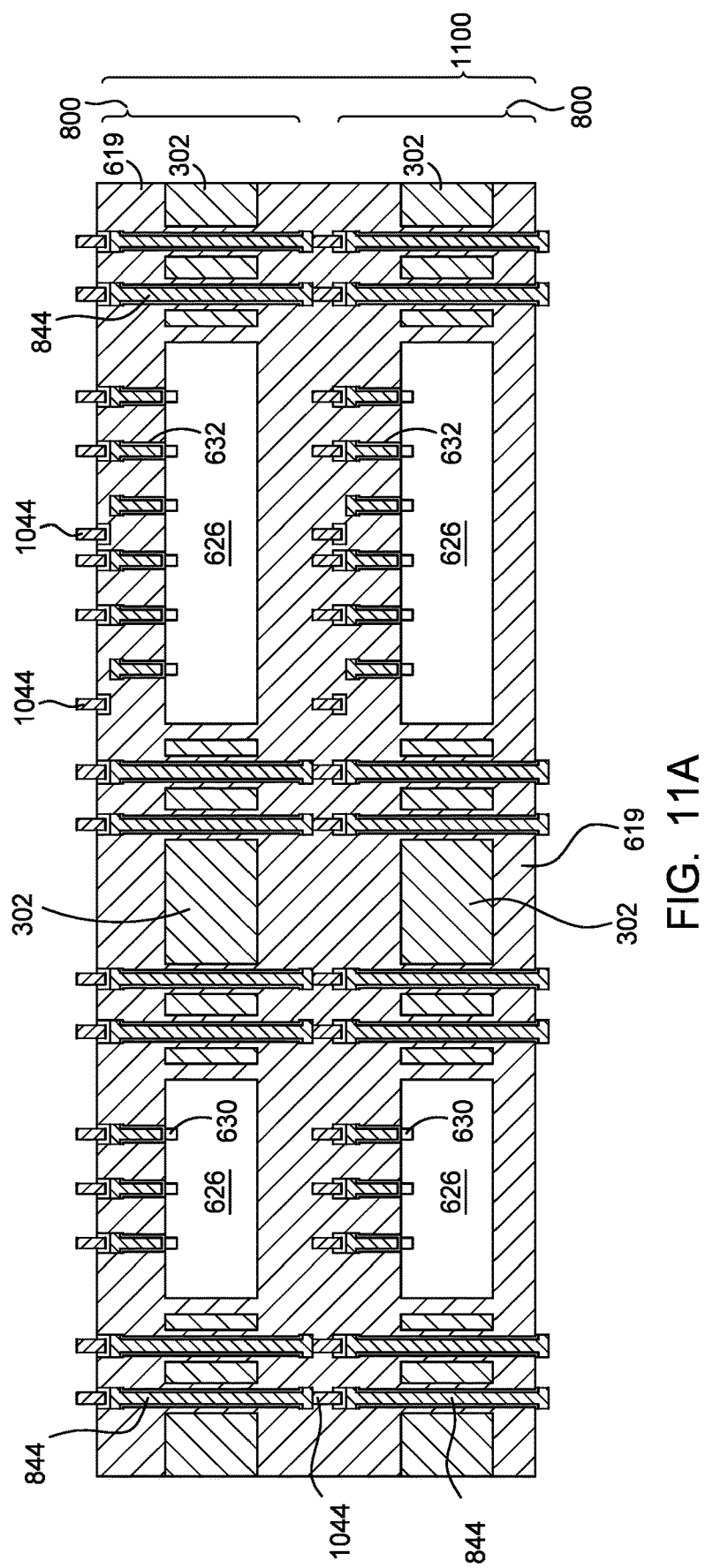
FIGS. 11A-11B schematically illustrate stacked 3D structures for integration with an EMI shielding layer, according to embodiments described herein.
Figure 11B:
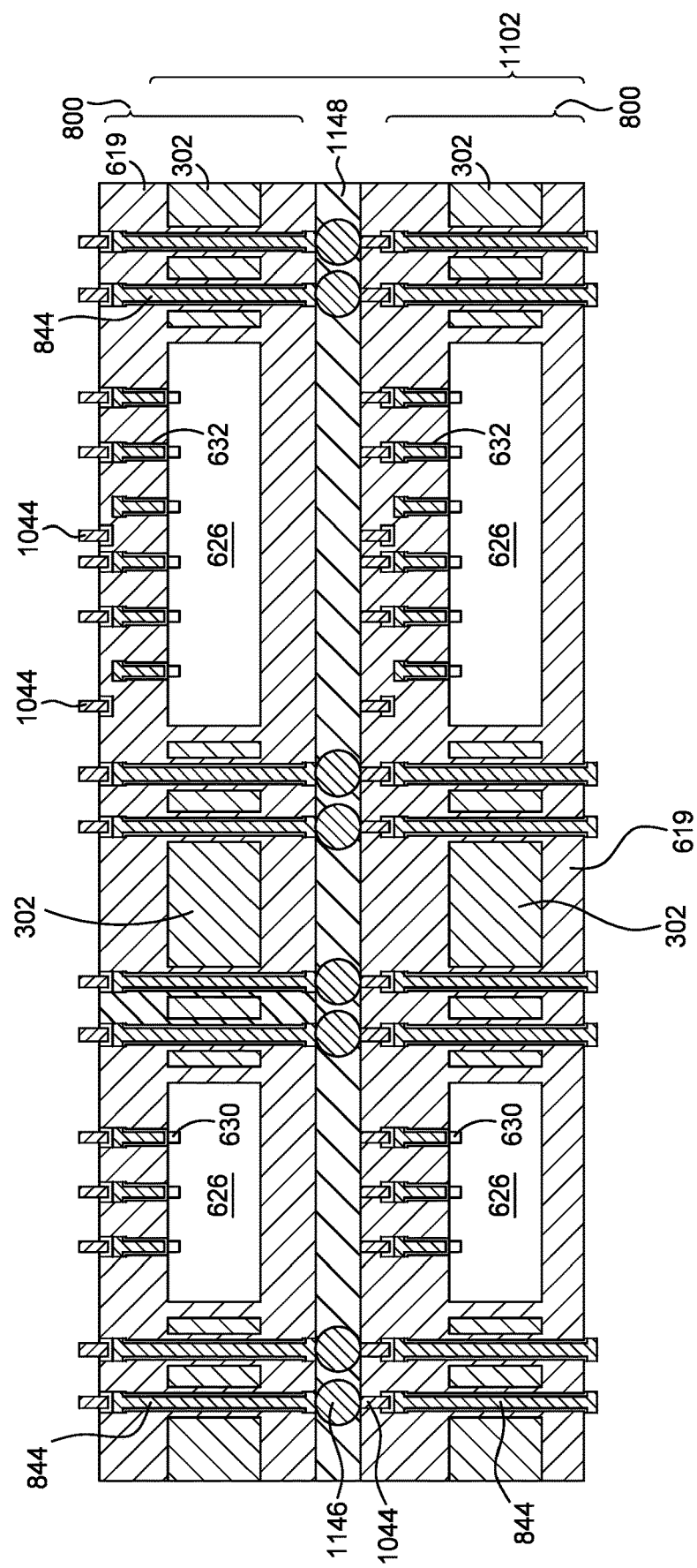

As described above, the package panel 800 may be vertically stacked with other semiconductor devices and systems to form heterogeneous or homogeneous 2.5D and 3D stacked systems or SIPs prior to formation of an EMI shielding layer thereon. FIGS. 11A and 11B illustrate exemplary schematic cross-sections of stacked 3D structures incorporating the package panel 800 prior to EMI shielding, according to embodiments of the present disclosure. As shown in FIGS. 11A-11B, stacked structures 1100 and 1102 include two package panels 800 arranged in a vertical stack. Note that although only two package panels are shown in FIGS. 11A-11B, three or more package panels may be stacked together. Further, in certain embodiments, one or more package panels may be stacked with other devices, such as integrated circuit dies, circuit boards, interposers, spacers, and the like.

In stacked structure 1100, the package panels 800 are stacked directly in contact with each other and thus, interconnections 844 of each package panel 800 may be directly connected, or indirectly connected through redistribution connections 1044. Accordingly, the stacked structure 1100 may be formed by repeating the operations of methods 500, 700, and 900 described above to build up and laminate one package panel 800 directly over a surface of a previously formed package panel 800. Alternatively, two separate package panels 800 may be bonded together via wafer-to-wafer bonding, such as hybrid bonding, in which planarized surfaces of the panels are pressed against each other under high pressure and temperature conditions.

In stacked structure 1102, two package panels 800 are vertically stacked with one or more C2- or C4-type solder bumps 1146 disposed therebetween to bridge the interconnections 844 of each package panel 800. In certain embodiments, the solder bumps 1146 are formed of one or more intermetallic compounds, such as a combination of tin (Sn) and lead (Pb), silver (Ag), Cu, or any other suitable metals thereof. For example, the solder bumps 1246 are formed of a solder alloy such as Sn—Pb, Sn—Ag, Sn—Cu, or any other suitable materials or combinations thereof. The utilization of solder bumps 1146 enables the stacking of package panels, dies, circuit boards, interposers, spacers, and other devices having the same or different lateral dimensions.

As shown in FIG. 11B, the solder bumps 1146 create spaces (e.g., voids) between the insulating layers 619 of the package panels 800. In certain embodiments, these spaces are filled with an encapsulation material 1148 to enhance the reliability of the solder bumps 1146. In certain embodiments, the encapsulation material 1148 has a thickness corresponding to the diameters of the solder bumps 1146. The encapsulation material 1148 may be any suitable type of encapsulant or underfill. In one example, the encapsulation material 1148 includes a pre-assembly underfill material, such as a no-flow underfill (NUF) material, a nonconductive paste (NCP) material, and a nonconductive film (NCF) material. In one example, the encapsulation material 1148 includes a post-assembly underfill material, such as a capillary underfill (CUF) material and a molded underfill (MUF) material. In certain embodiments, the encapsulation material 1148 includes a low-expansion-filler-containing resin, such as an epoxy resin filled with (e.g., containing) $SiO_2$, AlN, $Al_2O_3$, SiC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like.

The methods and structures described above with reference to FIGS. 1-11B relate to thin form factor package architectures having high die-to-package volume ratios and high I/O densities. As previously described, due to the increased density of these package structures, as well as the integration of these package structures near other components or systems on circuit boards, unintended and unwanted operational disruption may occur due to electromagnetic field interference caused by other devices. Accordingly, the formation of an EMI shielding layer (i.e., EMI shield) on the aforementioned package structures can reduce or eliminate EMI caused by other devices and improve overall package functionality.

Figure 12:
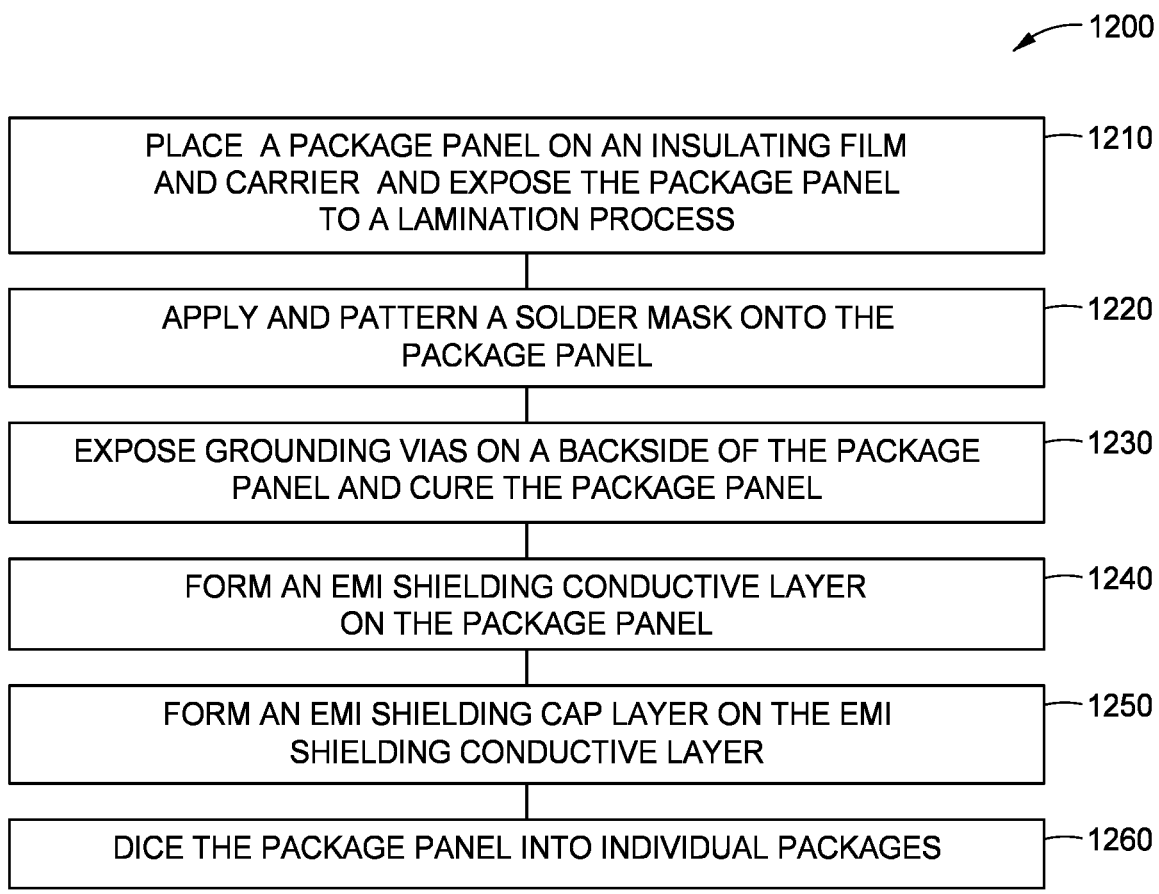
FIG. 12 illustrates a flow diagram of a process for forming an EMI shielding layer on a package panel followed by singulation, according to embodiments described herein.
Figure 13A:
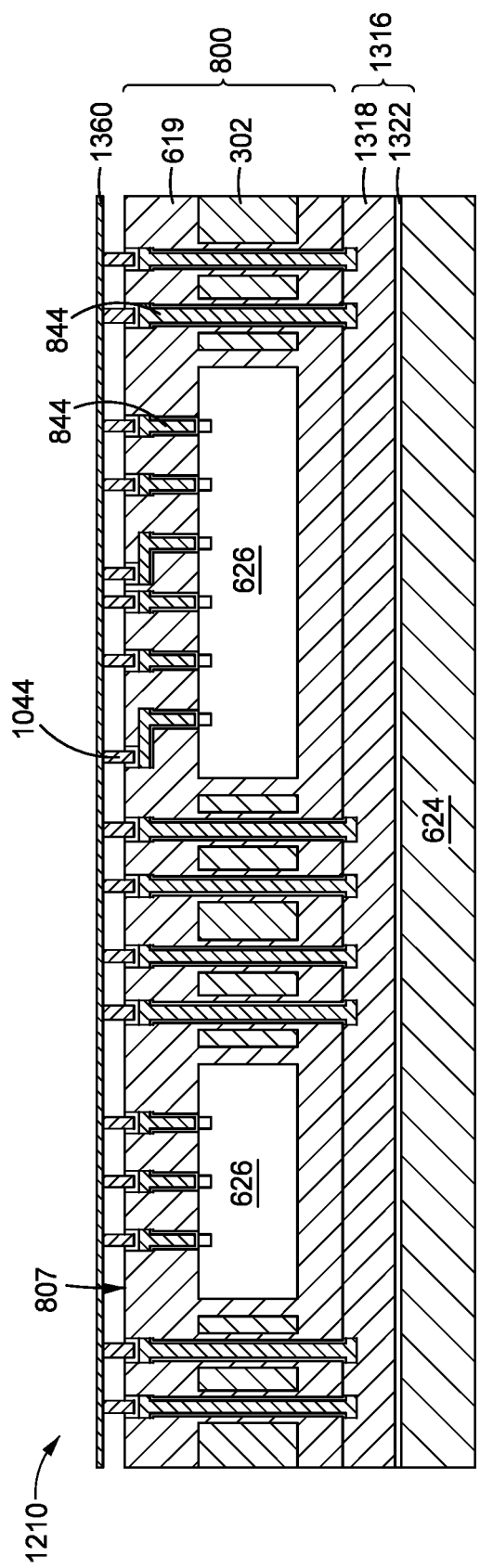

FIG. 12 illustrates a flow diagram of a representative method 1200 of forming a 2D package 1301 having an EMI shield, according to embodiments of the present disclosure. FIGS. 13A-13F schematically illustrate cross-sectional views of the package 1200 at different stages of the method 1200. Thus, FIG. 12 and FIGS. 13A-1 are herein described together for clarity.

Note that although FIGS. 12 and 13A-13F are described with reference to forming an EMI shielding layer on a single layer 2D package, the operations described below may also be performed on a stacked 3D device, such as those depicted in FIGS. 11A-11B, to form a stacked 3D device with an EMI shield. Examples of stacked 3D devices with integrated EMI shields are described below with reference to FIGS. 14A-14B.

The method 1200 generally begins with operation 1210 and FIG. 13A, wherein package panel 800 is placed on an insulating film 1316 and is thereafter laminated. For example, in certain embodiments, the major surface 805 of the package panel 800, or a "backside" thereof, is placed and laminated onto the insulating layer 1316, which is optionally disposed on carrier 624 for mechanical support. The insulating layer 1316 may be substantially similar to the insulating films 616, 1016 and may include one or more flowable layers 1318 formed of polymer-based dielectric materials and one or more protective layers 1322 formed of PET. For example, in certain embodiments, the flowable layer 1318 includes an epoxy resin material, such as a ceramic-filler-containing epoxy resin material. In other embodiments, the flowable layer 1318 includes a photodefinable polyimide material. However, any suitable combination of flowable layers 1318 and insulating materials is contemplated for the insulating film 1316. For example, the insulating film 1316 may include one or more flowable layers 1318 including a non-photosensitive polyimide material, a polybenzoxazole (PBO) material, a silicon dioxide material, and/or a silicon nitride material. In certain embodiments, the flowable layer 1318 has a thickness of less than about 60 μm, such as a thickness between about 20 μm and about 50 μm, such as a thickness of between about 20 μm and about 30 μm.

Generally, the lamination process at operation 1210 is substantially similar to the lamination processes described above with reference to operations 508, 516, and 902, and is performed to soften and bond the flowable layer 1318 to the insulating layer 619 of the package panel 800. Accordingly, the bonded flowable layer 1318 and the insulating layer 619 will herein be jointly described as the insulating layer 619 on the "backside" of the package panel 800. In certain embodiments, however, the lamination and subsequent curing of the flowable layer 1318 forms a second insulating layer (not shown) on the insulating layer 619. In such examples, the second insulating layer is formed of a different material layer than the insulating layer 619.

In certain embodiments, the lamination process at operation 1210 is a vacuum lamination process that may be performed in an autoclave or other suitable device. In certain embodiments, the lamination process is performed at a temperature of between about 80° C. and about 140° C. and for a period between about 1 minute and about 30 minutes. For example, the lamination process is performed at a temperature of about 110° C. for a period of about 5 minutes. Further, in certain embodiments, a protective film 1360 is placed over the package panel 800 during lamination. For example, the protective film 1360 may be substantially similar to the protective film 660, and is formed of biaxial PET or other suitable materials. Please note, the lamination process at operation 1210 may be performed on a single package panel or a batch thereof as desired.

At operation 1220 and FIG. 13B, any protective films and/or layers, such as protective film 1360 and protective layer 1322, are removed from the package panel 800, and a solder mask 1366 is applied to a "frontside" or "device side" surface of the package panel 800 and patterned. For example, the solder mask 1366 is applied to major surface 807 of the package panel 800 and thereafter patterned. Generally, the solder mask 1366 has a thickness between about 10 µm and about 100 µm, such as between about 15 µm and about 90 µm. For example, the solder mask 1366 has a thickness of between about 20 µm and about 80 µm.

In certain embodiments, the solder mask 1366 is a thermal-set epoxy liquid, which is silkscreened through a patterned woven mesh onto the insulating layer 619 on the device side of the package panel 800. In certain embodiments, the solder mask 1366 is a liquid photo-imageable solder mask (LPSM) or liquid photo-imageable ink (LPI), which is silkscreened or sprayed onto the device side of the package panel 800. The liquid photo-imageable solder mask 1366 is then exposed and developed to form desired patterns. In other embodiments, the solder mask 1366 is a dry-film photo-imageable solder mask (DFSM), which is vacuum-laminated on the device side of the package panel 800 and then exposed and developed. In such embodiments, a thermal or ultraviolet cure is performed after a pattern is defined in the solder mask 1366.

In still other embodiments, the solder mask 1366 is patterned by, for example, laser ablation. In such embodiments, the laser ablation patterning process may be performed utilizing a $CO_2$ laser, a UV laser, or a green laser. For example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ.

The solder mask 1366 is patterned to form shielding vias 1303a and signal vias 1303b therein. The shielding vias 1303a expose desired outer interconnections 844a on the device side of the package panel 800, and are later utilized to couple the subsequently formed conformal EMI shielding layer to ground, providing side or compartmental shielding of semiconductor dies 626 embedded therebetween. The signal vias 1303b expose desired inner interconnections 844b and/or redistribution connections 1044 on the device side of the package panel 800 for designated signal routing. As described above, in such embodiments, a pitch between adjacent exposed interconnections 844a for grounding and/or side shielding may be between about 10 µm and about 120 µm.

At operation 1230 and FIG. 13C, the package panel 800 is turned over (e.g., flipped) and the backside (e.g., major surface 805, "non-device side") of the package panel 800 is patterned by, for example, laser ablation, to form shielding vias 1303c therein. Similar to the shielding vias 1303a, the shielding vias 1303c expose desired grounding and/or side shielding interconnections 844a at the backside (e.g., now facing up) of package panel 800. In certain embodiments, the patterning process at operation 1230 may be performed utilizing the same laser as operation 1220, such as a $CO_2$ laser, UV laser, green laser, or the like.

After patterning both sides of the package panel 800, the package panel 800 is transferred from the optional carrier 624 to a curing rack upon which the package panel 800, having the previously laminated insulating layer 1316 and solder mask 1366 attached thereto, is fully cured. In certain embodiments, the cure process is performed at a temperature of between about 80° C. and about 200° C. and for a period between about 10 minutes and about 80 minutes, such as a temperature of between about 90° C. and about 200° C. and for a period between about 20 minutes and about 70 minutes. For example, the cure process is performed at a temperature of about 180° C. for a period of about 30 minutes, or at a temperature of about 100° C. for a period of about 60 minutes. In further embodiments, the cure process at operation 1230 is performed at or near ambient (e.g., atmospheric) pressure conditions.

At operation 1240 and FIG. 13D, electroless deposition and/or electroplating of a conductive material is performed on a plurality of surfaces of the package panel 800 to form conductive layers 1370a and 1370b on the non-device side (e.g., now facing up) and device side (e.g., now facing down) of the package panel 800, respectively. As shown in FIG. 13D, the plated conductive layer 1370a forms a conformal top EMI shielding layer that is electrically coupled to the outer interconnections 844a through shielding vias 1303c on the non-device side of the package panel 800, while the conductive layer 1370b extends outer interconnections 844a through shielding vias 1303a on the device side. The outer interconnections 844a, which surround the dies 626 and associated signal routing, together with the conductive layers 1370a, 1370b within shielding vias 1303a, 1303c, also provide side compartmental EMI shielding and enable connection of the conformal top EMI shielding layer (e.g., conductive layer 1370a) with a common electrical ground (not shown). The conductive layer 1370b is additionally deposited within signal vias 1303b to electrically couple to and extend inner interconnections 844b and/or redistribution connections 1044 on the device side of the package panel 800, thus facilitating electrical connection thereof with other packages and/or devices.

Each EMI shielding conductive layer 1370a and 1370b is formed of one or more layers of suitable conductive materials, including but not limited to copper, aluminum, tungsten, silver, or the like. In certain embodiments, the conductive layer 1370a or 1370b has a thickness on the non-device side or device side, respectively, between about 0.5 µm and about 40 µm, such as between about 1 µm and about 30 µm. For example, the conductive layer 1370a or 1370b has a thickness between about 2 µm and about 20 µm.

At operation 1250 and FIG. 13E, a plating process is performed on the package panel 800 to form EMI shielding cap layers 1372a and 1372b over the EMI shielding conductive layers 1370a and 1370b, respectively, which act as corrosion barriers to passivate the EMI shielding conductive layers and protect them from environmental contamination. Generally, each EMI shielding cap layer 1372a or 1372b may include one or more metallic layers formed by electroless plating. For example, in certain embodiments, each EMI shielding cap layer 1372a or 1372b includes an electroless nickel plating layer covered with a thin layer of gold and/or palladium formed by electroless nickel immersion gold (ENIG) or electroless nickel electroless palladium immersion gold (ENEPIG). However, other metallic materials and plating techniques are also contemplated, including soft ferromagnetic metal alloys and highly conductive pure metals. In certain examples, each EMI shielding cap layer 1372a or 1372*b* includes one or more layers of copper, chrome, tin, aluminum, nickel chrome, stainless steel, or the like.

In certain embodiments, each EMI shielding cap layer 1372*a* or 1372*b* has a thickness between about 0.2 μm and about 20 μm, such as between about 1 μm and about 10 μm, on the non-device side or device side of the package panel 800. During the plating of the EMI shielding cap layer 1372*b*, the exposed interconnections 844*b* and/or redistribution connections 1044 partially extending through the solder mask 1366 are further extended outward from the device side (e.g., frontside) of the package panel 800 to facilitate further coupling with additional devices in subsequent fabrication operations, as shown in FIG. 13E. At the same time, the newly extended interconnections 844*a* provide grounding pathways for the EMI shielding conductive layer 1370*a* through the package panel 800, and may be directly connected to ground on the device side of the package panel 800. Furthermore, the newly extended interconnections 844*a*, described in FIGS. 14A-14B as shielding interconnections 1444 and shielding redistribution connections 1446, provide EMI side shielding for semiconductor dies 626 embedded therebetween. Accordingly, the dies 626 are shielded not only by the EMI shielding conductive layer 1370*a* disposed above the dies, but also by the interconnections 844*a* coupled to the EMI shielding conductive layer 1370*a* and cap layer 1372*a*, thus increasing the EMI shielding effect around each die 626.

Figure 13F:
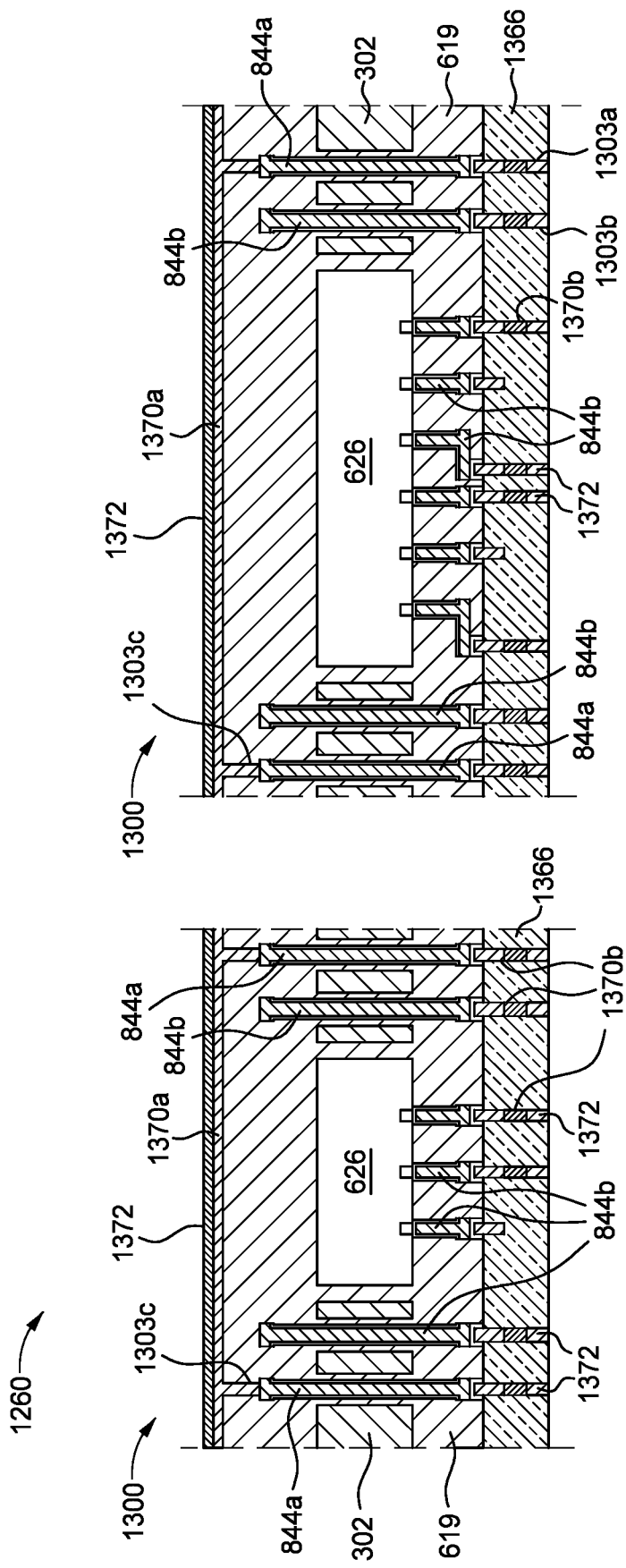

After formation of the EMI shielding cap layers 1372*a* and 1372*b*, the package panel 800 may be singulated into one or more electrically functioning packages or SIPs 1300 at operation 1260, as shown in FIG. 13F. Each package or SIP 1300 may thereafter be integrated with other semiconductor devices and packages in various 2.5D and 3D arrangements and architectures. For example, the packages or SIPs 1300 may be vertically stacked with additional packages or SIPs and/or other semiconductor devices and systems to form homogeneous or heterogeneous 3D stacked systems, similar to the structures depicted in FIGS. 11A-11B.

Figure 14A:
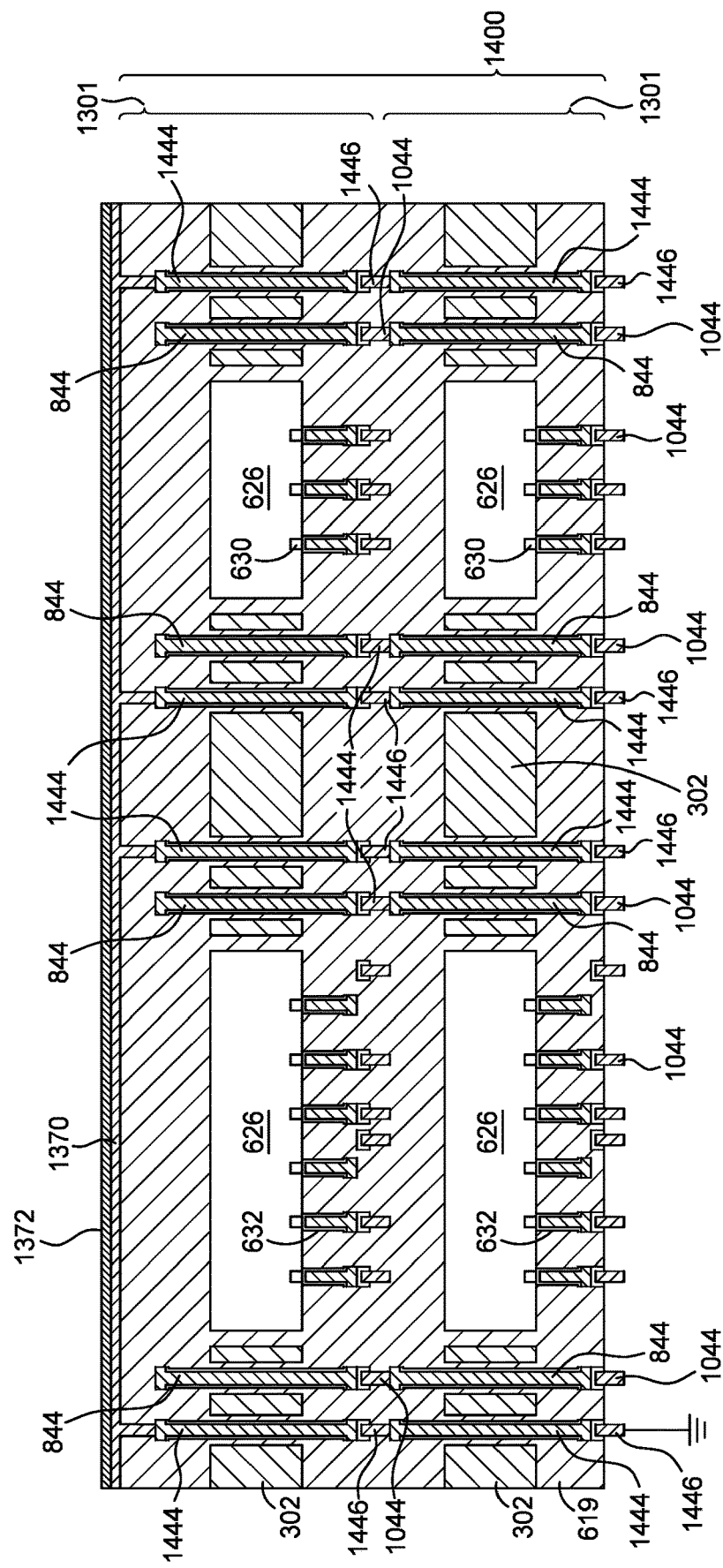
FIGS. 14A-14B schematically illustrate stacked 3D structures with an integrated EMI shielding layer, according to embodiments described herein.
Figure 14B:
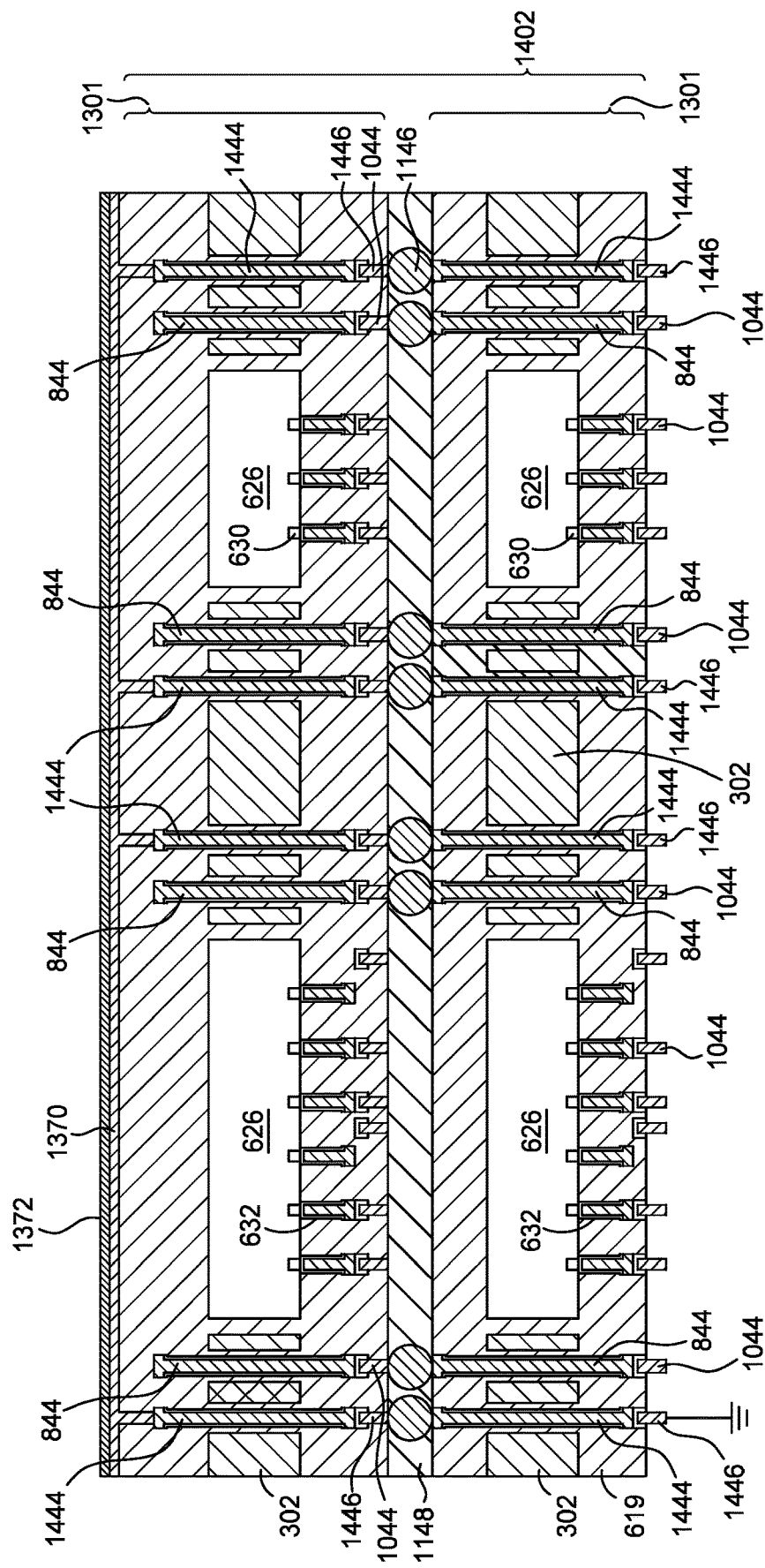

FIGS. 14A and 14B illustrate exemplary schematic cross-sections of stacked 3D structures with an integrated EMI shielding conductive layer 1370 and cap layer 1372, according to certain embodiments of the present disclosure. As shown in FIGS. 14A-14B, stacked structures 1400 and 1402 include two heterogeneous packages or SIPs 1301 arranged in a vertical stack, substantially similar to the stacked structures 1100 and 1102 described above with reference to FIGS. 11A-11B, respectively. The stacked structures 1400, 1402 may be singulated from package panels prior to formation of the EMI shielding layers 1370 and 1372, or thereafter. Note that although only two packages are shown in FIGS. 14A-14B, three or more packages may be stacked together. Further, in certain embodiments, one or more packages may be stacked with other devices, such as integrated circuit dies, circuit boards, interposers, spacers, and the like. Additionally, the packages may be homogeneous or heterogeneous.

In stacked structure 1400, two packages 1301 are stacked directly in contact with each other and thus, interconnections 844 and 1444 of each package 1301 may be directly connected, or indirectly connected, through redistribution connections 1044 and 1446. As such, the stacked structure 1400 may be formed with similar methods and materials as described with reference to FIG. 11A. In stacked structure 1402, however, two packages 1301 are vertically stacked with one or more C2- or C4-type solder bumps 1146 (shown encapsulated by encapsulation material 1148) disposed therebetween to bridge the interconnections 844, 1444 of each package 1301. Thus, the stacked structure 1402 may be formed with similar methods and materials as described with reference to FIG. 11B.

In each stacked structure 1400 or 1402, the EMI shielding conductive layer 1370 and cap layer 1372 are electrically coupled to shielding interconnections 1444 and shielding redistribution connections 1446, which are routed (e.g., formed) around the perimeter of the interconnections 844 and redistribution connections surrounding each die 626. Accordingly, the EMI shielding layers 1370 and 1372, in combination with the shielding interconnections 1444 and shielding redistribution connections 1446, form a Faraday cage-like structure around embedded dies 626 and the interconnections 844 coupled therewith to provide EMI top and side shielding thereof. Furthermore, the shielding interconnections 1444 and shielding redistribution connections 1446 provide a grounding pathway for the EMI shielding conductive layer 1370 and cap layer 1372 through the entire stack of each structure 1400 and 1402, which enables grounding of the EMI shielding layers 1370, 1372 on a side of each structure 1400, 1402 opposite the EMI shielding layers 1370, 1372. Please note that although EMI shielding layers 1370, 1372 are only depicted on a single side of the stacked structures 1400 and 1402, the EMI shielding layers 1370, 1372 may be formed on both sides (e.g., device side and non-device side), as described with reference to FIGS. 12 and 13A-13F.

The methods and package structures described above provide multiple advantages over semiconductor package methods and architectures implementing conventional EMI shielding techniques, such as metal caps, PVD-sputtered EMI shielding, and spray-coated EMI shielding. Such benefits include the capability of utilizing a wide variety of EMI shielding materials suitable for screening electronic devices from a wide range of undesirable transmitted frequencies. For example, electrolytic plating of the EMI shielding layers enables the utilization of highly conductive pure metals for blocking high-frequency interference, as well as soft Ferromagnetic metals for blocking low-frequency interference. Electrolytic plating also enables greater control of EMI shielding layer thickness, providing a wider range of thicknesses while facilitating enhanced uniformity thereof. Furthermore, the shielding methods described above provide for improved sidewall coverage of EMI shielding materials, thus enabling side EMI shielding by metal plating through-vias embedded within package structures with repeatable critical dimensions and densities.

The aforementioned features, in addition to the thin form factor and high die-to-package volume ratios of the package structures, advantageously provide packaging architectures for advanced integrated semiconductor devices with improved performance and flexibility, and relatively low manufacturing costs as compared to conventional packaging and shielding technologies. The thin and small-form-factor package structures described herein provide the benefits of not only high I/O density and improved bandwidth and power, but also maximized shielding effectiveness against unwanted and disruptive transmitted signals from surrounding devices.

While the foregoing is directed to embodiments of the present disclosure, other and further embodiments of the disclosure may be devised without departing from the basic scope thereof, and the scope thereof is determined by the claims that follow.

The invention claimed is:

1. A semiconductor package, comprising:
a first frame having a first surface opposite a second surface, the first frame comprising:
at least one first cavity with a first semiconductor die disposed therein;
a first plurality of vias disposed around the at least one first cavity, each of the first plurality of vias comprising a first via surface that defines a first opening extending through the first frame from the first surface to the second surface; and
a second plurality of vias disposed around the first plurality of vias, each of the second plurality of vias comprising a second via surface that defines a second opening extending through the first frame from the first surface to the second surface;
a second frame having a third surface opposite a fourth surface and stacked below the second surface of the first frame, the second frame comprising:
at least one second cavity with a second semiconductor die disposed therein;
a third plurality of vias disposed around the at least one second cavity; and
a fourth plurality of vias disposed around the third plurality of vias;
an insulating layer formed over the first surface, the second surface, the third surface, and the fourth surface and within each of the first plurality of vias, the second plurality of vias, the third plurality of vias, and the fourth plurality of vias, the insulating layer contacting at least a portion of each side of the first semiconductor die and the second semiconductor die;
a first plurality of electrical interconnections for signal transmission disposed within the first plurality of vias and the third plurality of vias;
a second plurality of electrical interconnections for electromagnetic interference (EMI) shielding disposed within the second plurality of vias and the fourth plurality of vias; and
an EMI shielding layer disposed over the first surface of the first frame and coupled to the second plurality of electrical interconnections.

2. The semiconductor package of claim 1, wherein the EMI shielding layer comprises an electroless nickel plating layer covered with a thin layer of gold or palladium.

3. The semiconductor package of claim 1, wherein the EMI shielding layer is coupled to ground by the second plurality of electrical interconnections.

4. The semiconductor package of claim 1, further comprising a copper layer disposed between the insulating layer and the EMI shielding layer.

5. The semiconductor package of claim 4, wherein the copper layer comprises an electroless copper seed layer and an electrolytic copper plating layer.

6. The semiconductor package of claim 1, where the second plurality of vias are arranged in two or more staggered rows around a perimeter of the at least one cavity and the first plurality of vias.

7. The semiconductor package of claim 6, wherein a diameter of each of the second plurality of vias is between about 5 μm and about 100 μm.

8. The semiconductor package of claim 7, wherein a pitch between each of the second plurality of vias is between about 10 μm and about 15 μm or between about 100 μm and about 120 μm.

9. A semiconductor package, comprising:
a frame having a first surface opposite a second surface, the frame further comprising:
at least one cavity with a plurality of semiconductor dies disposed therein, the plurality of semiconductor dies comprising a first semiconductor die stacked backside-to-backside with a second semiconductor die and a third semiconductor die, wherein the second semiconductor die and the third semiconductor die each have lateral dimensions lesser than that of the first semiconductor die;
a first via comprising a first via surface that defines a first opening extending through the frame from the first surface to the second surface; and
a second via comprising a second via surface that defines a second opening extending through the frame from the first surface to the second surface;
an insulating layer disposed over the first surface and the second surface of the frame and within each of the first and second vias;
a first electrical interconnection for signal transmission disposed within the first via;
a second electrical interconnection for electromagnetic interference (EMI) shielding disposed within the second via; and
an EMI shielding layer disposed over at least one of the first surface or second surface of the frame and coupled to the second electrical interconnection.

10. The semiconductor package of claim 9, wherein the EMI shielding layer comprises an electroless nickel plating layer covered with a thin layer of gold or palladium.

11. The semiconductor package of claim 9, wherein the EMI shielding layer is coupled to ground by the second electrical interconnection.

12. The semiconductor package of claim 9, further comprising a copper layer disposed between the insulating layer and the EMI shielding layer.

13. The semiconductor package of claim 12, wherein the copper layer comprises an electroless copper seed layer and an electrolytic copper plating layer.

14. The semiconductor package of claim 9, wherein a diameter of the second via is between about 5 μm and about 100 μm.

15. The semiconductor package of claim 9, wherein the insulating layer extends from the first surface to the second surface through each of the first and second vias and the at least one cavity.

16. The semiconductor package of claim 9, wherein the frame comprises silicon.

17. A semiconductor package, comprising:
a first frame having a first surface opposite a second surface, the first frame comprising:
at least one cavity with a plurality of semiconductor dies disposed therein, the plurality of semiconductor dies comprising a first semiconductor die stacked backside-to-backside with a second semiconductor die and a third semiconductor die, wherein the second semiconductor die and the third semiconductor die each have lateral dimensions lesser than that of the first semiconductor die; and
a first via comprising a via extending through the frame from the first surface to the second surface;
a second via extending through the first frame from the first surface to the second surface;
a second frame having a third surface opposite a fourth surface, the second frame comprising:
a third via extending through the second frame from the third surface to the fourth surface; and a fourth via extending through the second frame from the third surface to the fourth surface;

a singular insulating layer disposed over the first surface, the second surface, the third surface, and the fourth surface, the insulating layer further disposed within each of the at least one cavity and the first via, the second via, the third via, and the fourth via;

a first electrical interconnection for signal transmission disposed within the first via and the third via;

a second electrical interconnection for electromagnetic interference (EMI) shielding disposed within the second via and the fourth via, the second electrical interconnection circumferentially surrounded by the insulating layer within the second via and the fourth via; and an EMI shielding layer disposed over at least one of the first surface or second surface of the frame and coupled to the second electrical interconnection.

18. The semiconductor package of claim 17, wherein the EMI shielding layer comprises an electroless nickel plating layer covered with a thin layer of gold or palladium.

19. The semiconductor package of claim 17, wherein the EMI shielding layer is coupled to ground by the electrical interconnection on a side of the frame opposite the EMI shielding layer.

20. The semiconductor package of claim 17, comprising a copper layer disposed between the insulating layer and the EMI shielding layer, the copper layer comprising an electroless copper seed layer and an electrolytic copper plating layer.

* * * * *